(12) United States Patent
Ichijo et al.

(10) Patent No.: US 7,442,592 B2
(45) Date of Patent: Oct. 28, 2008

(54) MANUFACTURING A SEMICONDUCTOR DEVICE

(75) Inventors: Mitsuhiro Ichijo, Atsugi (JP); Taketomi Asami, Atsugi (JP); Noriyoshi Suzuki, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 217 days.

(21) Appl. No.: 11/518,246

(22) Filed: Sep. 11, 2006

(65) Prior Publication Data

US 2007/0004109 A1 Jan. 4, 2007

Related U.S. Application Data

(62) Division of application No. 10/967,278, filed on Oct. 19, 2004, now Pat. No. 7,109,074, which is a division of application No. 10/252,838, filed on Sep. 24, 2002, now Pat. No. 6,821,828.

(30) Foreign Application Priority Data

Sep. 27, 2001 (JP) ............................. 2001-298585

(51) Int. Cl.
*H01L 21/84* (2006.01)
(52) U.S. Cl. .................. 438/162; 438/166; 438/474; 257/E21.134
(58) Field of Classification Search ................ 438/162, 438/166, 473, 474; 257/E21.134
See application file for complete search history.

(56) References Cited

U.S. PATENT DOCUMENTS

| | | |
|---|---|---|
| 4,643,527 A | 2/1987 | Magarino et al. |
| 4,646,424 A | 3/1987 | Parks et al. |
| 4,908,330 A | 3/1990 | Arai et al. |
| 5,248,630 A | 9/1993 | Serikawa et al. |
| 5,641,380 A | 6/1997 | Yamazaki et al. |
| 5,643,826 A | 7/1997 | Ohtani et al. |
| 5,736,438 A | 4/1998 | Nishimura et al. |

(Continued)

FOREIGN PATENT DOCUMENTS

EP 0 651 431 5/1995

(Continued)

OTHER PUBLICATIONS

Naoharu Sugiyama, *Strained Silicon Crystal on SiGe Substrate*, Applied Physics, vol. 69, No. 11, Nov. 1, 2000, pp. 1315-1319.

*Primary Examiner*—Chandra Chaudhari
(74) *Attorney, Agent, or Firm*—Eric J. Robinson; Robinson Intellectual Property Law Office, P.C.

(57) ABSTRACT

A technique of reducing fluctuation between elements is provided in which a semiconductor film having a crystal structure is obtained by using a metal element that accelerates crystallization of a semiconductor film and then the metal element remaining in the film is removed effectively. A barrier layer is formed on a semiconductor film having a crystal structure by plasma CVD from monosilane and nitrous oxide as material gas. In a step of forming a gettering site, a semiconductor film having an amorphous structure and containing a high concentration of noble gas element, specifically, $1\times10^{20}$ to $1\times10^{21}/cm^3$, is formed by plasma CVD. The film is typically an amorphous silicon film. Then gettering is conducted.

26 Claims, 27 Drawing Sheets

U.S. PATENT DOCUMENTS

| | | | |
|---|---|---|---|
| 5,789,284 A | 8/1998 | Yamazaki et al. | |
| 5,893,730 A | 4/1999 | Yamazaki et al. | |
| 5,923,962 A | 7/1999 | Ohtani et al. | |
| 6,013,544 A | 1/2000 | Makita et al. | |
| 6,048,758 A | 4/2000 | Yamazaki et al. | |
| 6,066,518 A | 5/2000 | Yamazaki | |
| 6,071,766 A | 6/2000 | Yamazaki et al. | |
| 6,083,324 A | 7/2000 | Henley et al. | |
| 6,133,075 A | 10/2000 | Yamazaki et al. | |
| 6,162,704 A * | 12/2000 | Yamazaki et al. | 438/166 |
| 6,177,302 B1 | 1/2001 | Yamazaki et al. | |
| 6,285,042 B1 | 9/2001 | Ohtani et al. | |
| 6,303,415 B1 | 10/2001 | Yamazaki | |
| 6,309,966 B1 | 10/2001 | Govindarajan et al. | |
| 6,335,541 B1 | 1/2002 | Ohtani et al. | |
| 6,426,276 B1 | 7/2002 | Ohnuma et al. | |
| 6,429,097 B1 | 8/2002 | Voutsas et al. | |
| 6,524,896 B1 | 2/2003 | Yamazaki et al. | |
| 6,551,907 B2 | 4/2003 | Ohtani | |
| 6,599,818 B2 | 7/2003 | Dairiki | |
| 6,686,262 B2 | 2/2004 | Yamazaki et al. | |
| 6,743,700 B2 | 6/2004 | Asami et al. | |
| 6,991,997 B2 | 1/2006 | Takayama et al. | |
| 2001/0054430 A1 | 12/2001 | Katagiri et al. | |
| 2002/0098628 A1 | 7/2002 | Hamada et al. | |
| 2002/0102764 A1 | 8/2002 | Yamazaki et al. | |
| 2002/0125480 A1 | 9/2002 | Nakamura et al. | |
| 2002/0134981 A1 | 9/2002 | Nakamura et al. | |
| 2002/0151120 A1 | 10/2002 | Yamazaki et al. | |
| 2002/0155652 A1 | 10/2002 | Yamazaki et al. | |
| 2002/0182785 A1 | 12/2002 | Miyairi | |
| 2002/0197785 A1 | 12/2002 | Yamazaki et al. | |
| 2004/0224486 A1 | 11/2004 | Ichijo et al. | |
| 2005/0020037 A1 | 1/2005 | Asami et al. | |

FOREIGN PATENT DOCUMENTS

| | | |
|---|---|---|
| JP | 05-109737 | 4/1993 |
| JP | 7-183540 | 7/1995 |
| JP | 8-078329 | 3/1996 |
| JP | 09-134882 | 5/1997 |

* cited by examiner

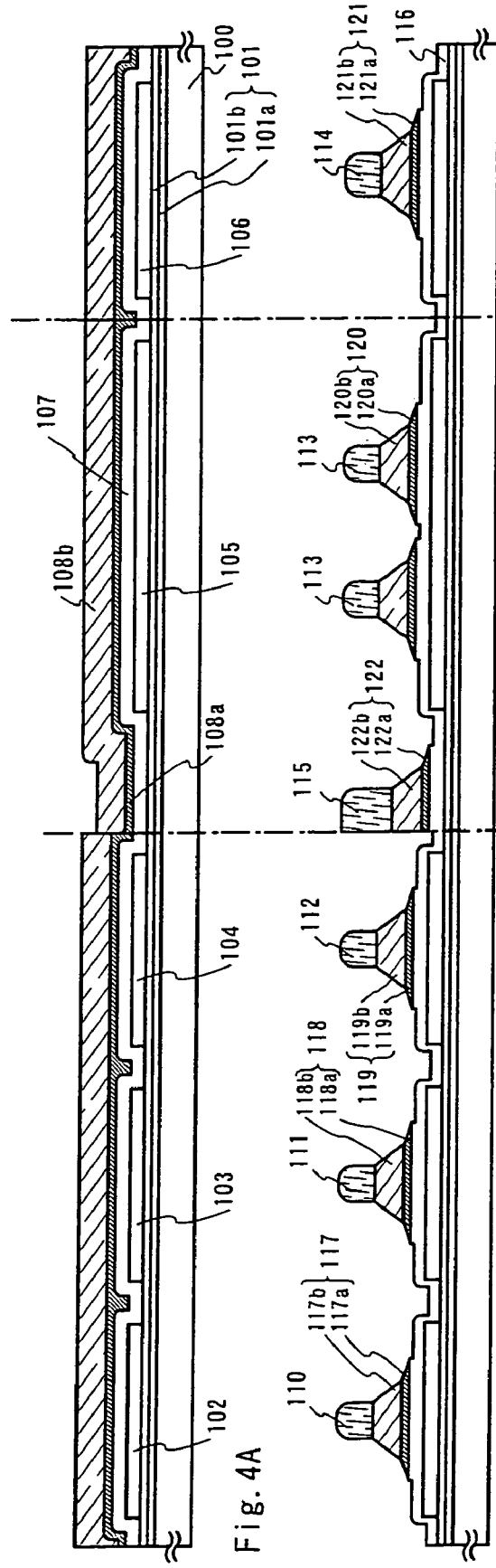

MANUFACTURING A SEMICONDUCTOR DEVICE

BACKGROUND OF THE INVENTION

1. Field of the Invention

The present invention relates to a method of manufacturing a semiconductor device using a gettering technique. In particular, the present invention relates to a method of manufacturing a semiconductor device using a semiconductor film having an amorphous structure formed by adding a metallic element, which promotes a crystallization of the semiconductor film.

Note that, in the present specification, the term "semiconductor device" indicates a category of general devices which are capable of functioning by utilizing semiconductor characteristics, and electro-optical devices, semiconductor circuits, and electronic equipments are all included in the category of semiconductor devices.

2. Description of the Related Art

Thin film transistors (hereinafter referred to as TFTs) are known as typical semiconductor elements that use semiconductor films having a crystalline structure. TFTs are attracting attention as a technique of forming an integrated circuit on a glass or other insulating substrate, and devices utilizing TFTs, such as a liquid crystal display device with a built-in driving circuit, are beginning to appear on the market. In the conventional art, a semiconductor film with a crystalline structure is formed by using heat treatment or laser annealing to crystallize an amorphous semiconductor film that is obtained by deposition through plasma CVD or reduced pressure CVD. (Laser annealing is the technique of crystallizing a semiconductor film through irradiation of laser light.)

The thus formed semiconductor film with a crystalline structure is a mass of crystal grains. Since the crystal grains are randomly oriented and the orientation thereof cannot be controlled, the semiconductor film affects TFT characteristics. A Japanese Patent Application Laid-Open No. 07-183540 discloses a technique to tackle this problem. The technique involves doping with a metallic element that accelerates crystallization of a semiconductor film, such as nickel, to form a semiconductor film having a crystalline structure. The technique can cause a large proportion of crystal grains to orient in the same direction, and can lower the heating temperature required for crystallization as well. When this semiconductor film having a crystalline structure is used in a TFT, the field effect mobility is improved and the sub-threshold coefficient (S value) is reduced to improve the electric characteristics of the TFT exponentially.

By using a metallic element for promoting crystallization, generation of nuclei in crystallization can be controlled. Therefore, film quality thus obtained is uniform in comparison with another crystallization method in which nuclei are generated at random, and ideally, it is desirable that metallic elements are completely removed or reduced to an allowable range. On the other hand, the metallic element used in doping for accelerating crystallization remains in the semiconductor film having a crystalline structure, or on the surface thereof, causing problems such as fluctuation in characteristic of semiconductor elements obtained. For example, the remaining metallic element increases OFF current in the TFTs to cause fluctuation between the individual elements. In short, the metallic element for accelerating crystallization becomes an unwanted presence once the semiconductor film having a crystalline structure is formed.

Gettering using phosphorus is actively employed as an effective method of removing a metallic element that accelerates crystallization from a specific region of a semiconductor film having a crystalline structure. For instance, the metallic element can readily be removed from a channel forming region by doping a source/drain region of a TFT with phosphorus and subjecting the film to heat treatment at 450 to 700° C.

Phosphorus is implanted in a semiconductor film having a crystal structure by ion doping (a method of dissociating $PH_3$ or the like by plasma and accelerating the ions with an electric field to implant the ions in a semiconductor which basically does not include ion separation). The phosphorus concentration necessary for gettering is $1 \times 10^{20}/cm^3$ or more. Phosphorus doping by ion doping makes a semiconductor film having a crystal structure amorphous. An increase in phosphorus concentration is a problem because it inhibits later recrystallization by annealing. Another problem is that high concentration of phosphorus doping prolongs treatment time needed for the doping and lowers the throughput in the doping step.

To invert the conductivity type of source and drain regions of a p-channel TFT which have been doped with phosphorus, the concentration of boron required is 1.5 to 3 times the phosphorus concentration. This not only makes recrystallization difficult but also increases the resistance of the source and drain regions.

If gettering is not thorough and the degree of gettering fluctuates throughout the substrate, it causes a slight difference, namely, fluctuation in each TFT characteristic. When TFTs arranged in a pixel portion fluctuate in electric characteristic in a transmissive liquid crystal display device, the level of voltage applied fluctuates between pixel electrodes. This leads to fluctuation in amount of light transmitted, which is recognized by a viewer as display irregularity.

A TFT is an element indispensable to a light emitting device using an OLED when the device is driven by an active matrix driving method. Therefore a light emitting device using an OLED has in each pixel at least a TFT that functions as a switching element and a TFT for supplying a current to an OLED. The luminance of a pixel is determined by ON current ($I_{on}$) of a TFT that is electrically connected to an OLED to supply a current to the OLED irrespective of the circuit structure and driving method of the pixel. Therefore, in the case of all-blank display, for example, variation in ON current results in fluctuation in luminance.

SUMMARY OF THE INVENTION

The present invention has been made in view of the above, and an object of the present invention is therefore to provide a measure to solve those problems, namely, a technique of using a metal element that accelerates crystallization of a semiconductor film to obtain a semiconductor film with a crystal structure and then removing the metal element remaining in the film effectively.

The technique of gettering is deemed as a major one in manufacture techniques of an integrated circuit using a single crystal silicon wafer. Gettering utilizes some energy to make metal impurities that have been introduced into a semiconductor segregate in a gettering site in order to reduce the impurity concentration in an active region of an element. There are roughly two types of gettering, extrinsic gettering and intrinsic gettering. Extrinsic gettering obtains the gettering effect by an external strain field or chemical action. Phosphorus gettering, in which a high concentration of phosphorus diffuses into a semiconductor from the back side of a single crystal silicon wafer, corresponds to extrinsic gettering. The above-described gettering using phosphorus too is one of extrinsic gettering.

On the other hand, intrinsic gettering utilizes a strain field of a lattice defect where oxygen generated inside a single crystal silicon wafer plays a part. The present invention focuses attention on this intrinsic gettering utilizing lattice defect or lattice strain and employs the following measures which are applied to about a 10 to 100 nm-thick semiconductor film having a crystal structure.

The present invention has a step of forming on a silicon nitride film a first semiconductor film having a crystal structure by using a metal element, a step of forming a film that serves as an etching stopper (barrier layer), a step of forming a second semiconductor film containing a noble gas element (gettering site), a step of gettering to move a metal element to the gettering site, a step of removing the second semiconductor film, and a step of removing the barrier layer.

The present invention is characterized in that, in the step of forming the film that serves as an etching stopper (barrier layer), a thin silicon oxynitride film is formed by plasma CVD. The material gas of the barrier layer are silane-based gas (monosilane, disilane, trisilane, and the like) and nitrogen oxide-based gas (gas expressed as NOx). For example, a combination of monosilane ($SiH_4$) and nitrous oxide ($N_2O$), or a combination of TEOS gas and $N_2O$, or a combination of TEOS gas, $N_2O$, and $O_2$ is used as material gas to form a silicon oxynitride film with a thickness of 10 nm or less, preferably 5 nm or less. This silicon oxynitride film adheres to the first semiconductor film having a crystal structure better than an oxide film obtained from an aqueous solution containing ozone (typically ozone water) (called chemical oxide), or an oxide film obtained by oxidizing the surface of the first semiconductor film having a crystal structure using ozone generated by ultraviolet irradiation in an oxygen atmosphere. Therefore the silicon oxynitride film is not peeled off in the subsequent step (the step of forming the second semiconductor film). In order to enhance the adhesion of the film even more, argon plasma treatment may be conducted before the barrier layer is formed. The silicon oxynitride film in the thickness range given in the above allows the metal element to pass the barrier layer and move to the gettering site in the gettering step. The selective ratio of the silicon oxynitride film to the second semiconductor film is high as well as the selective ratio of the silicon oxynitride film to the first semiconductor film. Therefore the silicon oxynitride film is very effective as an etching stopper when removing the films after gettering.

In the step of forming the second semiconductor film that serves as a gettering site in the present invention, a semiconductor film containing a high concentration of noble gas element and having an amorphous structure, typically, an amorphous silicon film, is formed by plasma CVD from monosilane, a noble gas element, and hydrogen as material gas, or monosilane, a noble gas element, and nitrogen as material gas. Disilane or trisilane may be used instead of monosilane.

Alternatively, the second semiconductor film that serves as a gettering site may be a semiconductor film containing phosphorus or noble gas and having an amorphous structure which is formed by plasma CVD from monosilane, phosphine ($PH_3$), and a noble gas element as material gas, or monosilane, phosphine ($PH_3$), and hydrogen as material gas, or monosilane, phosphine ($PH_3$), and nitrogen as material gas.

Invention Structure 1 regarding a manufacture method disclosed in this specification is a method of manufacturing a semiconductor device, comprising:

a first step of forming on an insulating surface a first semiconductor film having an amorphous structure;

a second step of doping the first semiconductor film having an amorphous structure with a metal element;

a third step of crystallizing the first semiconductor film to form a first semiconductor film having a crystal structure;

a fourth step of forming a barrier layer on the first semiconductor film having a crystal structure;

a fifth step of forming a second semiconductor film on the barrier layer;

a sixth step of gettering to move the metal element into the second semiconductor film and to remove or reduce the metal element in the first semiconductor film having a crystal structure;

a seventh step of removing the second semiconductor film; and an eighth step of removing the barrier layer.

In the above Structure 1, a method of manufacturing a semiconductor device is characterized in that the barrier layer is a silicon oxynitride film with a thickness of 1 to 10 nm. The silicon oxynitride film is formed by plasma CVD in which silane-based gas and nitrogen oxide-based gas are introduced as material gas into a film forming chamber to generate plasma.

In the above Structure 1, the fourth step and the fifth step can be carried out using plasma CVD without exposing the device to the air and the throughput is improved.

The second semiconductor film that serves as a gettering site may be a laminate consisting of two or more layers and formed by plasma CVD from different kinds of material gas given in the above. To give an example of the laminate, a semiconductor film containing noble gas and having an amorphous structure is formed from monosilane, a noble gas element, and nitrogen as material gas, and then a semiconductor film containing noble gas and having an amorphous structure is formed from monosilane, a noble gas element, and hydrogen as material gas and layered on the former semiconductor film. When this laminate structure is employed, the upper layer (third semiconductor film), namely, the semiconductor film formed from monosilane, a noble gas element, and hydrogen as material gas to contain noble gas and have an amorphous structure, can contain a higher concentration of noble gas than the lower layer (second semiconductor film), namely, the semiconductor film formed from monosilane, a noble gas element, and nitrogen as material gas to contain noble gas and have an amorphous structure. The laminate structure thus can raise the gettering efficiency and therefore is preferable. The adhesion of the third semiconductor film to the silicon oxynitride film is relatively weak, but the second semiconductor film improves the adhesion between the two films so that the third semiconductor film is not peeled off. In order to enhance the adhesion even more, argon plasma treatment may be conducted before the third semiconductor film is formed. Preferably, the second semiconductor film is thinner than the third semiconductor film since the upper layer (third semiconductor film), namely, the semiconductor film formed from monosilane, a noble gas element, and hydrogen as material gas to contain noble gas and have an amorphous structure, is etched more easily than the lower layer (second semiconductor film), namely, the semiconductor film formed from monosilane, a noble gas element, and nitrogen as material gas to contain noble gas and have an amorphous structure when removing the gettering site.

Invention Structure 2 regarding a manufacture method disclosed in this specification is a method of manufacturing a semiconductor device, characterized by comprising:

a first step of forming on an insulating surface a first semiconductor film having an amorphous structure;

a second step of doping the first semiconductor film having an amorphous structure with a metal element;

a third step of crystallizing the first semiconductor film to form a first semiconductor film having a crystal structure;

a fourth step of forming a barrier layer on the first semiconductor film having a crystal structure;

a fifth step of forming a second semiconductor film on the barrier layer, the second semiconductor film containing a noble gas element;

a sixth step of forming a third semiconductor film on the second semiconductor film, the third semiconductor film containing a noble gas element in a concentration higher than the noble gas element concentration in the second semiconductor film;

a seventh step of gettering to move the metal element into the second semiconductor film and the third semiconductor film and to remove or reduce the metal element in the first semiconductor film having a crystal structure;

an eighth step of removing the second semiconductor film and the third semiconductor film; and a ninth step of removing the barrier layer.

In the above Structure 2, the third semiconductor film may be formed by plasma CVD in which at least monosilane and noble gas are introduced as material gas into a film forming chamber to generate plasma, or by plasma CVD in which at least monosilane, noble gas, and hydrogen are introduced as material gas into a film forming chamber to generate plasma.

The second semiconductor film that serves as a gettering site may have a noble gas element concentration gradient for efficient gettering. In this case, the noble gas element concentration in the second semiconductor film may be graded by adjusting film formation conditions (including the RF power, film formation pressure, gas flow rate, and the like). When the second semiconductor film has a noble gas element concentration gradient, it makes easier for the metal element that has been moved by gettering to a lower part of the second semiconductor film to travel toward the surface where the concentration is high, and it prevents the film's ability of gettering the metal element from reaching saturation. When a certain amount of metal element is moved by gettering to the second semiconductor film containing a noble gas element, saturation is reached and the metal element is gettered no more.

Invention Structure 3 regarding a manufacture method disclosed in this specification is a method of manufacturing a semiconductor device, characterized by comprising:

a first step of forming on an insulating surface a first semiconductor film having an amorphous structure;

a second step of doping the first semiconductor film having an amorphous structure with a metal element;

a third step of crystallizing the first semiconductor film to form a first semiconductor film having a crystal structure;

a fourth step of forming a barrier layer on the first semiconductor film having a crystal structure;

a fifth step of forming a second semiconductor film on the barrier layer, the second semiconductor film containing a noble gas element with a concentration gradient set higher toward the film surface;

a sixth step of gettering to move the metal element into the second semiconductor film and to remove or reduce the metal element in the first semiconductor film having a crystal structure;

a seventh step of removing the second semiconductor film; and an eighth step of removing the barrier layer.

In the above structures, the second semiconductor film may be formed by plasma CVD in which at least monosilane and noble gas are introduced as material gas into a film forming chamber to generate plasma, or by plasma CVD in which at least monosilane, noble gas, and hydrogen are introduced as material gas into a film forming chamber to generate plasma, or by plasma CVD in which at least monosilane, noble gas, and nitrogen are introduced as material gas into a film forming chamber to generate plasma, or by plasma CVD in which at least monosilane and phosphine are introduced as material gas into a film forming chamber to generate plasma.

In the above structures, it is preferable to remove impurities on the surface of the first semiconductor film before forming the barrier layer in order to reduce fluctuation even more.

In the above structures, a noble gas element may be introduced to generate plasma and change the surface condition of the first semiconductor film before forming the barrier layer in order to improve the adhesion.

In the above structures, a noble gas element may be introduced to generate plasma and change the surface condition of the barrier layer before forming the second semiconductor film in order to improve the adhesion.

In the above Structure 3, a noble gas element may be introduced to generate plasma and change the surface condition of the second semiconductor film before forming the third semiconductor film in order to improve the adhesion.

In the above Structure 2 or 3, the barrier layer is a silicon oxynitride film formed by plasma CVD in which silane-based gas and nitrogen oxide-based gas are introduced as material gas into a film forming chamber to generate plasma.

As has been described, the second semiconductor film containing a noble gas element and the barrier layer both can be formed by plasma CVD. Plasma CVD allows use of gas in cleaning of a film forming chamber (also called as a chamber). Therefore plasma CVD requires less maintenance than sputtering and is suitable for mass production.

In the above structures, the second semiconductor film containing a noble gas element and the barrier layer can be formed without exposing the device to the air. It is also possible to form the films in succession in the same chamber. Therefore the above structures are excellent in terms of throughput.

In the above structures, a method of manufacturing a semiconductor device is characterized in that the metal element is one or more kinds of elements selected from the group consisting of Fe, Ni, Co, Ru, Rh, Pd, Os, Ir, Pt, Cu, and Au. A semiconductor film having an amorphous structure is crystallized well when doped with these metal elements.

In the above structures, the noble gas element is one or more kinds of elements selected from the group consisting of He, Ne, Ar, Kr, and Xe. When a semiconductor film contains these ions, dangling bonds and lattice strain may be formed to form a gettering site.

The present invention can provide a semiconductor film having a crystal structure in which a metal element for accelerating crystallization is sufficiently reduced or removed. Therefore electric characteristics of TFTs having the semiconductor film as their active layers are improved, in particular, OFF current is reduced, and fluctuation between elements can be reduced.

BRIEF DESCRIPTION OF THE DRAWINGS

In the accompanying drawings:

FIGS. 4A to 4D are diagrams showing a process of manufacturing an AM-LCD;

DETAILED DESCRIPTION OF THE PREFERRED EMBODIMENTS

Embodiment Modes of the present invention will be described below.

Embodiment Mode 1

Hereinafter, an order of manufacturing a typical TFT by the present invention will be briefly described using FIGS. 1A to 1G. Here, an example of manufacturing a barrier layer and a gettering site by plasma CVD method.

Figure 1A:
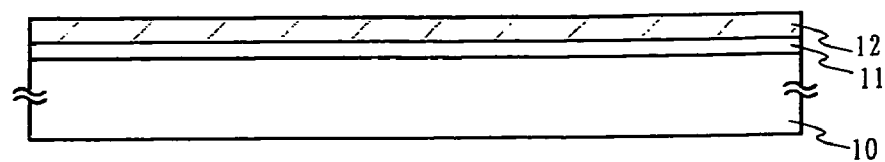
FIGS. 1A to 1G are diagrams showing a process of manufacturing a TFT (Embodiment Mode 1)

In FIG. 1A, reference numeral 10 denotes a substrate having an insulating surface, 11 denotes an insulating film which becomes a blocking layer, and 12 denotes a semiconductor film having an amorphous structure.

In FIG. 1A, a glass substrate, a quartz substrate, a ceramic substrate or the like may be used as the substrate 10. In addition, a silicon substrate, a metallic substrate, or a stainless substrate, in which an insulating film is formed on the surface may be used. Further, a plastic substrate having a heat resistance, which can withstand a processing temperature in the present steps may be used.

First, as shown in FIG. 1A, a base insulating film 11 as an insulating film such as a silicon oxide film, a silicon nitride film, or a silicon oxynitride film ($SiO_xN_y$) is formed on the substrate 10. As a typical example, the base insulating film 11 is composed of a two-layered structure and a structure in which a first silicon oxynitride film to be formed at a thickness of 50 nm to 100 nm using $SiH_4$, $NH_3$, and $N_2O$ as reactive gases and a second silicon oxynitride film to be formed at a thickness of 100 nm to 150 nm using $SiH_4$ and $N_2O$ as reactive gases are laminated is used therefor. It is preferable that a silicon nitride film (SiN film) having a film thickness of 10 nm or less or the second silicon oxynitride film ($SiN_xO_y$ film (X>>Y) is used as one layer of the base insulating film 11. In gettering, nickel tends to move to a region having a high oxygen concentration. Thus, it is extremely effective that a silicon nitride film is used as the base insulating film which is in contact with a semiconductor film. In addition, a three-layered structure in which the first silicon oxynitride film, the second silicon oxynitride film, and the silicon nitride film are laminated in order may be used.

Next, a first semiconductor film 12 having an amorphous structure is formed on the base insulating film. A semiconductor material containing mainly silicon is used for the first semiconductor film 12. Typically, an amorphous silicon film, an amorphous silicon germanium film, or the like is applied and formed at a thickness of 10 nm to 100 nm by a plasma CVD method, a low pressure CVD method, or a sputtering method. In order to obtain a semiconductor film having a good quality crystalline structure by later crystallization, it is preferable that concentrations of impurities such as oxygen and nitrogen which are included in the first semiconductor film 12 having the amorphous structure are reduced to $5 \times 10^{18}/cm^3$ (atomic concentration measured by a secondary ion mass spectroscopy (SIMS)) or lower. These impurities become a factor for hindering later crystallization and a factor for increasing densities of trapping center and recombination center even after the crystallization. Thus, it is desirable that a high purity material gas is naturally used and a ultra high vacuum support CVD apparatus in which mirror processing (electropolishing processing) is performed for a reaction chamber and which includes a vacuum evacuation system of oil free is used.

Figure 1B:
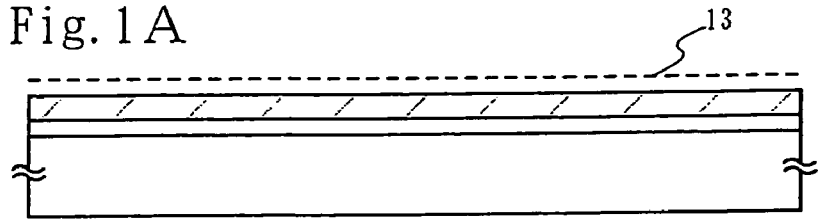

Next, the first semiconductor film 12 having the amorphous structure is crystallized by using a crystallization technique described in Japanese Patent Application Laid-Open No. 08-78329 here. According to the technique described in this document, a metallic element for promoting crystallization is selectively added to an amorphous silicon film and thermal treatment is performed to form the semiconductor film having a crystalline structure, which expands from an added region as a staring point. First, a nickel acetate solution including a metallic element (here, nickel) having catalysis for promoting crystallization at 1 ppm to 100 ppm in weight conversion is applied onto the surface of the first semiconductor film 12 having an amorphous structure by a spinner to form a nickel contained layer 13 (FIG. 1B). Means for forming an extremely thin film by a sputtering method, an evaporation method, or plasma processing may be used as another means except the method of forming the nickel contained layer 13 by the application. Also, an example in the case where the solution is applied onto the entire surface is indicated here. However, the nickel contained layer may be selectively formed by forming a mask.

Figure 1C:
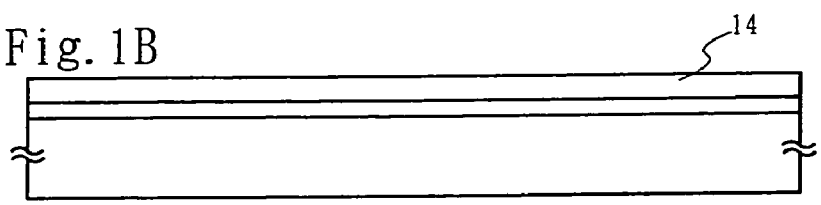

Next, thermal treatment is performed for crystallization. In this case, silicide is formed in a region of the semiconductor film which is in contact with the metallic element for promoting crystallization of a semiconductor and crystallization is progressed from the region as a nucleus. Thus, a first semiconductor film 14 having a crystalline structure as shown in FIG. 1C is formed. Note that it is desirable that a concentration of oxygen included in the first semiconductor film 14 after the crystallization is $5\times10^{18}/cm^3$ or lower. Here, thermal treatment for dehydrogenation (at 450° C. for 1 hour) is performed and then thermal treatment for crystallization (at 550° C. to 650° C. for 4 hours to 24 hours) is performed. In addition, when crystallization is conducted by intense light irradiation, infrared light, visible light, ultraviolet light, or a combination thereof can be used. Typically, light emitted from a halogen lamp, a metal halide lamp, a xenon arc lamp, a carbon arc lamp, a high pressure sodium lamp, or a high pressure mercury lamp is used. A lamp light source is turned on for 1 second to 60 seconds, preferably, 30 seconds to 60 seconds. This operation is preferably repeated one time to ten times so that the semiconductor film is instantaneously heated up to about 600° C. to 1000° C. Note that, if necessary, thermal treatment for releasing hydrogen included in the first semiconductor film 14 having the amorphous structure may be performed before the intense light irradiation. In addition, the thermal treatment and the intense light irradiation may be simultaneously performed for crystallization. When productivity is considered, it is desirable that the crystallization is conducted by the intense light irradiation.

A metallic element (here, nickel) is left in the thus obtained first semiconductor film 14. The metallic elements are not uniformly distributed in the film. However, they are left at a concentration higher than $1\times10^{19}/cm^3$ as an average concentration. Of course, even in such a state, various semiconductor devices including a TFT can be formed. Here, the metallic element is removed by the following method.

Next, in order to increase a crystallization ratio (ratio of a crystal element to a total volume of the film) and to repair a defect left in a crystal grain, laser light is preferably irradiated to the first semiconductor film 14 having the crystalline structure. At the laser light irradiation, a thin oxide film (not shown) is formed on the surface of the first semiconductor film. As this laser light, excimer laser light having a wavelength of 400 nm or less, or the second harmonic wave or the third harmonic wave of a YAG laser is used.

Next, a thin oxide film of the surface of the first semiconductor film 14 having an amorphous structure is removed by diluted hydrofluoric acid or the like. Note that, since the thin oxide film causes fluctuation and becomes a factor for causing a peeling off in a later film formation, it is important to remove the oxide film formed when a laser light is irradiated to the first semiconductor film 14 having a crystalline structure.

Figure 1D:
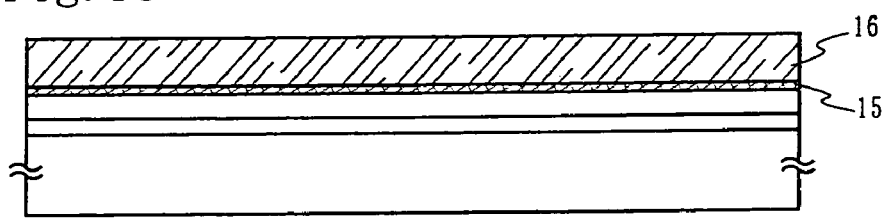

Next, a barrier layer 15 consisted of a silicon oxynitride film with a thickness of 1 to 10 nm is formed by plasma CVD method on the first semiconductor film 14 having a crystalline structure. Then, a second semiconductor film 16 including a rare gas element is formed on the barrier layer 15 (FIG. 1D). The barrier layer 15 functions as an etching stopper when only the second semiconductor film 16 is selectively removed in the later step. Note that, it is required that the barrier layer 15 has a film quality or a film thickness such that nickel in the first semiconductor film can be moved to the second semiconductor film by later gettering. In this specification, the barrier layer indicates a layer which has a film quality or a film thickness such that the transmission of the metallic element is possible in a gettering step and is used as an etching stopper in a step of removing a layer as a gettering site.

Further, the barrier layer 15 is formed as a raw material gas by plasma CVD method using, monosilane ($SiH_4$) and nitrous oxide ($N_2O$). Thus obtained barrier layer 15 has a high adhesiveness with the first semiconductor film 14. In addition, if the silicon oxynitride film is formed in the above film thickness range, the metallic element can be transmitted through the barrier layer and moved to a gettering site. Furthermore, the barrier layer 15 is extremely effective as the etching stopper since the selection ratio of the second semiconductor film and the selection ratio of the first semiconductor film are high.

Also, the second semiconductor film 16 containing a rare gas element by plasma CVD method so as to form a gettering site. The barrier layer 15 and the second semiconductor film 16 containing a rare gas element can be formed without exposing them to air. In addition, they can be formed in the same chamber in succession.

One kind or plural kinds of elements selected from the group consisting of helium (He), neon (Ne), argon (Ar), krypton (Kr), and xenon (Xe) are used as rare gas elements. Among them, argon (Ar) is preferable because of a low cost gas. Here, a combination of monosilane and argon, a combination of monosilane, argon, and hydrogen, a combination of monosilane, argon and nitrogen are used as raw material gases. Thus, the second semiconductor film which includes argon at a concentration of $1\times10^{18}/cm^3$ to $1\times10^{22}/cm^3$, preferably, $1\times10^{20}/cm^3$ to $1\times10^{21}/cm^3$ and in which the gettering effect is obtained, can be formed by the plasma CVD method.

There are two meanings to include the rare gas element ion as an inert gas in the film. One is to form a dangling bond to cause a distortion in the semiconductor film. The other is to cause a distortion between lattices of the semiconductor film. When an element such as argon (Ar), krypton (Kr), xenon (Xe), which has a larger atomic radius than silicon is used, a distortion between lattices of the semiconductor film is remarkably caused. In addition, when the rare gas element is included in the film, not only a lattice distortion but also a dangling bond are produced to contribute to the improvement of a gettering action.

Figure 1E:
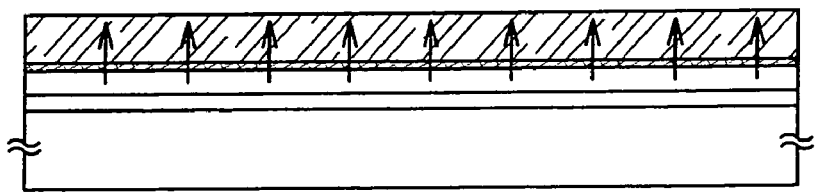

Next, thermal treatment is performed for gettering to reduce the concentration of the metallic element (nickel) or remove the metallic element in the first semiconductor film (FIG. 1E). Processing for irradiating intense light or thermal treatment is preferably performed as thermal treatment for gettering. By the gettering, the metallic element is moved in a direction indicated by an arrow in FIG. 1E (that is, a direction from a substrate side toward the surface of the second semiconductor film). Thus, the metallic element included in the first semiconductor film 12 covered with the barrier layer 15 is removed or the concentration thereof is reduced. It is preferable that a moving distance of the metallic element in gettering is at least a distance corresponding to the thickness of the first semiconductor film. Thus, gettering can be completed in a relatively short time. Here, the following sufficient gettering is conducted. Every nickel is moved to the second semiconductor film 16 so as not to segregate it in the first semiconductor film 12 so that nickel is not almost included in the first semiconductor film 12. That is, a concentration of nickel in the film is made to be $1\times10^{18}/cm^3$ or lower, desirably, $1\times10^{17}/cm^3$ or lower.

Note that there is a case where a portion of the second semiconductor film is crystallized dependent on a condition of thermal treatment for gettering or a film thickness of the second semiconductor film. If the second semiconductor film is crystallized, a dangling bond or a lattice distortion is decreased to cause a reduction in a gettering effect. Thus, a condition of thermal treatment in which the second semiconductor film is not crystallized or the film thickness of the second semiconductor film is preferably set. In either case, the second semiconductor film, that is, an amorphous silicon film including the rare gas element is hard to crystallize as compared with an amorphous silicon film which does not include the rare gas element. Thus, it is suitable as the gettering site. Further, the second semiconductor film includes nitrogen at a concentration of $1\times10^{20}/cm^3$ to $1\times10^{21}/cm^3$ so that it is harder to crystallize. Thus, it is preferable as the gettering site.

Also, dependent on the condition of thermal treatment for the gettering, an increase in a crystallization ratio of the first semiconductor film, and a repair of a defect left in a crystal grain, that is, the improvement of crystallinity can be made simultaneously with gettering.

Gettering in this specification indicates that a metallic element present in a region to be gettered (here, the first semiconductor film) is released by thermal energy and moved to the gettering site by diffusion. Thus, gettering depends on a processing temperature and is conducted for a shorter time with increasing a temperature.

When processing for irradiating intense light is used, a lamp light source for heating is turned on for 1 second to 60 seconds, preferably, 30 seconds to 60 seconds. This operation is repeated one time to ten times, preferably two times to six times. A light emission intensity of the lamp light source is arbitrarily set. However, the intensity is set such that the semiconductor film is instantaneously heated at about 600° C. to 1000° C., preferably, about 700° C. to 750° C.

Also, when gettering is conducted by thermal treatment, thermal treatment is preferably performed in a nitrogen atmosphere at 450° C. to 800° C. for 1 hour to 24 hours, for example, at 550° C. for 14 hours. Intense light irradiation may be performed in addition to the thermal treatment.

Figure 1F:
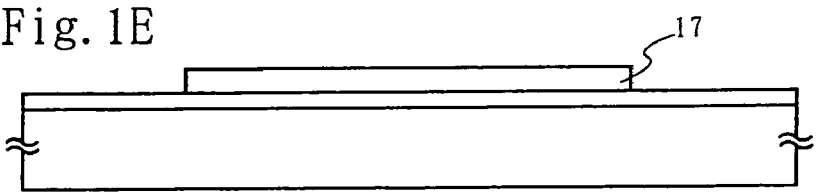

Next, only the second semiconductor film indicated by reference numeral 16 is selectively removed using the barrier layer 15 as an etching stopper. After that, the barrier layer 15 is removed and the first semiconductor film 12 is patterned by a known patterning technique to form a semiconductor layer 17 having a predetermined shape (FIG. 1F). As a method of selectively etching only the second semiconductor film, dry etching using $ClF_3$ without generating plasma or wet etching using an alkali solution such as an aqueous solution including hydrazine or tetraethyl ammonium hydroxide (chemical formula $(CH_3)_4NOH$) can be used. In addition, when a concentration of nickel in the surface of the barrier layer is measured by a TXRF after the removal of the second semiconductor film, nickel is detected at a high concentration. Thus, it is preferable that the barrier layer is removed by an etchant including hydrofluoric acid. In addition, after the removal of the barrier layer, it is desirable that a thin oxide film is formed on the surface using ozone water before a mask made of a resist is formed.

Next, the surface of the semiconductor layer is washed by an etchant including hydrofluoric acid and then an insulating film including mainly silicon is formed as a gate insulating film 18. It is desirable that the surface washing and the formation of the gate insulating film are performed in succession without exposing to air.

Next, the surface of the gate insulating film 18 is washed and then a gate electrode 19 is formed. After that, an impurity element for imparting an n-type (P, As, or the like), here, phosphorus is suitably added to the semiconductor to form a source region 20 and a drain region 21. After the addition, thermal treatment, intense light irradiation, or laser light irradiation is performed to activate the impurity element. A plasma damage to the gate insulating film and a plasma damage to an interface between the gate insulating film and the semiconductor layer can be recovered simultaneously with the activation. In particular, it is very effective that the second harmonic wave of a YAG laser is irradiated from the front surface or the back surface in an atmosphere of a room temperature to 300° C. to activate the impurity element. The YAG laser is easy to maintain. Thus, it is a preferable activation means.

Hereinafter, an interlayer insulating film 23 is formed, hydrogenation is performed, contact holes which reach the source region and the drain region are formed, and a source electrode 24 and a drain electrode 25 are formed. Thus, a TFT (n-channel TFT) is completed (FIG. 1G).

A concentration of the metallic element included in a channel forming region 22 in the thus obtained TFT can be set to be lower than $1\times10^{17}/cm^3$.

Figure 1G:
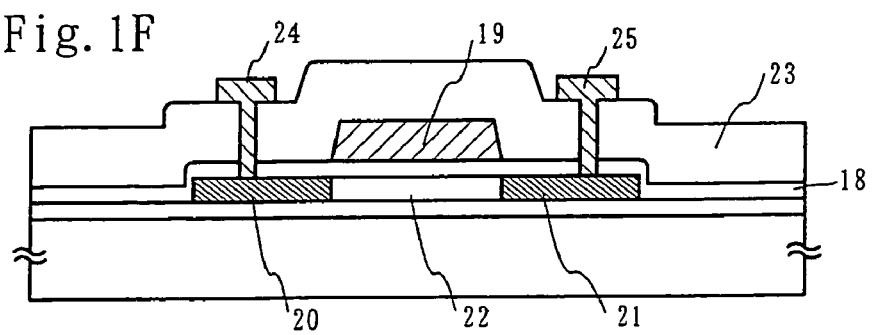

Also, the present invention is not limited to the TFT structure shown in FIG. 1G. If needed, a low concentration drain (LDD: lightly doped drain) structure in which a LDD region is located between the channel forming region and the drain region (or the source region) may be used. This structure is obtained by providing a region to which an impurity element is added at a low concentration between the channel forming region and the source region or the drain region which each is formed by adding an impurity element thereto at a high concentration. This region is called the LDD, region. Further, a so-called GOLD (gate-drain overlapped LDD) structure in which the LDD region is overlapped with the gate electrode through the gate insulating film may be used.

Here, the n-channel TFT is described. However, it is needless to say that a p-channel TFT can be formed by using a p-type impurity element instead of an n-type impurity element.

Also, the example of a top gate TFT is described here. However, the present invention can be applied independent on a TFT structure. For example, the present invention can be applied to a bottom gate (inverse staggered) TFT or a staggered TFT.

Moreover, an example using a semiconductor film which includes a rare gas element here. In addition to that, a semiconductor film including a phosphorus element can be used. When a semiconductor film including the phosphorus element is formed, phosphine may be added to a film formation gas. For instance, a combination of monosilane, phosphine $(PH_3)$ and argon, a combination of monosilane, phosphine $(PH_3)$ and hydrogen, and a combination of monosilane, phosphine $(PH_3)$, and nitrogen can be used as material gases to film formation.

Embodiment Mode 2

An example of forming a gettering site having a laminate structure is described with reference to FIG. 2.

Figure 2:
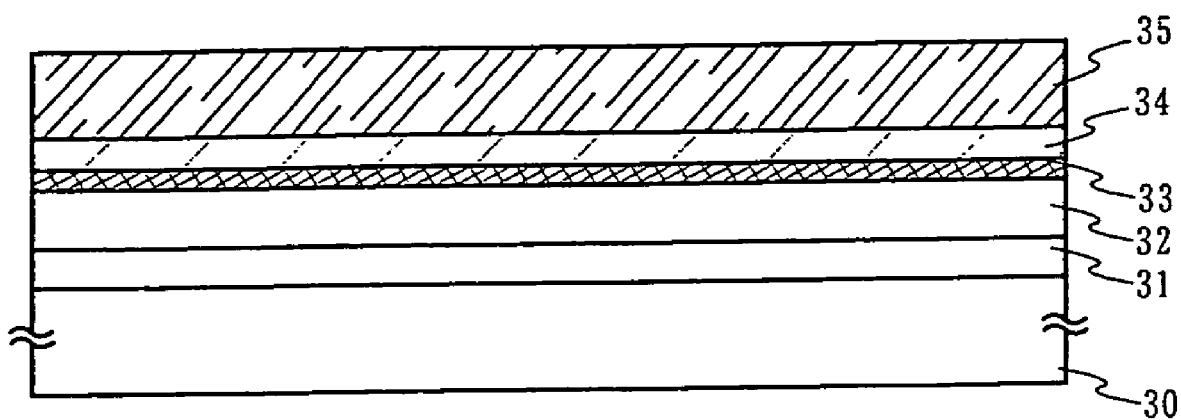
FIG. 2 is a diagram showing Embodiment Mode 2.

In FIG. 2, reference symbol 30 denotes a substrate, 31, a base insulating film, 32, a first semiconductor film having a crystal structure, and 33, a barrier layer. These films are formed in the same manner as Embodiment Mode 1.

After the barrier layer 33 is formed following Embodiment Mode 1, a second semiconductor film 34 and a third semiconductor film 35 containing a noble gas element are formed by plasma CVD. When a combination of monosilane and argon, or a combination of monosilane, argon, and hydrogen is used as film forming gas for the third semiconductor film 35 containing a noble gas element, the adhesion of the film to the top face of the barrier layer 33 is poor and the film is likely to peel. Accordingly, the second semiconductor film 34 is formed here between the third semiconductor film 35 and the barrier layer 33 to serve as a buffer layer that enhances the adhesion of 35 to 33. Preferably, the second semiconductor film 34 is a silicon film which is formed from monosilane, argon, and nitrogen as film forming gas and which contains about the same amount of noble gas element as the third semiconductor film Containing a noble gas element within the film, the second semiconductor film 34 functions as a part of a gettering site. The second semiconductor film 34 is hardly crystallized during gettering and therefore is appropriate as a gettering site. The rate the second semiconductor film 34 is etched by an alkaline etchant (typically, tetraethyl ammonium hydroxide (chemical formula: $(CH_3)_4NOH$)-containing solution such as TMAH in a later removal step is slow. Therefore it is preferable for the second semiconductor film 34 to be thinner than the third semiconductor film 35 and, specifically, the thickness desirable for 34 is 1 to 10 nm. This way the second semiconductor film 34 also functions as an etching stopper when removing the third semiconductor film 35.

When monosilane, argon, and hydrogen are used as film forming gas for the third semiconductor film 35 containing a noble gas element, the film can contain a relatively high concentration of argon by adjusting film formation conditions properly. This makes sufficient gettering possible even when the film 35 is thin. It also makes the rate the film 35 is etched by an alkaline etchant (TMAH or the like) in the later removal step faster, and improves the throughput.

The barrier layer 33, the second semiconductor film 34 containing a noble gas element, and the third semiconductor film 35 containing a noble gas element can be formed without exposing the substrate to the air. The films also can be formed in succession in the same chamber.

Next, the concentration of the metal element (nickel) in the first semiconductor film is reduced or removed by heat treatment for gettering. The subsequent steps to manufacture a TFT are identical with those in Embodiment Mode 1.

Embodiment Mode 3

In the example shown in Embodiment Mode 2, the noble gas element content in the second semiconductor film is about the same as the noble gas element content in the third semiconductor film. This embodiment mode shows with reference to FIGS. 3A and 3B examples of forming a gettering site that has a varying noble gas element concentration.

Figure 3A:
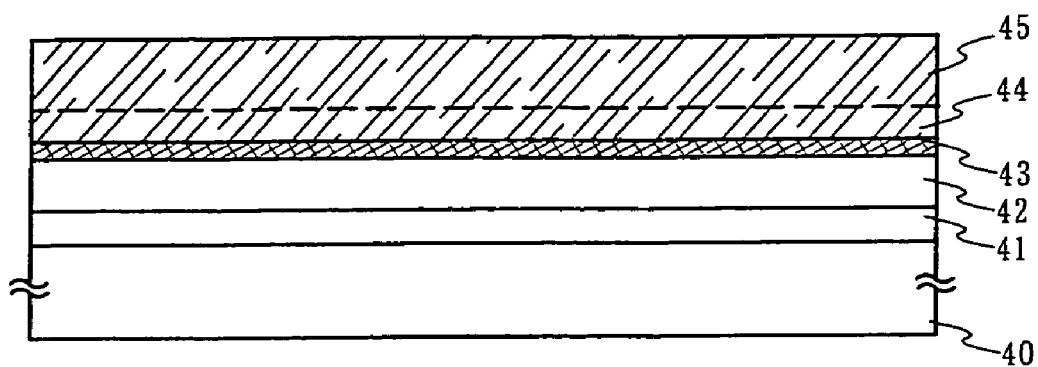
FIGS. 3A and 3B are diagrams showing Embodiment Mode 3.

In FIG. 3A, reference symbol 40 denotes a substrate, 41, a base insulating film, 42, a first semiconductor film having a crystal structure, and 43, a barrier layer. These films are formed in the same manner as Embodiment Mode 1.

After the barrier layer 43 is formed following Embodiment Mode 1, a second semiconductor film 44 containing a low concentration of noble gas element and a third semiconductor film 45 containing a high concentration of noble gas element are formed by plasma CVD.

For example, monosilane and argon are used as film forming gas to form the second semiconductor film 44 containing argon in a concentration of about $5\times10^{17}$ /cm$^3$ whereas monosilane, argon, and hydrogen are used as film forming gas to form the third semiconductor film 45 containing argon in a concentration of about $1.2\times10^{20}$/cm$^3$.

Alternatively, the laminate of Embodiment Mode 2 is employed and the noble gas element concentration in the third semiconductor film may be set higher than the noble gas element concentration in the second semiconductor film by changing the film formation conditions of the third semiconductor film.

In this case, where a semiconductor film high in noble gas element concentration is formed on a semiconductor film low in noble gas element concentration to obtain a gettering site, the metal element contained in the first semiconductor film can be moved in the thickness direction of the gettering site sequentially since the metal element tends to move toward areas of higher noble gas element concentration during the later gettering step.

The barrier layer 43, the second semiconductor film 44 containing a noble gas element, and the third semiconductor film 45 containing a noble gas element can be formed without exposing the substrate to the air. The films also can be formed in succession in the same chamber.

Figure 3B:
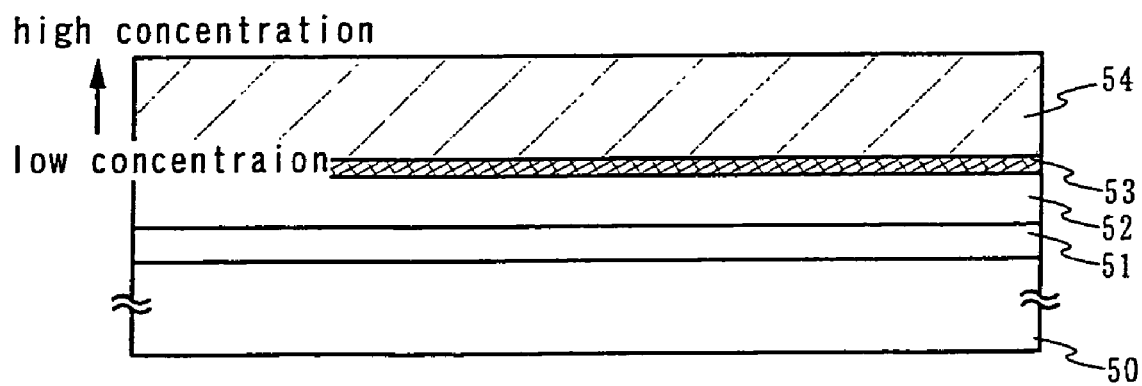

The gettering site may be a semiconductor film having a higher concentration of noble gas element on the surface. FIG. 3B shows an example thereof.

In FIG. 3B, reference symbol 50 denotes a substrate, 51, a base insulating film, 52, a first semiconductor film having a crystal structure, and 53, a barrier layer. These films are formed in the same manner as Embodiment Mode 1.

Next, a second semiconductor film 54 having a noble gas element concentration gradient is formed on the barrier layer 53. The concentration gradient in the second semiconductor film 54 is set such that the surface of the film, in other words, the area farthest from the first semiconductor film has the highest concentration.

In order to give the second semiconductor film 54 the noble gas element concentration gradient, film formation conditions by plasma CVD are kept changed during forming the second semiconductor film 54.

Specifically, the noble gas element concentration gradient is obtained by increasing the RF power (20 to 300 W, the electrode area: 600 cm$^2$) in stages or continuously while the second semiconductor film 54 is formed. Another way to obtain the noble gas element concentration gradient is that the film forming pressure (0.04 to 0.4 Torr) is lowered in stages or continuously while the second semiconductor film 54 is formed. Still another way to obtain the noble gas element concentration gradient is that the flow rate of silane-based gas is lowered in stages or continuously while the second semiconductor film 54 is formed. By thus changing the film formation conditions, the noble gas element concentration in the semiconductor film can be graded between $1\times10^{17}$ /cm$^3$ and $1\times10^{22}$ /cm$^3$.

Alternatively, the concentration gradient may be given to a semiconductor film that serves as a gettering site by conducting plasma treatment using noble gas, typically argon, after the second semiconductor film is formed. The plasma treatment dopes the area near the surface with argon so that the area near the surface has a higher concentration of argon. Instead of plasma treatment, ion doping or ion implantation may be used to dope the semiconductor film that serves as a gettering site with a noble gas element and to give the semiconductor film the concentration gradient.

When the gettering site is a semiconductor film having a noble gas element concentration gradient as described, the metal element contained in the first semiconductor film can be moved in the film thickness direction of the gettering site sequentially since the metal element tends to move toward areas of higher noble gas element concentration during the later gettering step.

The semiconductor film having the concentration gradient is a single layer in the example shown here. However, the film may be a laminate of two or more layers or may be a laminate of a semiconductor film having a concentration gradient and a semiconductor film containing a certain amount of noble gas element in a concentration higher than the former semiconductor film. The example may also be combined with Embodiment Mode 2.

After the gettering site shown in FIG. 3A or 3B is thus formed, heat treatment is conducted for gettering to reduce the concentration of or remove the metal element (nickel) in the first semiconductor film. The subsequent steps to manufacture a TFT are identical with those in Embodiment Mode 1.

Embodiment Mode 4

This embodiment mode gives details on the characteristics of the barrier layer, second semiconductor film, and third semiconductor film shown in Embodiment Modes 1 through 3 and obtained by plasma CVD.

Experiment 1

An amorphous silicon film formed by plasma CVD from monosilane, argon, and hydrogen as material gas will be described in the following Experiments 1 and 2.

Figure 12:
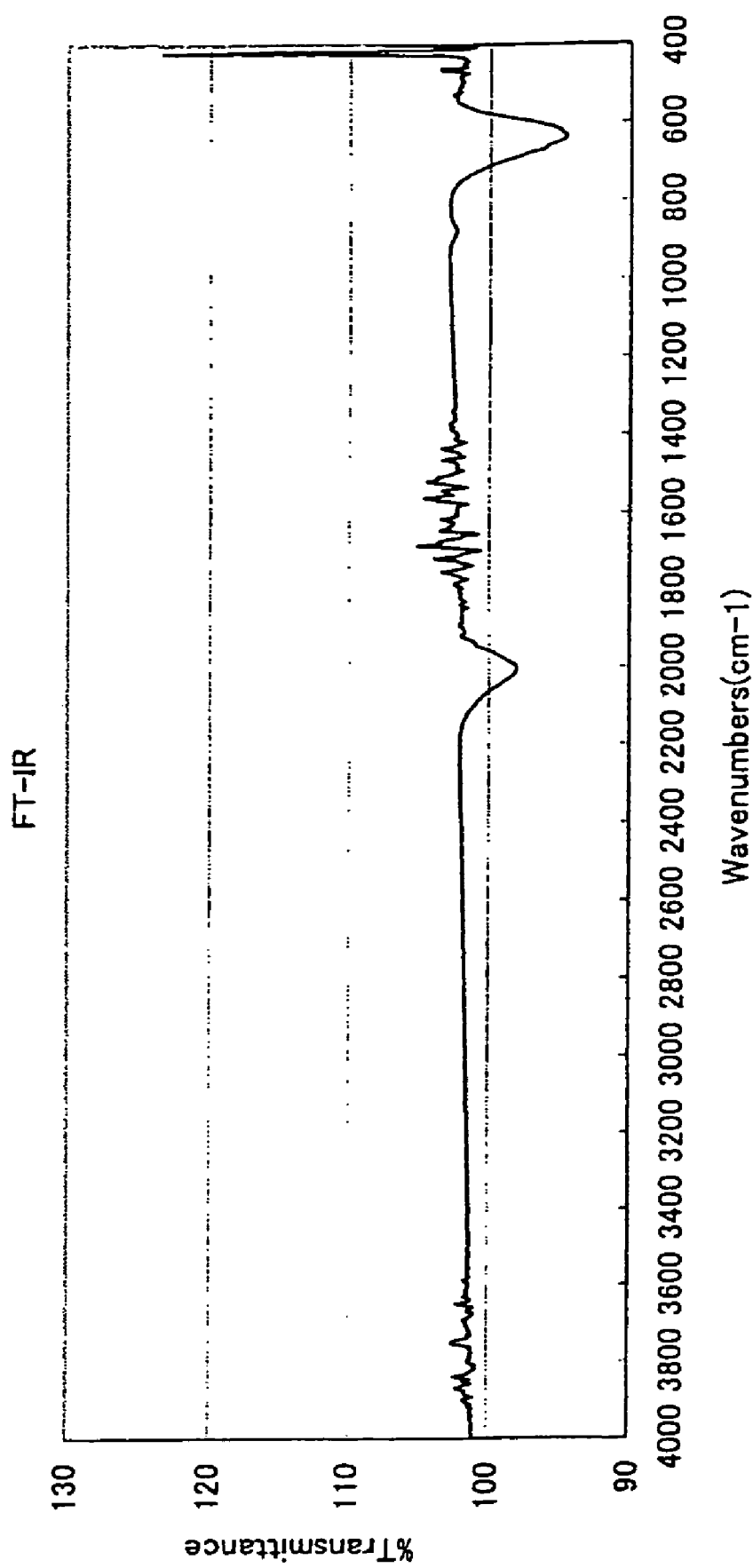
FIG. 12 is a diagram showing spectroscopic data by FT-IR.

An amorphous silicon film is formed using monosilane, argon, and hydrogen as material gas. The spectroscopic data on this film by Fourier transform infrared spectroscopy (FT-IR) are shown in FIG. 12. In FIG. 12, the Si—Si bond peaks at a wave number of 640/cm and there is a peak at a wave number of 2020/cm. Since it is said that the Si—H bond peaks at a wave number of 2000/cm whereas the Si—H$_2$ bond peaks at a wave number of 2100/cm, the peak at a wave number of 2020/cm in FIG. 12 is mainly of Si—H bond and minutely for Si—H$_2$ bond in the film.

Next, the dependency of argon concentration on the RF power density is examined for an amorphous silicon film formed on a semiconductor substrate from monosilane, argon, and hydrogen as material gas.

First, the semiconductor substrate is transferred into a chamber and heated and kept at 300° C. The pressure in the chamber is adjusted by an exhaust system and set at 66.65 Pa (0.5 Torr). Then SiH$_4$ gas is introduced from a gas introducing system into the chamber at a flow rate of 100 sccm and a high frequency power supply discharges at a discharge frequency of 27.12 MHz and an RF power of 20 W (RF power density: 0.033 W/cm, electrode area: 600 cm$^2$) to form a first amorphous silicon film by plasma CVD. The first amorphous silicon film is the reference.

Next, a second amorphous silicon film with a film thickness of 200 nm is laminated on the first amorphous silicon film. The second amorphous silicon film is formed by plasma CVD after keeping the temperature at 300° C. and adjusting the pressure in the chamber by an exhaust system to set it to 26.66 Pa (0.2 Torr). During the plasma CVD, SiH$_4$ gas, argon gas, and nitrogen gas are introduced at a flow rate of 100 sccm, 500 sccm, and 200 sccm, respectively, into the chamber from a gas introducing system, and a high frequency power supply discharges at a discharge frequency of 27.12 MHz and an RF power of 20 W (RF power density: 0.033 W/cm$^2$).

Next, the RF power condition alone is changed to form on the second amorphous silicon film a third amorphous silicon film (RF power density: 0.166 W/cm$^2$), a fourth amorphous silicon film (RF power density: 0.333 W/cm$^2$), and a fifth amorphous silicon film (RF power density: 0.5 W/cm$^2$) in order.

Figure 13A:
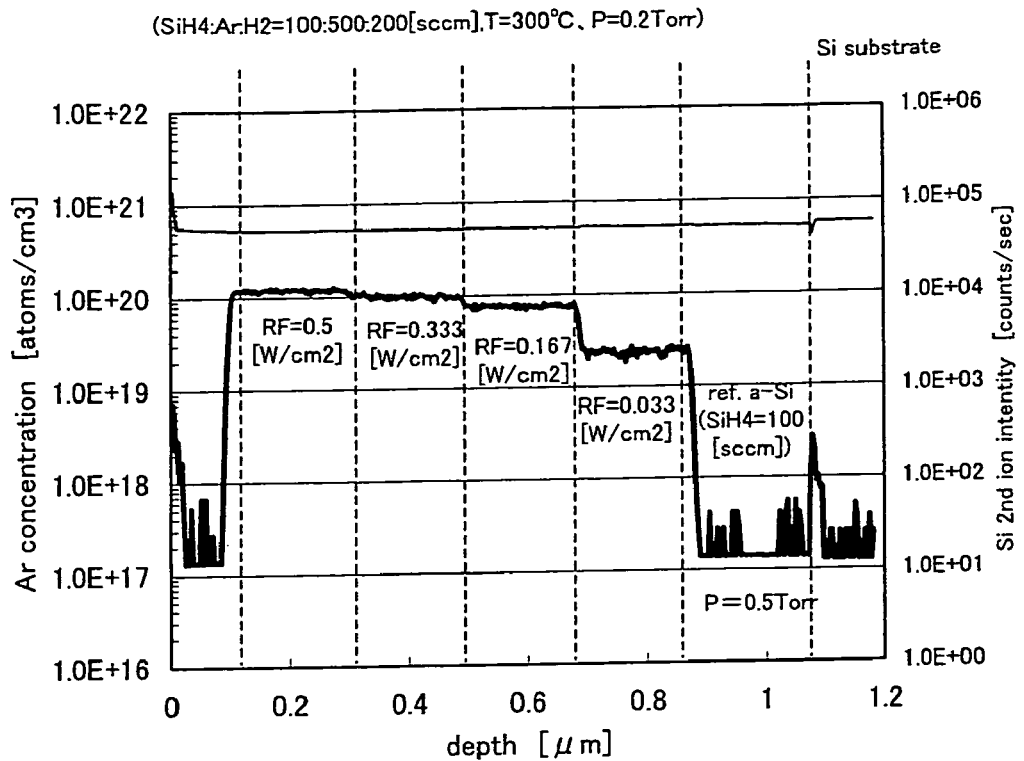
FIGS. 13A and 13B are a diagram of SIMS data showing the argon concentration (RF power dependency) and a diagram of SIMS data showing the fluorine concentration, respectively (Experiment 1)
Figure 13B:
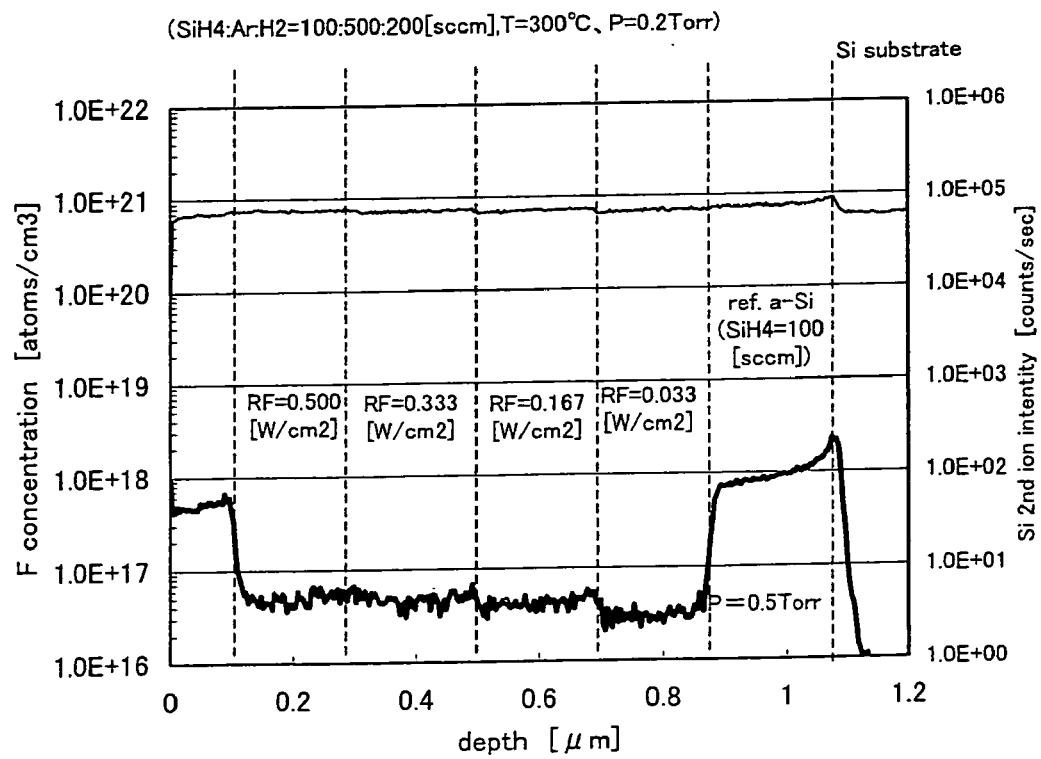
Figure 14A:
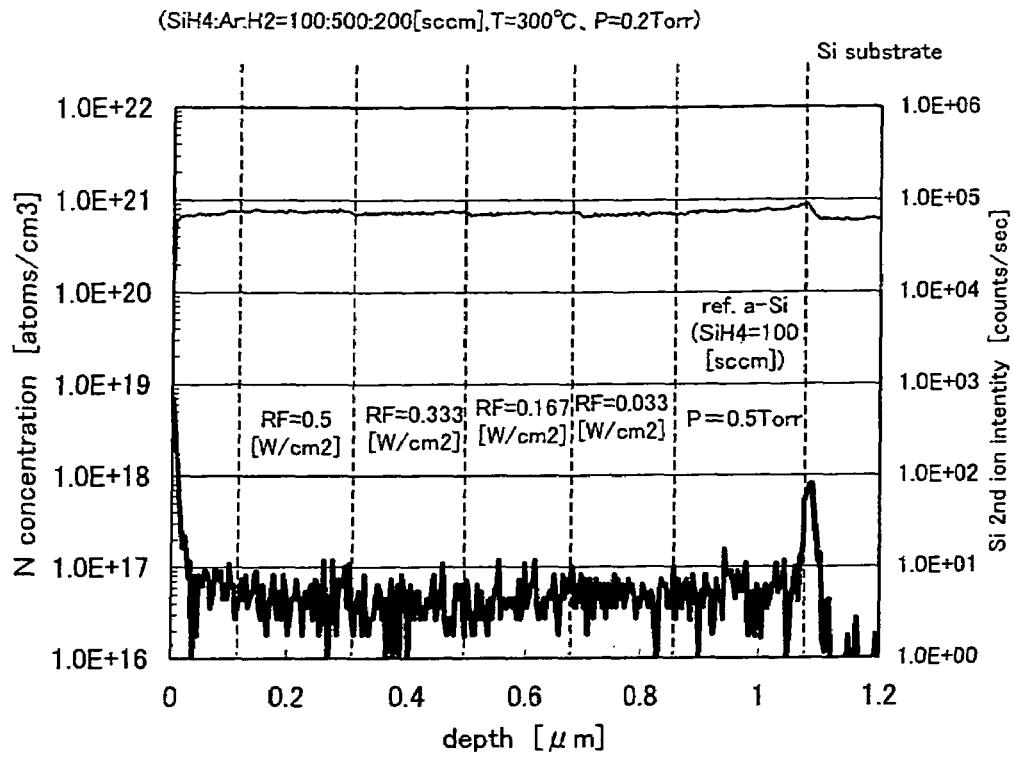
FIGS. 14A and 14B are a diagram of SIMS data showing the oxygen concentration and a diagram of SIMS data showing the nitrogen concentration, respectively (Experiment 1)
Figure 14B:
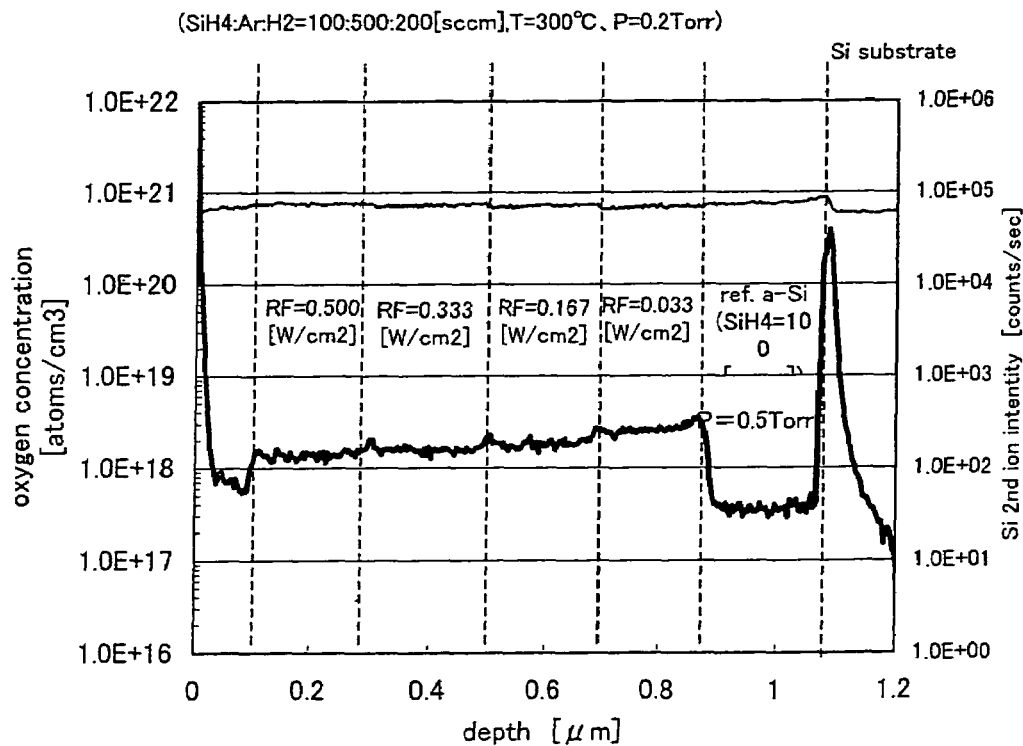

The laminate thus formed on the semiconductor substrate is analyzed by SIMS to measure the argon concentration, fluorine concentration, nitrogen concentration, and oxygen concentration in the laminate. The results of measuring the argon concentration are shown in FIG. 13A, the fluorine concentration in FIG. 13B, the nitrogen concentration in FIG. 14A, and the oxygen concentration in FIG. 14B. It reads from FIG. 14A that the nitrogen concentration in the laminate is about $1\times10^{16}$ to $1\times10^{17}$/cm$^3$. It reads from FIG. 14B that the oxygen concentration in the laminate is about $4\times10^{17}$ to $3\times10^{18}$/cm$^3$. Though not shown in the drawings, the carbon concentration in the laminate is $1\times10^{16}$ to $5\times10^{17}$/cm$^3$.

As FIGS. 13A to 14B clearly show, the argon concentration in an amorphous silicon film is increased up to $1\times10^{20}$ to $1\times10^{21}$/cm$^3$ by using hydrogen, argon, and monosilane gas as material gas. Accordingly, an amorphous silicon film containing a high concentration of argon, specifically, $1\times10^{20}$ to $1\times10^{21}$/cm$^3$, can be formed by plasma CVD using hydrogen, argon, and monosilane gas as material gas. On the other hand, when monosilane and argon alone are used as material gas, the argon concentration in the obtained film is merely around $1\times10^{18}$/cm$^3$, namely, $5\times10^{17}$ to $2\times10^{18}$/cm$^3$.

The use of hydrogen, argon, and monosilane gas as material gas also lowers the fluorine concentration in the amorphous silicon film to $2\times10^{16}$ to $8\times10^{16}$/cm$^3$.

As the RF power density is raised, the argon concentration in the amorphous silicon film is increased. The fluorine concentration, nitrogen concentration, oxygen concentration, and carbon concentration in the film show almost no change when the RF power density is increased.

Experiment 2

The dependency of the argon concentration in an amorphous silicon film on the pressure in the chamber is examined next by using plasma CVD and by varying the inside-chamber pressure condition.

First, the same conditions as Experiment 1 are employed to form a first amorphous silicon film that serves as the reference on a semiconductor substrate by plasma CVD.

Next, a second amorphous silicon film with a film thickness of 200 nm is laminated on the first amorphous silicon film. The second amorphous silicon film is formed by plasma CVD after keeping the temperature at 300° C. and adjusting the pressure in the chamber by an exhaust system to set it to 5.332 Pa (0.04 Torr). During the plasma CVD, SiH$_4$ gas, argon gas, and hydrogen gas are introduced at a flow rate of 100 sccm, 100 sccm, and 50 sccm, respectively, into the chamber from a gas introducing system, and a high frequency power supply discharges at a discharge frequency of 27.12 MHz and an RF power of 20 W (RF power density: 0.033 W/cm$^2$).

Next, the inside-chamber pressure condition and the gas flow rate condition are changed to form on the second amorphous silicon film a third amorphous silicon film (pressure: 4 Pa (0.03 Torr), SiH$_4$ gas flow rate: 100 sccm, argon gas flow rate: 50 sccm, hydrogen gas flow rate: 40 sccm) and a fourth amorphous silicon film (pressure: 2.666 Pa (0.02 Torr), SiH$_4$ gas flow rate: 100 sccm, argon gas flow rate: 15 sccm, hydrogen gas flow rate: 12 sccm) in order.

Figure 15A:
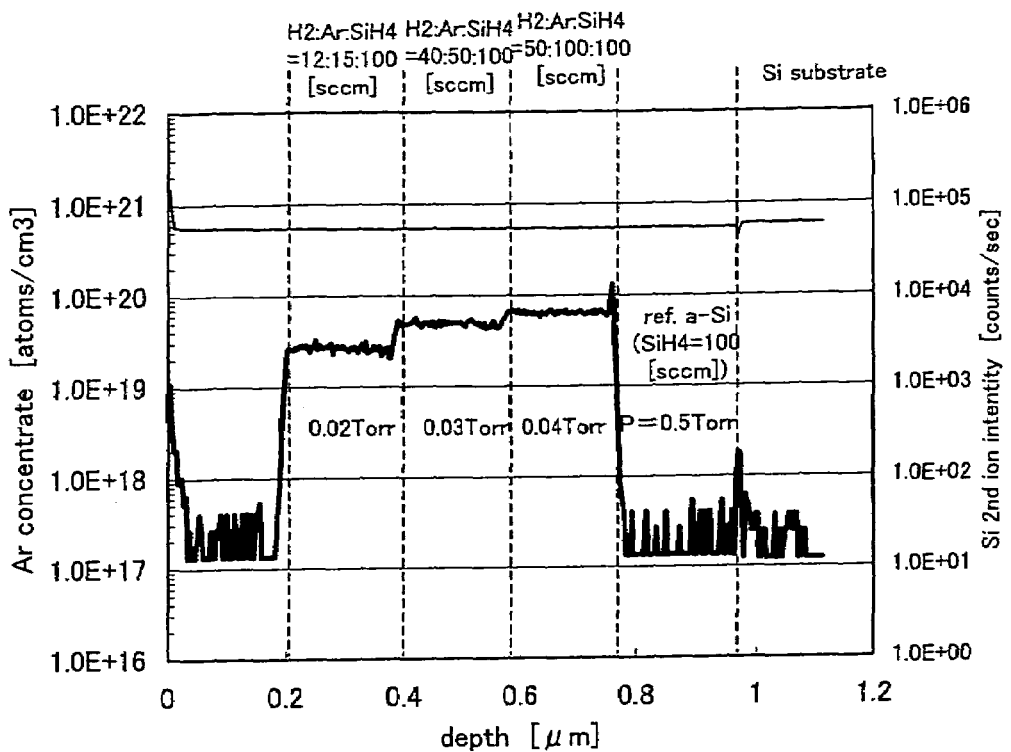
FIGS. 15A and 15B are a diagram of SIMS data showing the argon concentration (pressure dependency) and a diagram of SIMS data showing the fluorine concentration, respectively (Experiment 2)
Figure 15B:
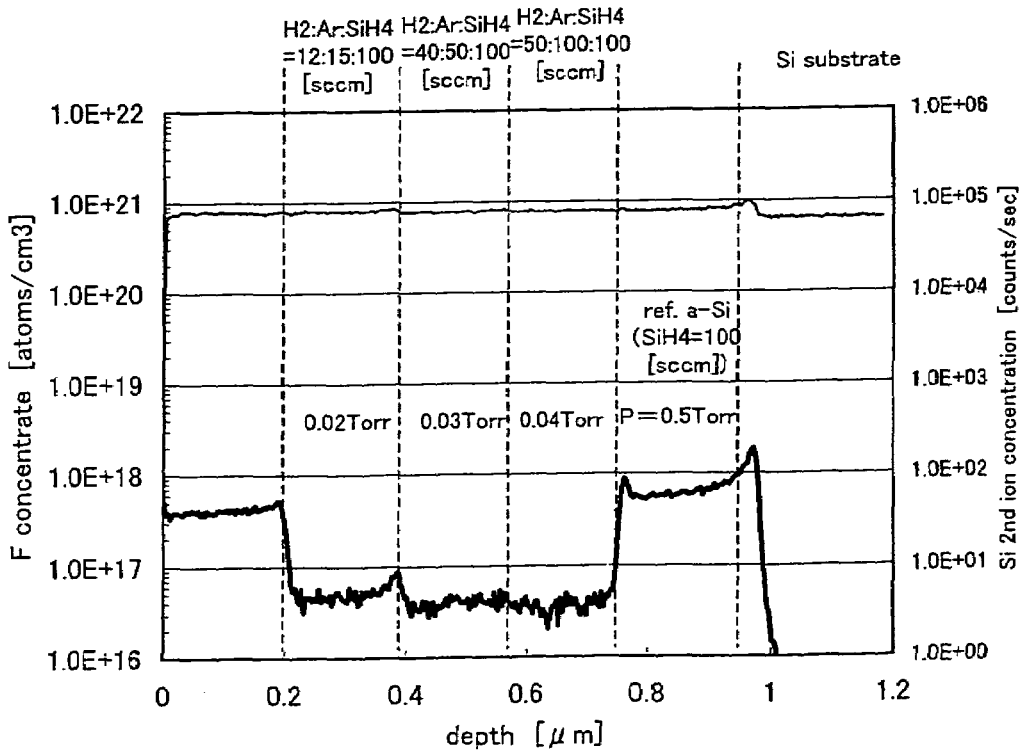
Figure 16A:
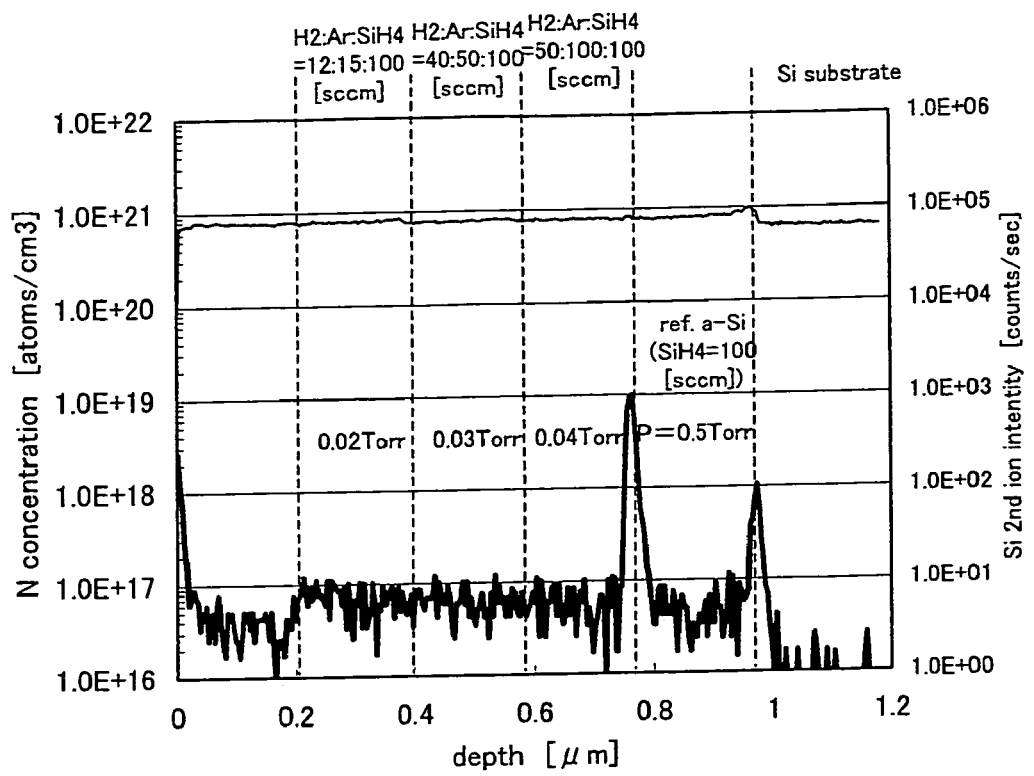
FIGS. 16A and 16B are a diagram of SIMS data showing the oxygen concentration and a diagram of SIMS data showing the nitrogen concentration, respectively (Experiment 2)
Figure 16B:
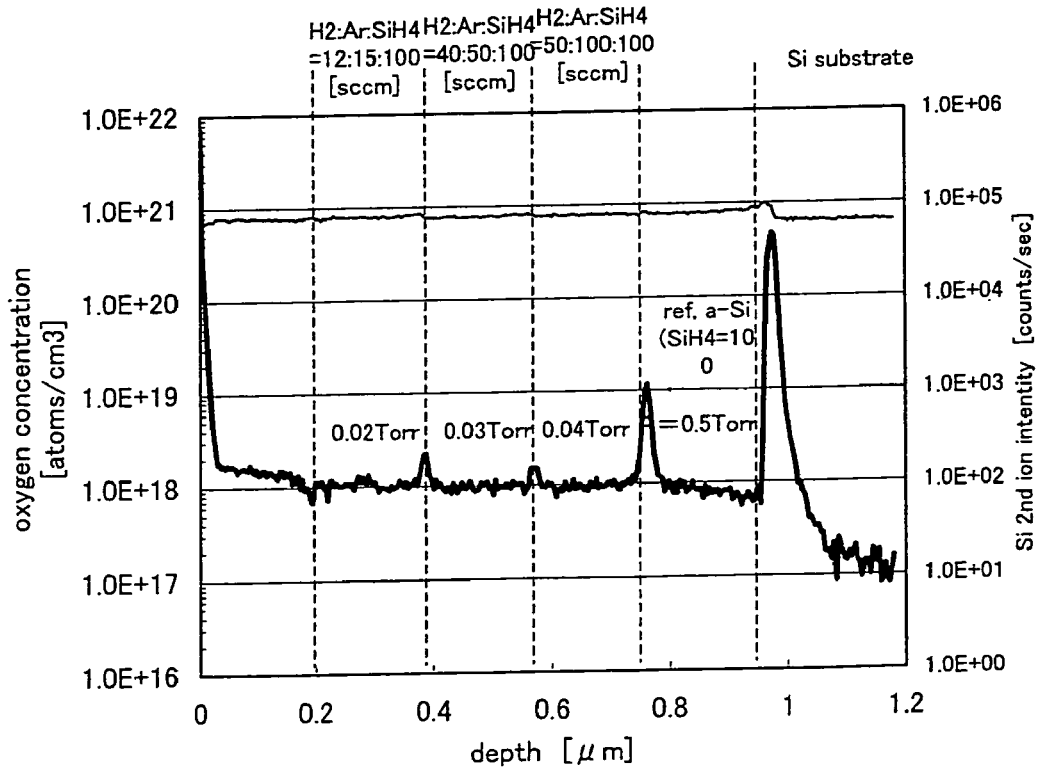

The laminate thus formed on the semiconductor substrate is analyzed by SIMS to measure the argon concentration, fluorine concentration, nitrogen concentration, and oxygen concentration in the laminate. The results of measuring the argon concentration are shown in FIG. 15A, the fluorine concentration in FIG. 15B, the nitrogen concentration in FIG. 16A, and the oxygen concentration in FIG. 16B. The carbon concentration in the laminate is $1\times10^{16}$ to $5\times10^{17}/cm^3$.

As FIGS. 15A to 16B clearly show, the argon concentration in an amorphous silicon film is reduced as the pressure is reduced, in other words, as the vacuum is increased. The fluorine concentration, nitrogen concentration, oxygen concentration, and carbon concentration in the film show almost no change when the pressure is reduced.

Experiment 3

An amorphous silicon film formed by plasma CVD from monosilane, argon, and nitrogen as material gas will be described in the following Experiments 3 through 5.

Figure 17:
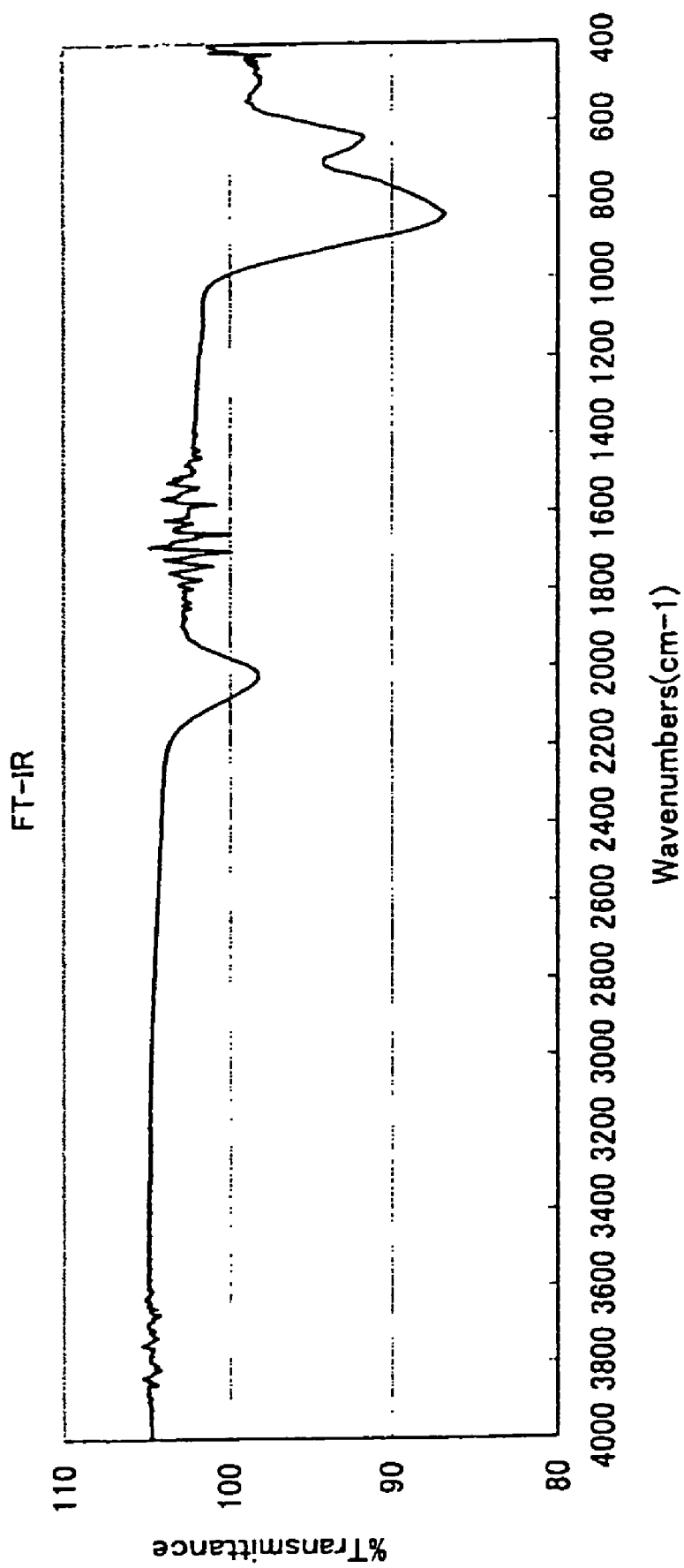
FIG. 17 is a diagram showing spectroscopic data by FT-IR.

An amorphous silicon film is formed using monosilane, argon, and nitrogen as material gas. The spectroscopic data on this film by Fourier transform infrared spectroscopy (FT-IR) are shown in FIG. 17. In FIG. 17, the Si—Si bond peaks at a wave number of 656/cm, the Si—N bond peaks at a wave number of 852/cm, and there is a peak at a wave number of 2030/cm. Since it is said that the Si—H bond peaks at a wave number of 2000/cm whereas the Si—H$_2$ bond peaks at a wave number of 2100/cm, the peak at a wave number of 2030 /cm in FIG. 17 is mainly of Si—H bond and minutely for Si—H$_2$ bond in the film. Compared to the amorphous silicon film formed from monosilane, argon, and hydrogen and shown in FIG. 12, the amorphous silicon film formed from monosilane, argon, and nitrogen has slightly more Si—H$_2$ bonds. This film is also characterized in that no N—H bond peak is found and the index of refraction is 3.0 to 4.0.

Next, the argon concentration and nitrogen concentration are examined for an amorphous silicon film formed on a semiconductor substrate from monosilane, argon, and nitrogen as material gas.

First, the semiconductor substrate is transferred into a chamber and heated and kept at 300° C. The pressure in the chamber is adjusted by an exhaust system and set at 66.65 Pa (0.5 Torr). Then SiH$_4$ gas is introduced from a gas introducing system into the chamber at a flow rate of 100 sccm and a high frequency power supply discharges at a discharge frequency of 27.12 MHz and an RF power of 20 W (RF power density: 0.033 W/cm$^2$, electrode area: 600 cm$^2$) to form a first amorphous silicon film by plasma CVD. The first amorphous silicon film is the reference.

Next, a second amorphous silicon film with a thickness of 200 nm is laid on the first amorphous silicon film. The second amorphous silicon film is formed by plasma CVD after keeping the temperature at 300° C. and adjusting the pressure in the chamber by the exhaust system to set it to 5.332 Pa (0.04 Torr). During the plasma CVD, SiH$_4$ gas, argon gas, and nitrogen gas are introduced at a flow rate of 100 sccm, 100 sccm, and 80 sccm, respectively, into the chamber from a gas introducing system, and a high frequency power supply discharges at a discharge frequency of 27.12 MHz and an RF power of 20 W (RF power density: 0.033 W/cm$^2$).

Next, a third amorphous silicon film with a film thickness of 200 nm is laminated on the second amorphous silicon film. The third amorphous silicon film is formed by plasma CVD after keeping the temperature at 300° C. and adjusting the pressure in the chamber by the exhaust system to set it to 4 Pa (0.03 Torr). During the plasma CVD, SiH$_4$ gas, argon gas, and nitrogen gas are introduced at a flow rate of 100 sccm, 50 sccm, and 40 sccm, respectively, into the chamber from a gas introducing system, and a high frequency power supply discharges at a discharge frequency of 27.12 MHz and an RF power of 20 W (RF power density: 0.033 W/cm$^2$).

Next, a fourth amorphous silicon film with a film thickness of 200 nm is laminated on the third amorphous silicon film. The fourth amorphous silicon film is formed by plasma CVD after keeping the temperature at 300° C. and adjusting the pressure in the chamber by the exhaust system to set it to 2.666 Pa (0.02 Torr). During the plasma CVD, SiH$_4$ gas, argon gas, and nitrogen gas are introduced at a flow rate of 50 sccm, 25 sccm, and 20 sccm, respectively, into the chamber from a gas introducing system, and a high frequency power supply discharge at a discharge frequency of 27.12 MHz and an RF power of 20 W (RF power density: 0.033 W/cm$^2$) is performed to form the first amorphous silicon film having a thickness of 200 nm on the semiconductor substrate.

A fifth amorphous silicon film with a film thickness of 200 nm is laminated on the fourth amorphous silicon film. The fifth amorphous silicon film is formed under the same conditions as the first amorphous silicon film.

Figure 18A:
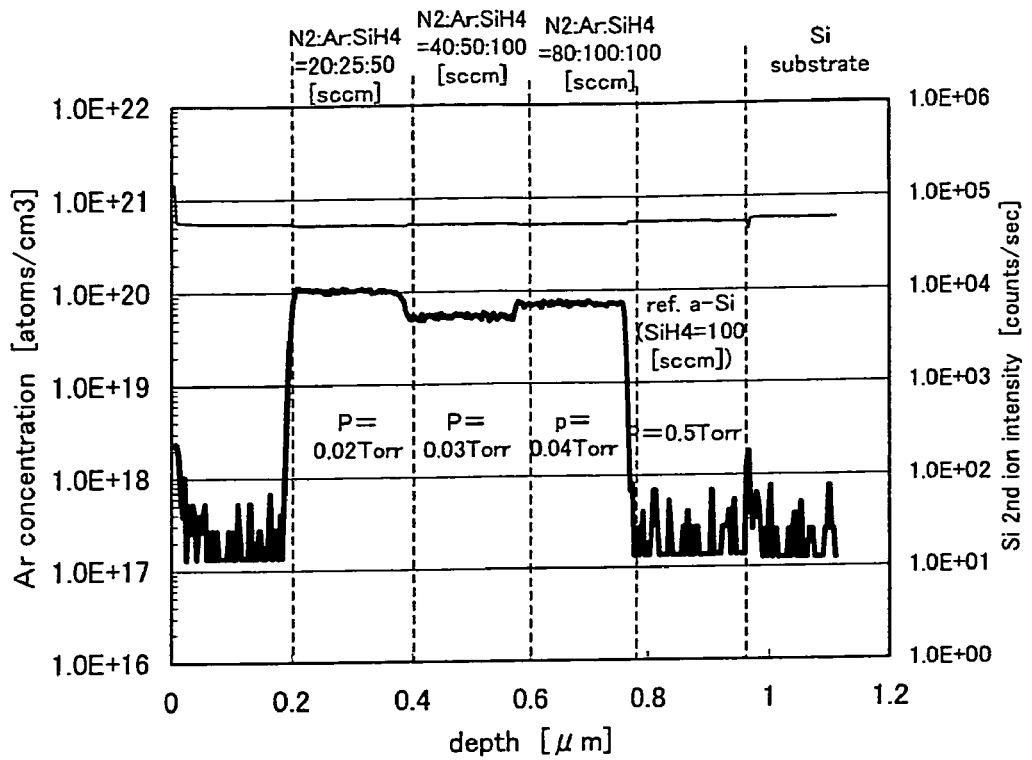
FIGS. 18A and 18B are a diagram of SIMS data showing the argon concentration and a diagram of SIMS data showing the fluorine concentration, respectively (Experiment 3)
Figure 18B:
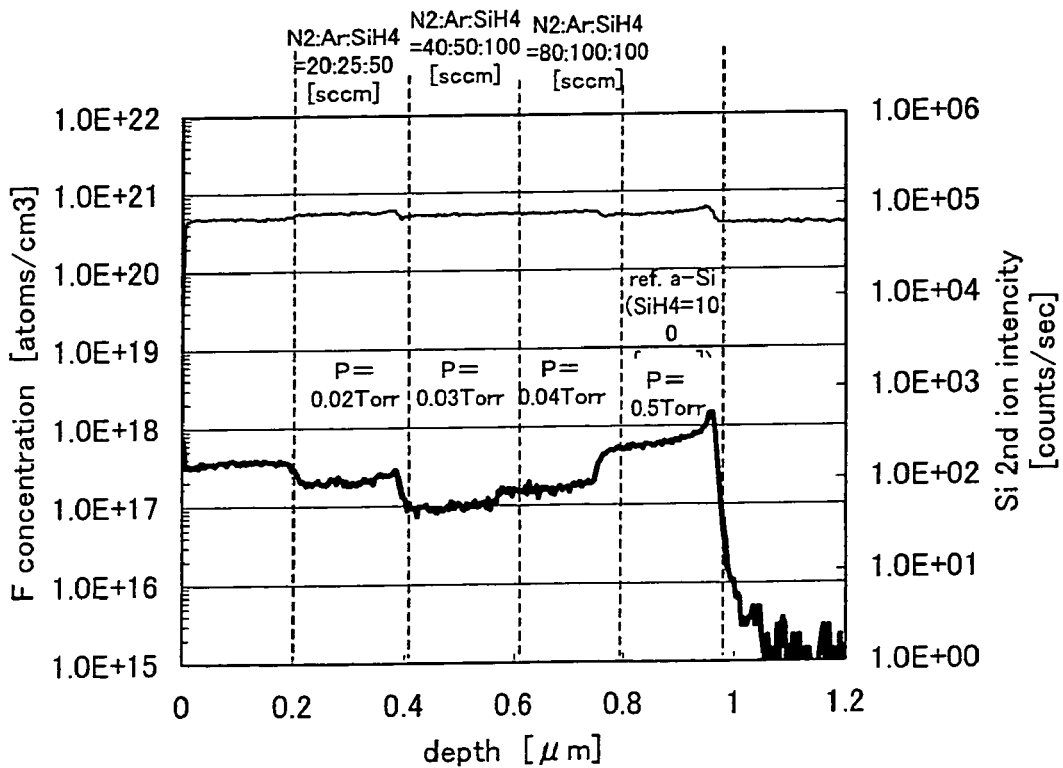
Figure 19A:
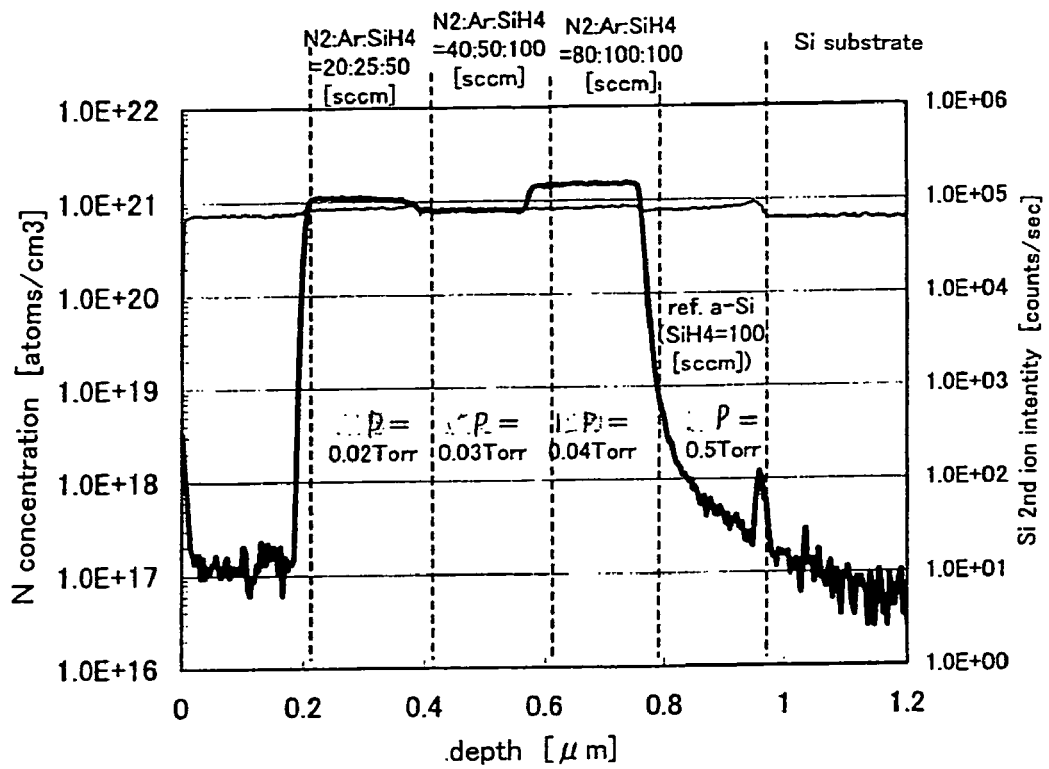
FIGS. 19A and 19B are a diagram of SIMS data showing the nitrogen concentration and a diagram of SIMS data showing the oxygen concentration, respectively (Experiment 3)
Figure 19B:
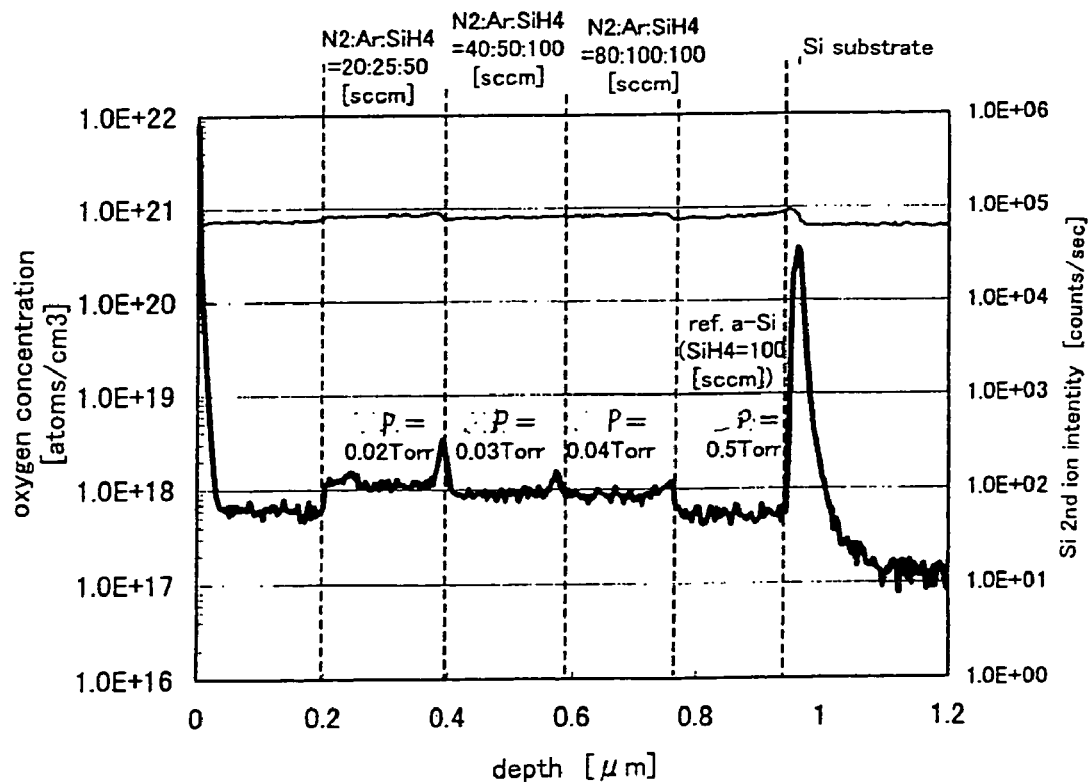

The laminate thus formed on the semiconductor substrate is analyzed by SIMS to measure the argon concentration, fluorine concentration, nitrogen concentration, and oxygen concentration in the laminate. The results of measuring the argon concentration are shown in FIG. 18A, the fluorine concentration in FIG. 18B, the nitrogen concentration in FIG. 19A, and the oxygen concentration in FIG. 19B. It reads from FIG. 18B that the fluorine concentration in the laminate is about $8\times10^{17}$ to $2\times10^{18}/cm^3$. It reads from FIG. 19B that the oxygen concentration in the laminate is about $4\times10^{17}$ to $3\times10^{18}/cm^3$. Though not shown in the drawings, the carbon concentration in the laminate is $1\times10^{16}$ to $5\times10^{17}/cm^3$.

As FIGS. 18A to 19B clearly show, the argon concentration in an amorphous silicon film is increased up to $1\times10^{20}$ to $1\times10^{21}/cm^3$ by using nitrogen, argon, and monosilane gas as material gas. Accordingly, an amorphous silicon film containing a high concentration of argon, specifically, $1\times10^{20}$ to $1\times10^{21}/cm^3$, can be formed by plasma CVD using nitrogen, argon, and monosilane gas as material gas. On the other hand, when monosilane and argon gas alone are used as material gas, the argon concentration in the obtained film is merely around $1\times10^{18}/cm^3$, namely, about $5\times10^{17}$ to $2\times10^{18}/cm^3$.

The use of nitrogen, argon, and monosilane gas as material gas also increases the nitrogen concentration in the amorphous silicon film to $1\times10^{20}$ to $10\times1^{21}/cm^3$. Nitrogen and argon are gas relatively inert and inexpensive, and therefore are suitable for industrial use.

Experiment 4

The dependency of the argon concentration and nitrogen concentration in an amorphous silicon film on the RF power density is examined next by using plasma CVD and varying the RF power density condition.

First, the same conditions as Experiment 3 are employed to form a first amorphous silicon film that serves as the reference on a semiconductor substrate by plasma CVD.

Next, a second amorphous silicon film with a thickness of 200 nm is laid on the first amorphous silicon film. The second amorphous silicon film is formed by plasma CVD after keeping the temperature at 300° C. and adjusting the pressure in the chamber by an exhaust system to set it to 26.66 Pa (0.2 Torr). During the plasma CVD, SiH$_4$ gas, argon gas, and nitrogen gas are introduced at a flow rate of 100 sccm, 500 sccm, and 200 sccm, respectively into the chamber from a gas introducing system, and a high frequency power supply discharges at a discharge frequency of 27.12 MHz and an RF power of 20 W (RF power density: 0.033 W/cm$^2$).

Next, the RF power condition alone is changed to form on the second amorphous silicon film a third amorphous silicon film (RF power density: 0.166 W/cm$^2$), a fourth amorphous silicon film (RF power density: 0.333 W/cm$^2$), and a fifth amorphous silicon film (RF power density: 0.5 W/cm$^2$) in order.

Figure 20A:
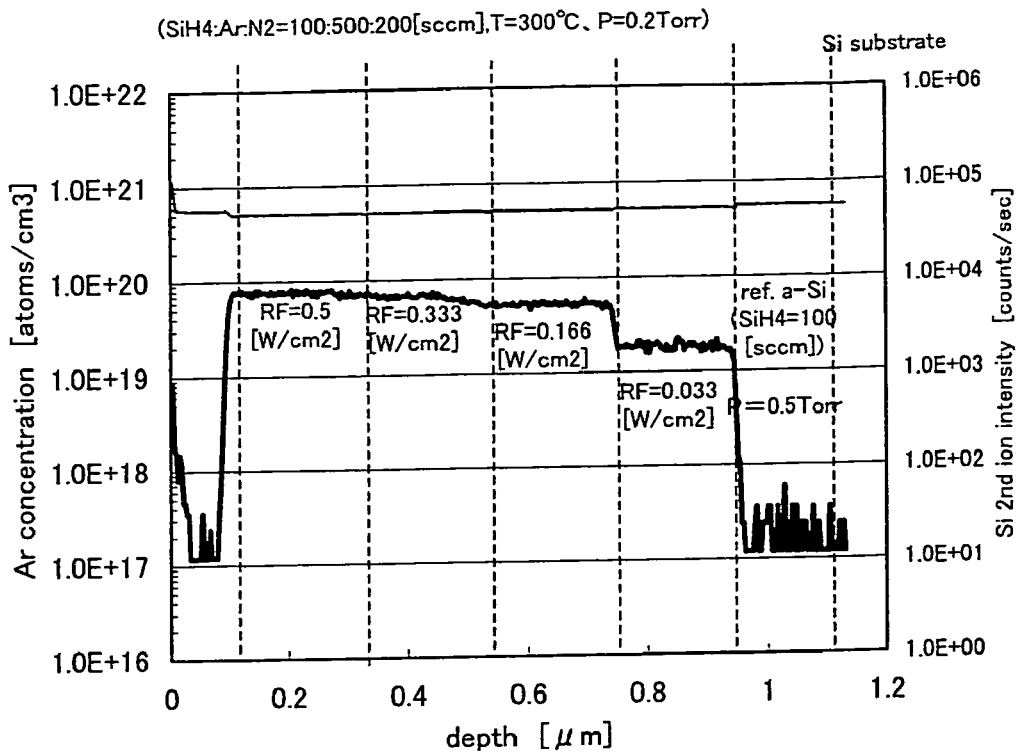
FIGS. 20A and 20B are a diagram of SIMS data showing the argon concentration and a diagram of SIMS data showing the fluorine concentration (RF power dependency), respectively (Experiment 4)
Figure 20B:
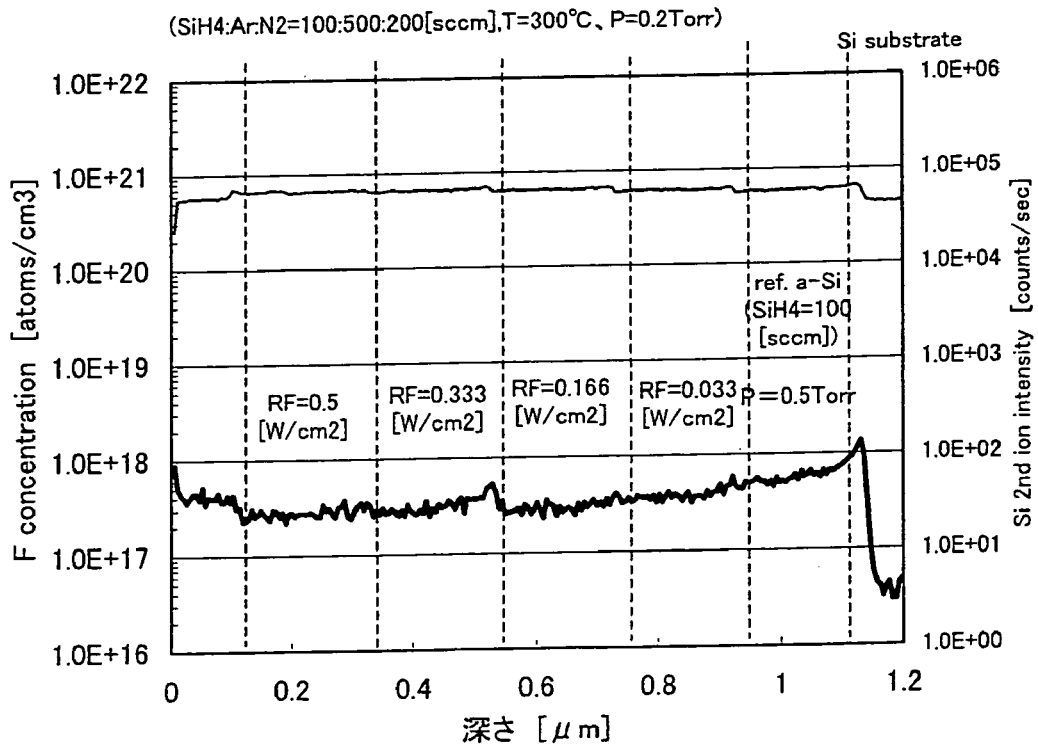
Figure 21A:
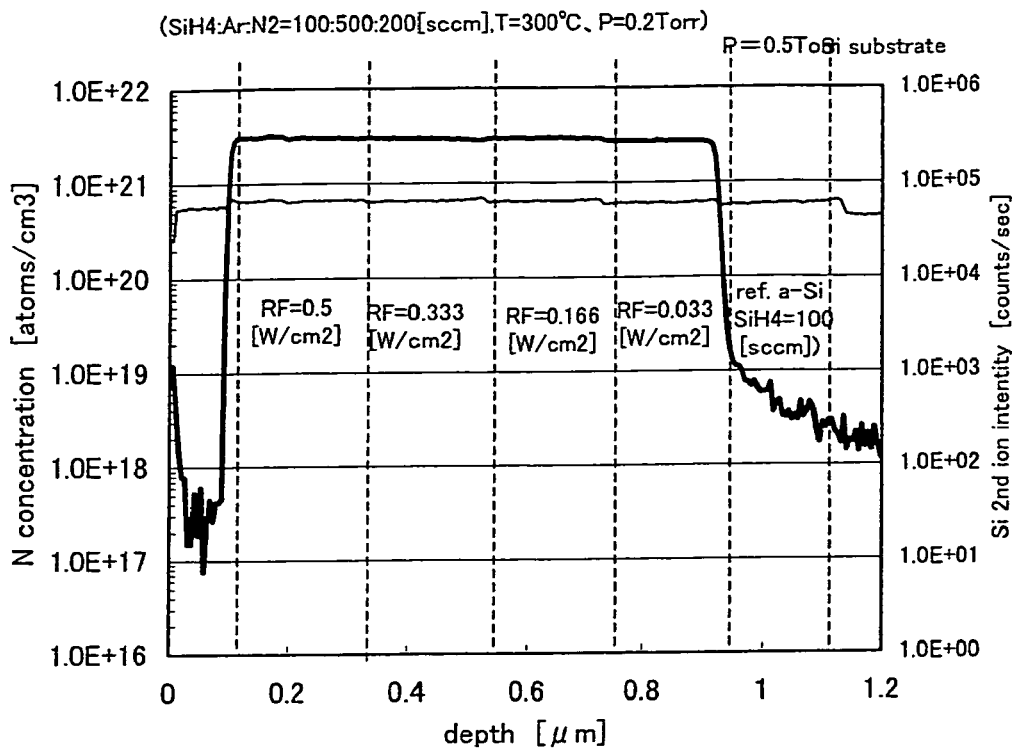
FIGS. 21A and 21B are a diagram of SIMS data showing the nitrogen concentration and a diagram of SIMS data showing the oxygen concentration, respectively (Experiment 4)
Figure 21B:
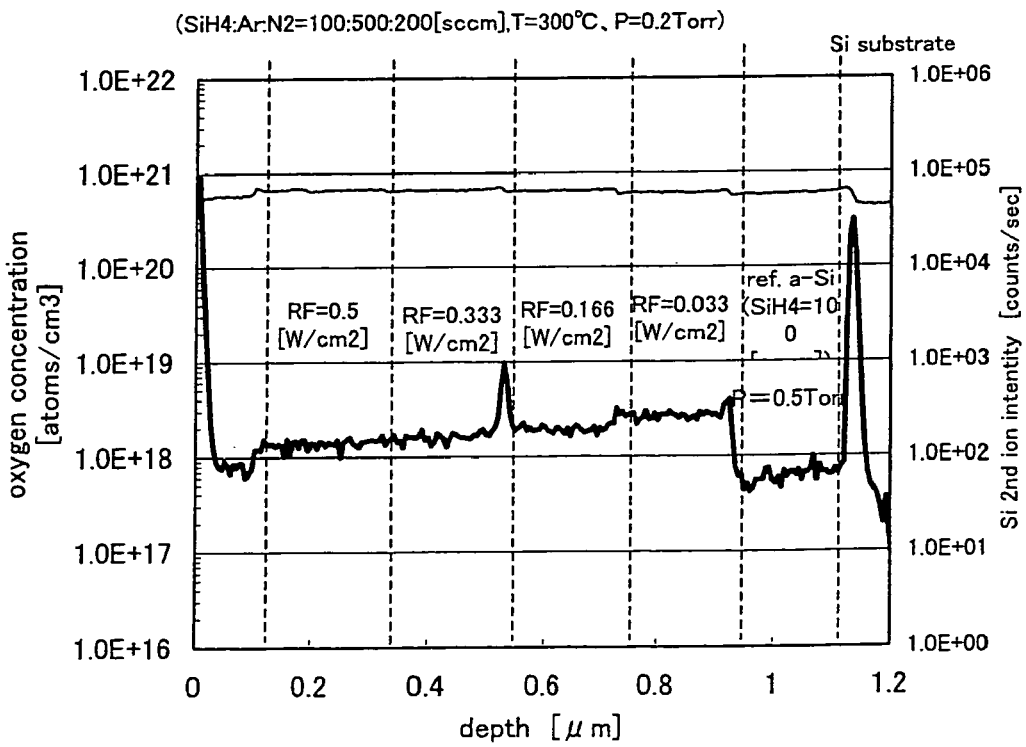

The laminate thus formed on the semiconductor substrate is analyzed by SIMS to measure the argon concentration, fluorine concentration, nitrogen concentration, and oxygen concentration in the laminate. The results of measuring the argon concentration are shown in FIG. 20A, the fluorine concentration in FIG. 20B, the nitrogen concentration in FIG. 21A, and the oxygen concentration in FIG. 21B. The carbon concentration in the laminate is $1 \times 10^{16}$ to $5 \times 10^{17}$/cm$^3$.

As FIGS. 20A to 21B clearly show, the argon concentration in the amorphous silicon film is raised as the RF power density is increased. The fluorine concentration, nitrogen concentration, oxygen concentration, and carbon concentration in the film show almost no change when the RF power density is increased.

Experiment 5

The dependency of the argon concentration and nitrogen concentration in an amorphous silicon film on the pressure in the chamber is examined by using plasma CVD and varying the inside-chamber pressure condition.

First, the same conditions as Experiment 3 are employed to form a first amorphous silicon film that serves as the reference on a semiconductor substrate by plasma CVD.

Next, a second amorphous silicon film with a thickness of 200 nm is laminated on the first amorphous silicon film. The second amorphous silicon film is formed by plasma CVD after keeping the temperature at 300° C. and adjusting the pressure in the chamber by an exhaust system to set it to 6.666 Pa (0.05 Torr). During the plasma CVD, SiH$_4$ gas, argon gas, and nitrogen gas are introduced at a flow rate of 50 sccm, 25 sccm, and 20 sccm, respectively, into the chamber from a gas introducing system, and a high frequency power supply discharges at a discharge frequency of 27.12 MHz and an RF power of 300 W (RF power density: 0.5 W/cm$^2$).

Next, the inside-chamber pressure condition alone is changed to form on the second amorphous silicon film a third amorphous silicon film (pressure: 5.332 Pa (0.04 Torr)), a fourth amorphous silicon film (pressure: 4 Pa (0.03 Torr)), and a fifth amorphous silicon film (pressure: 2.666 Pa (0.02 Torr)) in order.

Figure 22A:
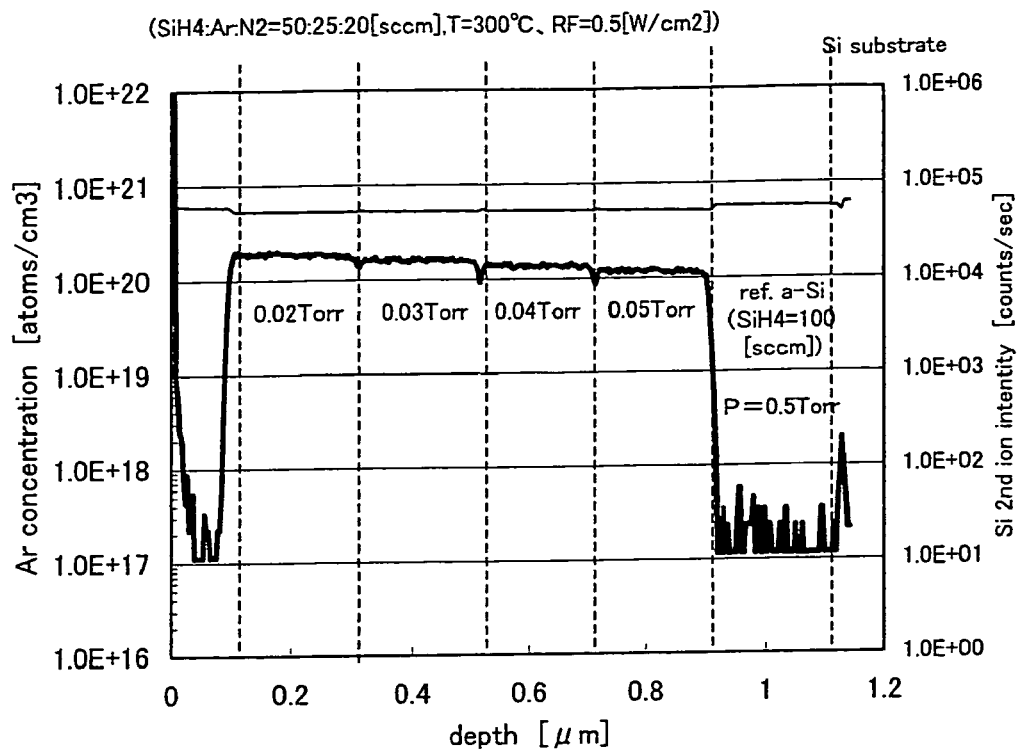
FIGS. 22A and 22B are diagrams of SIMS data showing the argon concentration (pressure dependency) (Experiment 5)
Figure 22B:
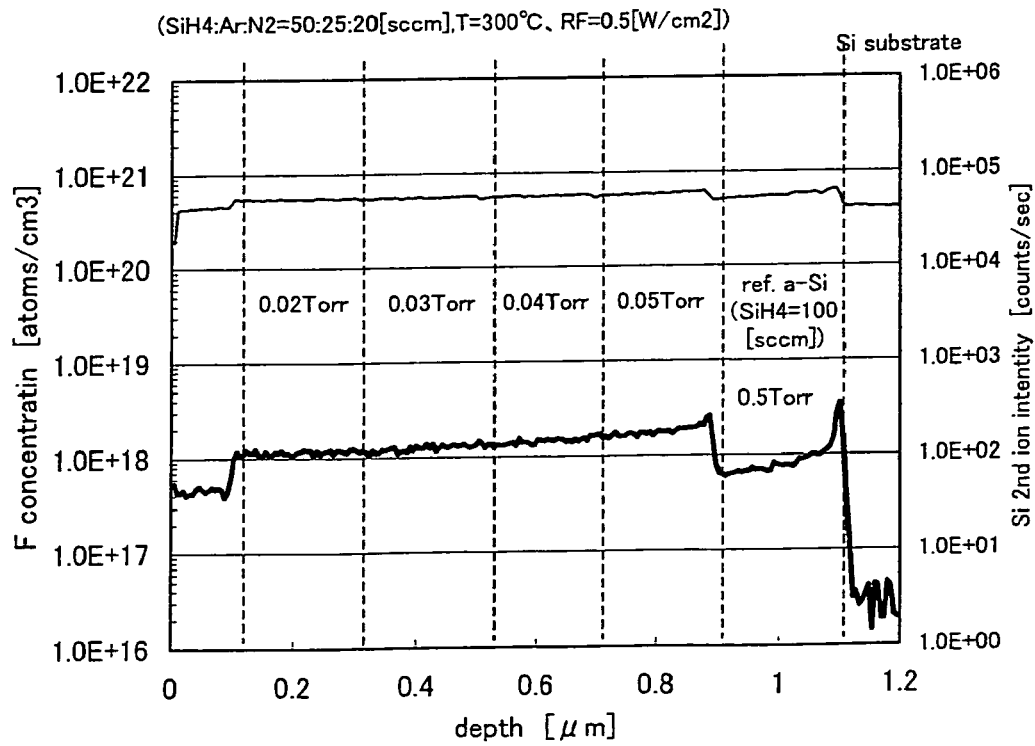
Figure 23A:
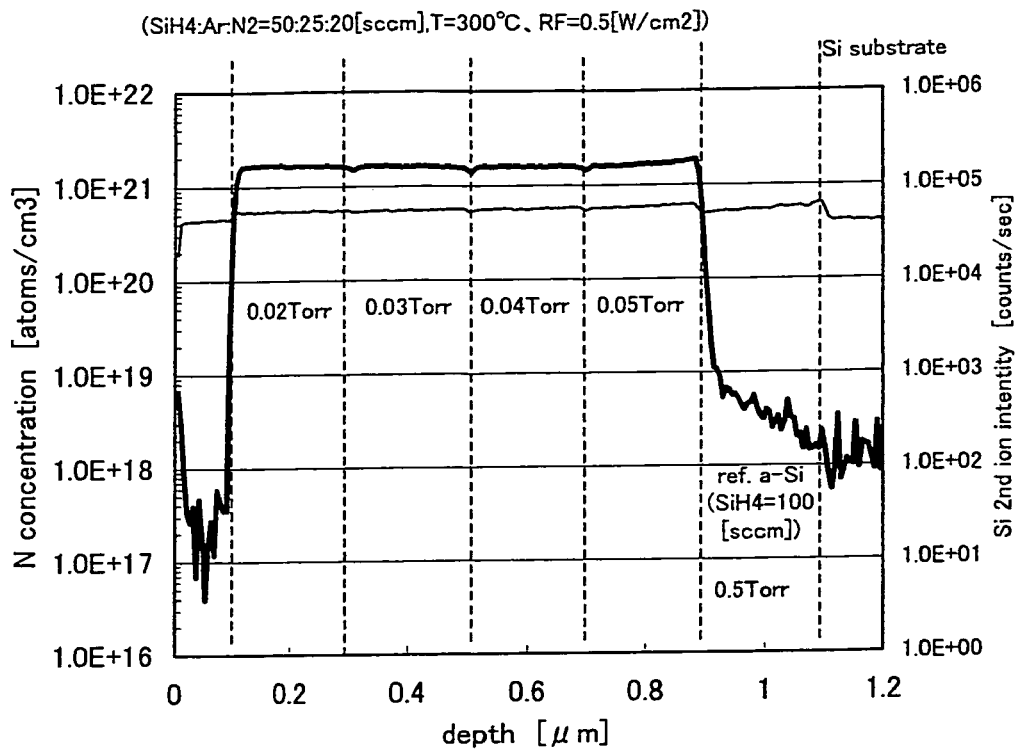
FIGS. 23A and 23B are a diagram of SIMS data showing the nitrogen concentration and a diagram of SIMS data showing the oxygen concentration, respectively (Experiment 5)
Figure 23B:
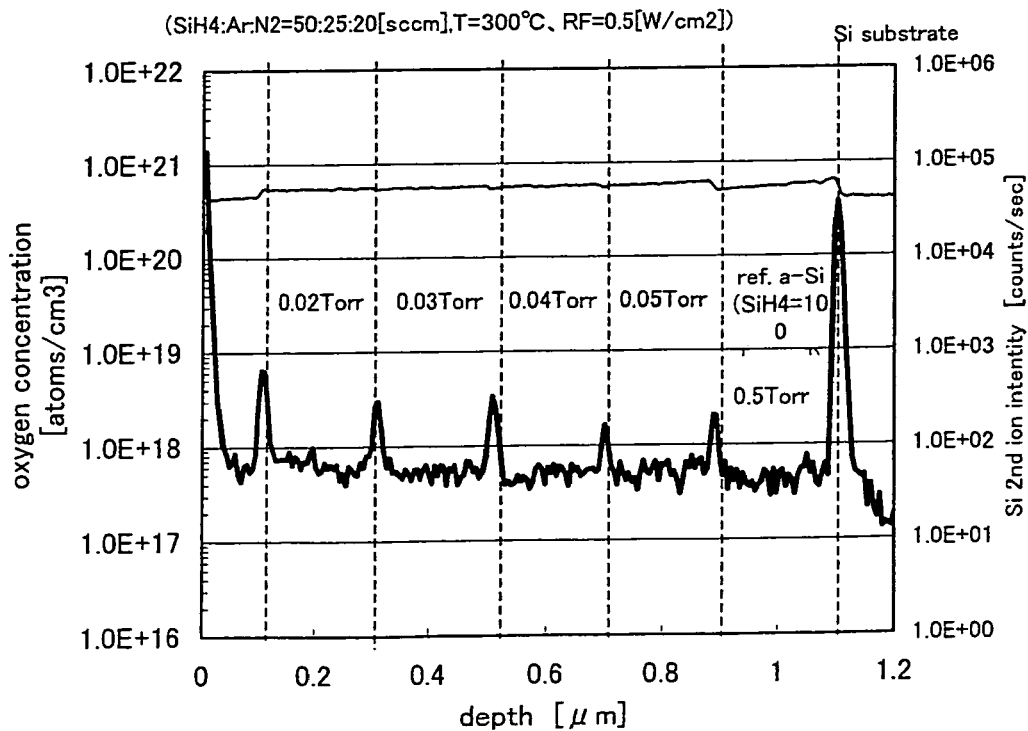

The laminate thus formed on the semiconductor substrate is analyzed by SIMS to measure the argon concentration, fluorine concentration, nitrogen concentration, and oxygen concentration in the laminate. The results of measuring the argon concentration are shown in FIG. 22A, the fluorine concentration in FIG. 22B, the nitrogen concentration in FIG. 23A, and the oxygen concentration in FIG. 23B. The carbon concentration in the laminate is $1 \times 10^{16}$ to $5 \times 10^{17}$/cm$^3$.

As FIGS. 22A to 23B clearly show, the argon concentration in the amorphous silicon film is increased as the pressure is reduced, in other words, as the vacuum is increased. The fluorine concentration, nitrogen concentration, oxygen concentration, and carbon concentration in the film show almost no change when the pressure is reduced.

Experiment 6

This experiment is for examining the etching rate of a first semiconductor film having a crystal structure, of a barrier layer, and of a second semiconductor film containing noble gas. The first semiconductor film is a polysilicon film. The barrier layer is a SiON film formed on the first semiconductor film by plasma CVD. The second semiconductor film is the amorphous silicon film of Experiments 1 and 2 or Experiments 3 through 5 and is formed on the barrier layer.

The experiment employs two types of etchants; one is a fluoric acid-based etchant (here, diluted fluoric acid) used to remove the barrier layer and the other is an alkaline etchant (here, TMAH) used to remove the second semiconductor film containing a noble gas element after gettering. The rate the films are etched by the etchants is measured and shown in Table

TABLE 1

| Thin film type | Etchant type | |
|---|---|---|
| (Film forming gas) | Diluted fluoric acid (HF) | TMAH (Alkaline) |
| a-Si film(SiH4/Ar/H2) | Not etched | 50 nm/1 min |
| a-Si film(SiH4/Ar/H2) | Not etched | 50 nm/10-20 min |
| SiON film(SiH4/N2O) | 5 nm/1-2 min | 50 nm/100 min |
| p-Si film | Not etched | 50 nm/20-30 sec |

As shown in Table 1, the amorphous silicon film formed from monosilane, argon, and hydrogen as material gas is etched by TMAH at a rate about ten times faster than the rate the amorphous silicon film formed from monosilane, argon, and nitrogen as material gas is etched by the etchant, and therefore has enough selective ratio to the barrier layer. In addition, the amorphous silicon film formed from monosilane, argon, and hydrogen as material gas can contain a larger amount of argon than the amorphous silicon film formed from monosilane, argon, and nitrogen as material gas as shown in Experiments 1 through 5, and therefore is optimum as a gettering site.

However, the adhesion of the amorphous silicon film formed from monosilane, argon, and hydrogen as material gas to the barrier layer is relatively weak and the film peels easily. Therefore it is desirable to form the film after a buffer layer is formed on the barrier layer. A desirable buffer layer is the amorphous silicon film formed from monosilane, argon, and nitrogen as material gas because the adhesion of this film to the barrier layer is relatively high and the film is not easily peeled off. The amorphous silicon film formed from monosilane, argon, and nitrogen as material gas is crystallized less than the amorphous silicon film formed from monosilane, argon, and hydrogen as material gas when heat-treated at a high temperature, and therefore is also suitable as a gettering site. The heat treatment time can be shortened more as the temperature of the heat treatment for gettering is raised higher. However, once the gettering site is crystallized, the gettering amount reaches saturation.

A SiON film formed by plasma CVD from monosilane (SiH$_4$) and nitrous oxide (N$_2$O) as material gas is suitable as an etching stopper, and can be used not only as the barrier layer (etching stopper) in the gettering step but also as an etching stopper and a mask in other TFT processes.

Figure 24:
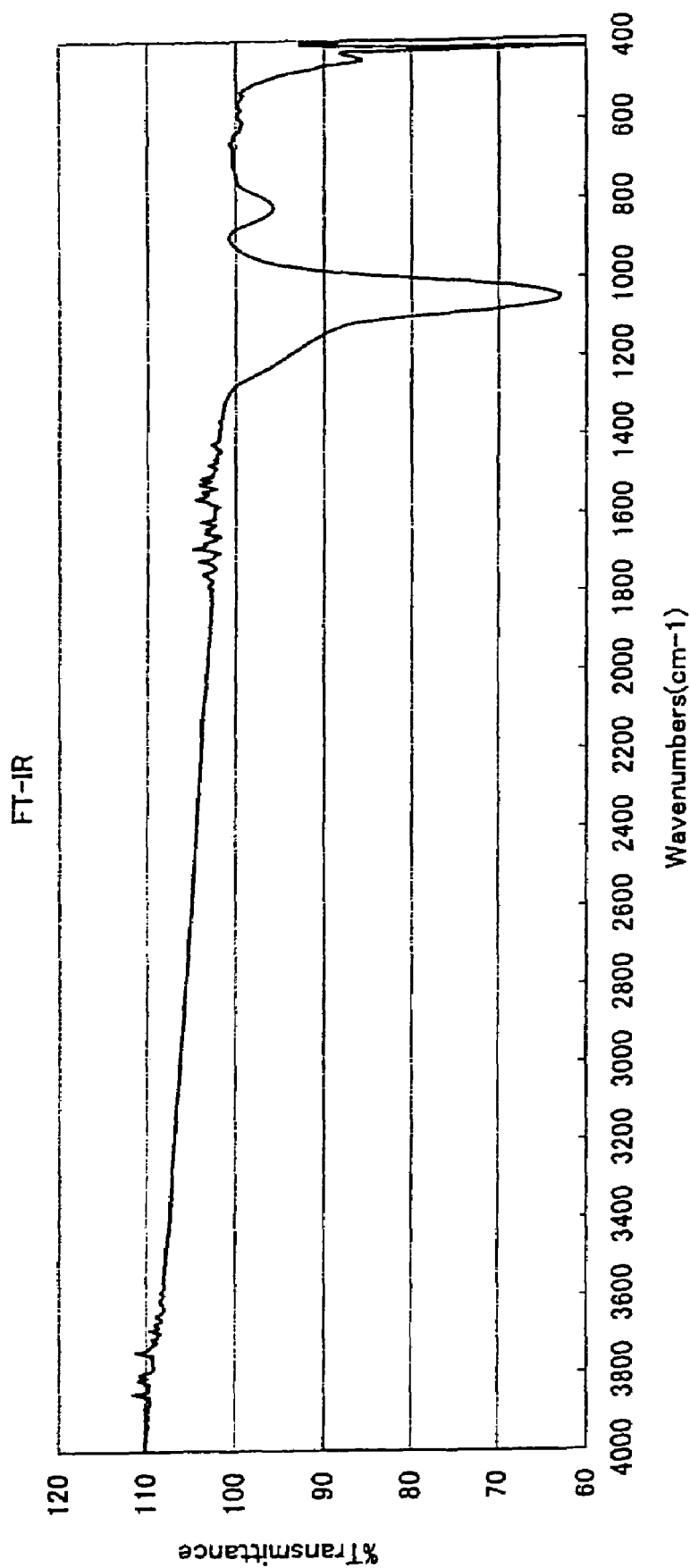
FIG. 24 is a diagram showing spectroscopic data by FT-IR.

The spectroscopic data on a SiON film formed by plasma CVD from monosilane (SiH$_4$) and nitrous oxide (N$_2$O) as material gas by Fourier transform infrared spectroscopy (FT-IR) are shown in FIG. 24. In FIG. 24, the Si—O bond peaks at a wave number of 1050/cm and the Si—H bond peaks at a wave number of 800 to 860/cm. Since it is said that the N—H bond peaks at a wave number of 1200/cm, it can be said that the SiON film is composed mainly of Si—O bonds.

The present invention structured as above will be described in more detail through the following embodiments.

Embodiment 1

An embodiment of the present invention is described with reference to FIGS. 4A to 6. Here, a method of simultaneously manufacturing a pixel portion and TFTs (n-channel TFTs and a p-channel TFT) of a driver circuit provided in the periphery of the pixel portion on the same substrate is described in detail.

First, a base insulating film 101 is formed on a substrate 100, and a first semiconductor film having a crystalline structure is obtained. Then, the semiconductor film is etched to have a desired shape to form semiconductor layers 102 to 106 separated from one another in an island shape.

A glass substrate (#1737) is used as the substrate 100. For the base insulating film 101, a silicon oxynitride film 101a formed from $SiH_4$, $NH_3$, and $N_2O$ as raw material gases (composition ratio: Si=32%, O=27%, N=24%, H=17%) is formed with a thickness of 50 nm (preferably 10 to 200 nm) and at a film deposition temperature of 400° C. by using plasma CVD method. Then, after the surface is cleaned with ozone water, an oxide film on the surface is removed by means of diluted hydrofluoric acid (dilution with 1/100). Next, a silicon oxynitride film 101b formed from $SiH_4$ and $N_2O$ as material gases (composition ratio: Si=32%, O=59%, N=7%, H=2%) is formed thereon with a thickness of 100 nm (preferably 50 to 200 nm) and at a film deposition temperature of 400° C. by using plasma CVD method to thereby form a lamination. Further, without exposure to an atmosphere, a semiconductor film having an amorphous structure (in this case, amorphous silicon film) is formed to have a thickness of 54 nm (preferably 25 to 80 nm) with $SiH_4$ as a film deposition gas and at a film deposition temperature of 300° C. by using plasma CVD method.

In this embodiment, the base film 101 is shown in a form of a two-layer structure, but a single layer of the insulating film or a structure in which two or more layers thereof are laminated may be adopted. Further, there is no limitation on the material of the semiconductor film. However, the semiconductor film may be preferably formed of silicon or silicon germanium ($Si_xGe_{1-x}$ (X=0.0001 to 0.02)) alloy by using a known means (sputtering method, LPCVD method, plasma CVD method, or the like). Further, plasma CVD apparatus may be a single wafer type one or a batch type one. In addition, the base insulating film and the semiconductor film may be continuously formed in the same film formation chamber without exposure to an atmosphere.

Subsequently, after the surface of the semiconductor film having an amorphous structure is cleaned, an extremely thin oxide film with a thickness of about 2 nm is formed from ozone water on the surface. Then, in order to control a threshold value of a TFT, doping of a minute amount of impurity element (boron or phosphorous) is performed. Here, an ion doping method is used in which diborane ($B_2H_6$) is plasma-excited without mass-separation, and boron is added to the amorphous silicon film under the doping conditions: an acceleration voltage of 15·kV; a gas flow rate of diborane diluted to 1% with hydrogen of 30 sccm; and a dosage of $2\times10^{12}/cm^2$.

Then, a nickel acetate salt solution containing nickel of 10 ppm in weight is applied using a spinner. Instead of the application, a method of spraying nickel elements to the entire surface by sputtering may also be used.

Then, heat treatment is conducted to perform crystallization, thereby forming a semiconductor film having a crystalline structure. A heating process using an electric furnace or irradiation of strong light may be conducted for this heat treatment. In case of the heating process using an electric furnace, it may be conducted at 500 to 650° C. for 4 to 24 hours. Here, after the heating process (500° C. for 1 hour) for dehydrogenation is conducted, the heating process (550° C. for 4 hours) for crystallization is conducted, thereby obtaining a silicon film having a crystalline structure. Note that, although crystallization is performed by using the heating process using a furnace, crystallization may be performed by means of a lamp annealing apparatus. Also, note that, although a crystallization technique using nickel as a metal element that promotes crystallization of silicon is used here, other known crystallization techniques, for example, a solid-phase growth method and a laser crystallization method, may be used.

Next, after the oxide film on the surface of the silicon film having a crystalline structure is removed by diluted hydrofluoric acid or the like, irradiation of laser light (XeCl: wavelength of 308 nm) for raising a crystallization rate and repairing defects remaining in crystal grains is performed in an atmosphere or in an oxygen atmosphere. Excimer laser light with a wavelength of 400 nm or less, or second harmonic wave or third harmonic wave of a YAG laser is used for the laser light. In any case, pulse laser light with a repetition frequency of approximately 10 to 1000 Hz is used, the pulse laser light is condensed to 100 to 500 $mJ/cm^2$ by an optical system, and irradiation is performed with an overlap ratio of 90 to 95%, whereby the silicon film surface may be scanned. Here, the irradiation of the first laser light is performed in an atmosphere with a repetition frequency of 30 Hz and energy density of 393 $mJ/cm^2$. Note that an oxide film is formed on the surface by the laser light irradiation since the irradiation is conducted in an atmosphere or in an oxygen atmosphere.

Next, after the oxide film formed by the first light irradiation is removed by diluted hydrofluoric acid, second laser light irradiation is performed in a nitrogen atmosphere or in a vacuum, thereby leveling the semiconductor film surface. Excimer laser light with a wavelength of 400 nm or less, or second harmonic wave or third harmonic wave of a YAG laser is used as the laser light (second laser light). The energy density of the second laser light is made larger than that of the first laser light, preferably made larger by 30 to 60 $mJ/cm^2$.

Next, a barrier layer composed of an oxide film including nitrogen with a thickness of 1 to 5 nm is formed by the plasma CVD method shown in above-mentioned Embodiment Mode 1. In this embodiment, the barrier layer is formed with a thickness of 2 nm by plasma CVD method using monosilane ($SiH_4$) and nitrogen dioxide ($N_2O$) as a raw material gas. Thus obtained barrier layer has high adhesiveness, and the barrier layer can pass a metal element so as to move to the gettering site if the barrier layer is in the range of the above-mentioned film thickness. Furthermore, the barrier layer is extremely effective as etching stopper since a second semiconductor film and a first semiconductor film, which are formed later, have high selectivity. Also, the adhesiveness may be enhanced by argon plasma processing which is performed before the formation of the barrier layer.

Next, an first amorphous silicon film containing argon element which becomes a lower layer of gettering site is formed with a thickness of 5 nm on the barrier layer by plasma CVD method shown in Embodiment Mode 1. The film deposition conditions with plasma CVD in this embodiment are: a substrate temperature of 300° C.; a film deposition pressure of 26.66 Pa (0.2 Torr); $SiH_4$ gas flow rate of 100 sccm; argon gas (Ar) flow rate of 500 sccm; and nitrogen gas flow rate of 200 sccm; are introduces from the gas installation system. As well as that, electric discharge is performed with electric discharge 27.12 MHz; an RF electric charge 300 W (RF power density 0.5 W/cm$^2$). Note that under the above conditions, the atomic concentration of the argon element contained in the first amorphous silicon film is $1\times10^{20}$/cm$^3$ to $1\times10^{21}$/cm$^3$. And the atomic concentration of the nitrogen contained in the first amorphous silicon film is $1\times10^{20}$/cm$^3$ to $1\times10^{21}$/cm$^3$. Also, the adhesiveness may be enhanced by argon plasma processing which is performed before the formation of the first amorphous silicon film containing argon element.

Next, an second amorphous silicon film containing argon element which becomes a upper layer of gettering site is formed with a thickness of 50 nm on the first amorphous silicon film by plasma CVD method shown in Embodiment Mode 1. The film deposition conditions with plasma CVD method in this embodiment are: a substrate temperature of 300° C.; a film deposition pressure of 26.66 Pa (0.2 Torr); SiH$_4$ gas flow rate of 100 sccm; argon gas (Ar) flow rate of 500 sccm; hydrogen gas of 200 sccm; are introduces from the gas installation system. As well as that, electric discharge is performed with electric discharge 27.12 MHz; an RF electric charge 300 W (RF power density 0.5 W/cm$^2$). Note that under the above conditions, the atomic concentration of the argon element contained in the second amorphous silicon film is $1\times10^{20}$/cm$^3$ to $1\times10^{21}$/cm$^3$.

Although the gettering site is formed in a lamination structure, the gettering can be conducted efficiently, the peeling off is not generated and it is difficult to crystallize even if heat treatment of gettering site is conducted since the barrier layer and the gettering site have high adhesiveness each other.

Thereafter, heat treatment at 650° C. for 3 minutes is conducted using the lamp annealing apparatus to perform gettering.

Subsequently, the amorphous silicon film containing the argon element, which is the gettering site, is selectively removed by alkali-based etchant (such as mAH) with the barrier layer as an etching stopper, and then, the barrier layer is selectively removed by diluted hydrofluoric acid. Note that there is a tendency that nickel is likely to move to a region with a high oxygen concentration in gettering, and thus, it is desirable that the barrier layer comprised of the oxide film including nitrogen is removed after gettering.

Then, after a thin oxide film is formed from ozone water on the surface of the obtained silicon film having a crystalline structure (also referred to as polysilicon film), a mask made of resist is formed, and an etching process is conducted thereto to obtain a desired shape, thereby forming the island-like semiconductor layers 102 to 106 separated from one another. After the formation of the semiconductor layers, the mask made of resist is removed.

Then, the oxide film is removed with the etchant containing hydrofluoric acid, and at the same time, the surface of the silicon film is cleaned. Thereafter, an insulating film containing silicon as its main constituent, which becomes a gate insulating film 107, is formed. In this embodiment, a silicon oxynitride film (composition ratio: Si=32%, O=59%, N=7%, H=2%) is formed with a thickness of 115 nm by plasma CVD.

Next, as shown in FIG. 4A, on the gate insulating film 107, a first conductive film 108a with a thickness of 20 to 100 nm and a second conductive film 108b with a thickness of 100 to 400 nm are formed in lamination. In this embodiment, a 50 nm thick tantalum nitride film and a 370 nm thick tungsten film are sequentially laminated on the gate insulating film 107.

As a conductive material for forming the first conductive film and the second conductive film, an element selected from the group consisting of Ta, W, Ti, Mo, Al and Cu, or an alloy material or compound material containing the above element as its main constituent is employed. Further, a semiconductor film typified by a polycrystalline silicon film doped with an impurity element such as phosphorous, or an AgPdCu alloy may be used as the first conductive film and the second conductive film. Further, the present invention is not limited to a two-layer structure. For example, a three-layer structure may be adopted in which a 50 nm thick tungsten film, an alloy film of aluminum and silicon (Al—Si) with a thickness of 500 nm, and a 30 nm thick titanium nitride film are sequentially laminated. Moreover, in case of a three-layer structure, tungsten nitride may be used in place of tungsten of the first conductive film, an alloy film of aluminum and titanium (Al—Ti) may be used in place of the alloy film of aluminum and silicon (Al—Si) of the second conductive film, and a titanium film may be used in place of the titanium nitride film of the third conductive film. In addition, a single layer structure may also be adopted.

Next, as shown in FIG. 4B, masks 110 to 115 are formed by an exposure step, and a first etching process for forming gate electrodes and wirings is performed. The first etching process is performed with first and second etching conditions. An ICP (inductively coupled plasma) etching method may be preferably used for the etching process. The ICP etching method is used, and the etching conditions (an electric energy applied to a coil-shape electrode, an electric energy applied to an electrode on a substrate side, a temperature of the electrode on the substrate side, and the like) are appropriately adjusted, whereby a film can be etched to have a desired taper shape. Note that chlorine-based gases typified by Cl$_2$, BCl$_3$, SiCl$_4$, CCl$_4$, and the like fluorine-based gases typified by CF$_4$, SF$_6$, NF$_3$ and the like, and O$_2$ can be appropriately used as etching gases.

In this embodiment, RF (13.56 MHz) power of 150 W is applied also to the substrate (sample stage) to substantially apply a negative self-bias voltage. The electrode area to the substrate side is 12.5 cm×12.5 cm, and the coil-shape electrode area (quartz disc formed coil is described here) is 25 cm diameter disc. The W film is etched so as to make end portions of the first conductive layer in taper shape in the first etching conditions. Under the first etching conditions, an etching rate to W is 200.39 nm/min, an etching rate to TaN is 80.32 nm/min, and a selection ratio of W to TaN is about 2.5. Further, with the first etching conditions, a taper angle of W is approximately 26°. Thereafter, the first etching conditions are changed to the second etching conditions without removing the masks 110 to 115 made of resist. CF$_4$ and Cl$_2$ are used as etching gases, the flow rate of the gases is set to 30/30 sccm, and RF (13.56 MHz) power of 500 W is applied to a coil-shape electrode with a pressure of 1 Pa to generate plasma, thereby performing etching for about 30 seconds. RF (13.56 MHz) power of 20 W is also applied to the substrate side (sample stage) to substantially apply a negative self-bias voltage. Under the second etching conditions in which CF$_4$ and Cl$_2$ are mixed, both the W film and the TaN film are etched at the same level. With the second etching conditions, an etching rate to W is 58.97 nm/min, and an etching rate to TaN is 66.43 nm/min. Note that an etching time may be increased by 10 to 20% in order to conduct etching without remaining residue on the gate insulating film.

In the first etching process as described above, the shape of the mask made of resist is made appropriate, whereby the end portion of the first conductive layer and the end portion of the second conductive layer each have a tapered shape due to the effect of the bias voltage applied to the substrate side. The angle of the tapered portion is sufficiently set to 15° to 45°.

Thus, first shape conductive layers 117 to 121 composed of the first conductive layer and the second conductive layer (first conductive layers 117a to 121a and second conductive layers 117b to 121b) are formed by the first etching process. The insulating film 107 that becomes the gate insulating film is etched by approximately 10 to 20 nm, and becomes a gate insulating film 116 in which regions which are not covered by the first shape conductive layers 117 to 121 are thinned.

Next, a second etching process is conducted without removing the masks made of resist. Here, $SF_6$, $Cl_2$ and $O_2$ are used as etching gases, the flow rate of the gases is set to 24/12/24 sccm, and RF (13.56 MHz) power of 700 W is applied to a coil-shape electrode with a pressure of 1.3 Pa to generate plasma, thereby performing etching for 25 seconds. RF (13.56 MHz) power of 10 W is also applied to the substrate side (sample stage) to substantially apply a negative self-bias voltage. In the second etching process, an etching rate to W is 227.3 nm/min, an etching rate to TaN is 32.1 nm/min, a selection ratio of W to TaN is 7.1, an etching rate to SiON that is the insulating film 116 is 33.7 nm/min, and a selection ration of W to SiON is 6.83. In the case where $SF_6$ is used as the etching gas, the selection ratio with respect to the insulating film 116 is high as described above. Thus, reduction in the film thickness can be suppressed. In this embodiment, the film thickness of the insulating film 116 is reduced by only about 8 nm.

By the second etching process, the taper angle of W becomes 70°. By the second etching process, second conductive layers 124b to 129b are formed. On the other hand, the first conductive layers are hardly etched to become first conductive layers 124a to 129a. Note that the first conductive layers 124a to 129a have substantially the same size as the first conductive layers 117a to 121a. In actuality, the width of the first conductive layer may be reduced by approximately 0.3 μm, namely, approximately 0.6 μm in the total line width in comparison with before the second etching process. There is almost no change in size of the taper of the first conductive layer.

Further, in the case where, instead of the two-layer structure, the three-layer structure is adopted in which a 50 nm thick tungsten film, an alloy film of aluminum and silicon (Al—Si) with a thickness of 500 nm, and a 30 nm thick titanium nitride film are sequentially laminated, under the first etching conditions of the first etching process in which: $BCl_3$, $Cl_2$ and $O_2$ are used as raw material gases; the flow rate of the gases is set to 65/10/5 (sccm); RF (13.56 MHz) power of 300 W is applied to the substrate side (sample stage); and RF (13.56 MHz) power of 450 W is applied to a coil-shape electrode with a pressure of 1.2 Pa to generate plasma, etching is performed for 117 seconds. As to the second etching conditions of the first etching process, $CF_4$, $Cl_2$ and $O_2$ are used, the flow rage of the gases is set to 25/25/10 sccm, RF (13.56MHz) power of 20 W is also applied to the substrate side (sample stage); and RF (13.56 MHz) power of 500 W is applied to a coil-shape electrode with a pressure of 1 Pa to generate plasma. With the above conditions, it is sufficient that etching is performed for about 30 seconds. In the second etching process, $BCl_3$ and $Cl_2$ are used, the flow rate of the gases are set to 20/60 sccm, RF (13.56 MHz) power of 100 W is applied to the substrate side (sample stage), and RF (13.56 MHz) power of 600 W is applied to a coil-shape electrode with a pressure of 1.2 Pa to generate plasma, thereby performing etching.

Next, the masks made of resist are removed, and then, a first doping process is conducted to obtain the state of FIG. 4D. The doping process may be conducted by ion doping or ion implantation. Ion doping is conducted with the conditions of a dosage of $1.5 \times 10^{14}$ atoms/cm$^2$ and an accelerating voltage of 60 to 100 keV. As an impurity element imparting n-type conductivity, phosphorous (P) or arsenic (As) is typically used. In this case, first conductive layers and second conductive layers 124 to 128 become masks against the impurity element imparting n-type conductivity, and first impurity regions 130 to 134 are formed in a self-aligning manner. The impurity element imparting n-type conductivity is added to the first impurity regions 130 to 134 in a concentration range of $1 \times 10^{16}$ to $1 \times 10^{17}$/cm$^3$. Here, the region having the same concentration range as the first impurity region is also called an n⁻ region.

Note that although the first doping process is performed after the removal of the masks made of resist in this embodiment, the first doping process may be performed without removing the masks made of resist.

Figures 5A, 5B, 5C:
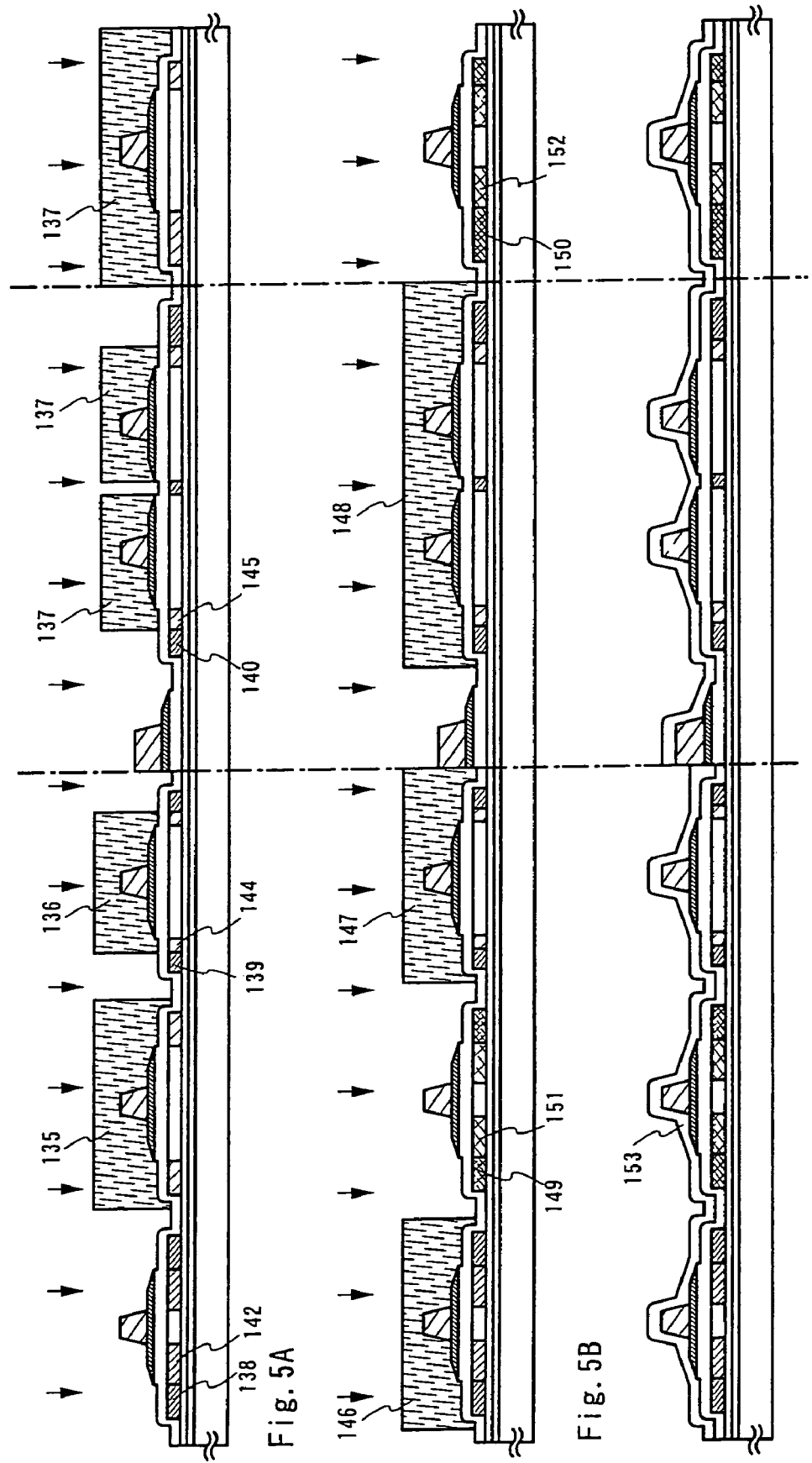
FIGS. 5A to 5C are diagrams showing a process of manufacturing an AM-LCD.

Subsequently, as shown in FIG. 5A, masks 135 to 137 made of resist are formed, and a second doping process is conducted. The mask 135 is a mask for protecting a channel forming region and a periphery thereof of a semiconductor layer forming a p-channel TFT of a driver circuit, the mask 136 is a mask for protecting a channel forming region and a periphery thereof of a semiconductor layer forming one of n-channel TFTs of the driver circuit, and the mask 137 is a mask for protecting a channel forming region, a periphery thereof, and a storage capacitor of a semiconductor layer forming a TFT of a pixel portion.

With the ion doping conditions in the second doping process: a dosage of $1.5 \times 10^{15}$ atoms/cm$^2$; and an accelerating voltage of 60 to 100 keV, phosphorous (P) is doped. Here, impurity regions are formed in the respective semiconductor layers in a self-aligning manner with the second conductive layers 124b to 126b as masks. Of course, phosphorous is not added to the regions covered by the masks 135 to 137. Thus, second impurity regions 138 to 140 and a third impurity region 142 are formed. The impurity element imparting n-type conductivity is added to the second impurity regions 138 to 140 in a concentration range of $1 \times 10^{20}$ to $1 \times 10^{21}$/cm$^3$. Here, the region having the same concentration range as the second impurity region is also called an n⁺ region.

Further, the third impurity region is formed at a lower concentration than that in the second impurity region by the first conductive layer, and is added with the impurity element imparting n-type conductivity in a concentration range of $1 \times 10^{18}$ to $1 \times 10^{19}$/cm$^3$. Note that since doping is conducted by passing the portion of the first conductive layer having a tapered shape, the third impurity region has a concentration gradient in which an impurity concentration increases toward the end portion of the tapered portion. Here, the region having the same concentration range as the third impurity region is called an n⁻ region. Furthermore, the regions covered by the masks 136 and 137 are not added with the impurity element in the second doping process, and become first impurity regions 144 and 145.

Next, after the masks 135 to 137 made of resist are removed, masks 146 to 148 made of resist are newly formed, and a third doping process is conducted as shown in FIG. 5B.

In the driver circuit, by the third doping process as described above, fourth impurity regions 149, 150 and fifth impurity regions 151, 152 are formed in which an impurity element imparting p-type conductivity is added to the semiconductor layer forming the p-channel TFT and to the semiconductor layer forming the storage capacitor.

Further, the impurity element imparting p-type conductivity is added to the fourth impurity regions 149 and 150 in a concentration range of $1\times10^{20}$ to $1\times10^{21}/cm^3$. Note that, in the fourth impurity regions 149, 150, phosphorous (P) has been added in the preceding step (n⁻ region), but the impurity element imparting p-type conductivity is added at a concentration that is 1.5 to 3 times as high as that of phosphorous. Thus, the fourth impurity regions 149, 150 have a p-type conductivity. Here, the region having the same concentration range as the fourth impurity region is also called a p⁺ region.

Further, fifth impurity regions 151 and 152 are formed in regions overlapping the tapered portion of the second conductive layer 125a, and are added with the impurity element imparting p-type conductivity in a concentration range of $1\times10^{18}$ to $1\times10^{20}/cm^3$. Here, the region having the same concentration range as the fifth impurity region is also called a p⁻ region.

Through the above-described steps, the impurity regions having n-type or p-type conductivity are formed in the respective semiconductor layers. The conductive layers 124 to 127 become gate electrodes of a TFT. Further, the conductive layer 128 becomes one of electrodes, which forms the storage capacitor in the pixel portion. Moreover, the conductive layer 129 forms a source wiring in the pixel portion.

Next, an insulating film (not shown) that covers substantially the entire surface is formed. In this embodiment, a 50 nm thick silicon oxide film is formed by plasma CVD. Of course, the insulating film is not limited to a silicon oxide film, and other insulating films containing silicon may be used in a single layer or a lamination structure.

Then, a step of activating the impurity element added to the respective semiconductor layers is conducted. In this activation step, a rapid thermal annealing (RTA) method using a lamp light source, a method of irradiating light emitted from a YAG laser or excimer laser from the back surface, heat treatment using a furnace, or a combination thereof is employed.

Further, although an example in which the insulating film is formed before the activation is shown in this embodiment, a step of forming the insulating film may be conducted after the activation is conducted.

Next, a first interlayer insulating film 153 is formed of a silicon nitride film, and heat treatment (300 to 550° C. for 1 to 12 hours) is performed, thereby conducting a step of hydrogenating the semiconductor layers. (FIG. 5C) This step is a step of terminating dangling bonds of the semiconductor layers by hydrogen contained in the first interlayer insulating film 153. The semiconductor layers can be hydrogenated irrespective of the existence of an insulating film (not shown) formed of a silicon oxide film. Incidentally, in this embodiment, a material containing aluminum as its main constituent is used for the second conductive layer, and thus, it is important to apply the heating process condition that the second conductive layer can withstand in the step of hydrogenation. As another means for hydrogenation, plasma hydrogenation (using hydrogen excited by plasma) may be conducted.

Next, a second interlayer insulating film 154 is formed from an organic insulating material on the first interlayer insulating film 153. In this embodiment, an acrylic resin film with a thickness of 1.6 μm is formed. Then, a contact hole that reaches the source wiring 129, contact holes that respectively reach the conductive layers 127 and 128, and contact holes that reach the respective impurity regions are formed. In this embodiment, a plurality of etching processes is sequentially performed. In this embodiment, the second interlayer insulting film is etched with the first interlayer insulating film as the etching stopper, the first interlayer insulating film is etched with the insulating film (not shown) as the etching stopper, and then, the insulating film (not shown) is etched.

Thereafter, wirings and pixel electrode are formed by using Al, Ti, Mo, W and the like. As the material of the electrodes and pixel electrode, it is desirable to use a material excellent in reflecting property, such as a film containing Al or Ag as its main constituent or a lamination film of the above film. Thus, source electrodes or drain electrodes 155 to 160, a gate wiring 162, a connection wiring 161, and a pixel electrode 163 are formed.

Figure 6:
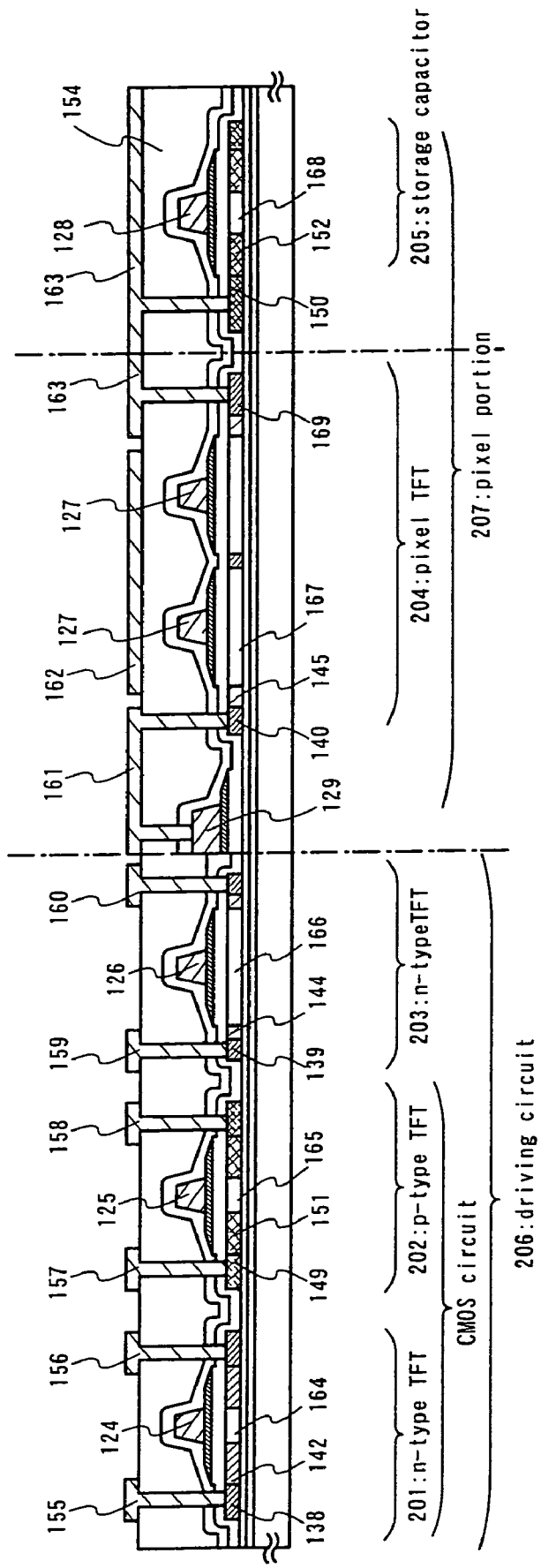
FIG. 6 is a sectional structural diagram of an active matrix liquid crystal display device.

As described above, a driver circuit 206 having an n-channel TFT 201, a p-channel TFT 202, and an n-channel TFT 203 and a pixel portion 207 having a pixel TFT 204 comprised of an n-channel TFT and a storage capacitor 205 can be formed on the same substrate (FIG. 6). In this specification, the above substrate is called an active matrix substrate for the sake of convenience.

In the pixel portion 207, the pixel TFT 204 (n-channel TFT) has a channel forming region 167, the first impurity region (n⁻ region) 145 formed outside the conductive layer 127 forming the gate electrode, and the second impurity region (n⁺ region) 140 functioning as a source region. Further, in the semiconductor layer functioning as one of the electrodes of the storage capacitor 205, the fourth impurity region 150 and the fifth impurity region 152 are formed. The storage capacitor 205 is constituted of the second electrode 128 and the semiconductor layers 150, 152, and 168 with the insulating film (the same film as the gate insulating film) 116 as dielectric.

Further, in the driver circuit 206, the n-channel TFT 201 (first n-channel TFT) has a channel forming region 164, the third impurity region (n⁻ region) 142 that overlaps a part of the conductive layer 124 forming the gate electrode through the insulating film, and the second impurity region (n⁺ region) 138 functioning as a source region or a drain region.

Further, in the driver circuit 206, the p-channel TFT 202 has a channel forming region 165, the fifth impurity region (p⁻ region) 151 that overlaps a part of the conductive layer 125 forming the gate electrode through the insulating film, and the fourth impurity region (p⁺ region) 149 functioning as a source region or a drain region.

Furthermore, in the driver circuit 206, the n-channel TFT 203 (second n-channel TFT) has a channel forming region 166, the first impurity region (n⁻ region) 144 outside the conductive layer 126 forming the gate electrode, and the second impurity region (n⁺ region) 139 functioning as a source region or a drain region.

The above TFTs 201 to 203 are appropriately combined to form a shift register circuit, a buffer circuit, a level shifter circuit, a latch circuit and the like, thereby forming the driver circuit 206. For example, in the case where a CMOS circuit is formed, the n-channel TFT 201 and the p-channel TFT 202 may be complementarily connected to each other.

In particular, the structure of the n-channel TFT 203 is appropriate for the buffer circuit having a high driving voltage with the purpose of preventing deterioration due to a hot carrier effect.

Moreover, the structure of the n-channel TFT 201, which is a GOLD structure, is appropriate for the circuit in which the reliability takes top priority.

From the above, the reliability can be improved by improving the flatness of the semiconductor film surface. Thus, in the TFT having the GOLD structure, sufficient reliability can be obtained even if the area of the impurity region that overlaps the gate electrode through the gate insulating film is reduced. Specifically, in the TFT having the GOLD structure, sufficient reliability can be obtained even if the size of the portion that becomes the tapered portion of the gate electrode is reduced.

In the TFT with the GOLD structure, a parasitic capacitance increases when the gate insulating film is thinned. However, the size of the tapered portion of the gate electrode (first conductive layer) is reduced to reduce the parasitic capacitance, whereby the TFT becomes to enable high-speed operation with improved f-characteristics and to have sufficient reliability.

Further, an example of manufacturing the active matrix substrate for forming a reflection type display device is shown in this example. However, if the pixel electrode is formed of a transparent conductive film, a transmission type display device can be formed although the number of photomasks is increased by one.

Embodiment 2

This embodiment describes a process of manufacturing an active matrix liquid crystal display device from the active matrix substrate fabricated in Embodiment 1. The description is given with reference to FIG. 7.

After the active matrix substrate as illustrated in FIG. 6 is obtained in accordance with Embodiment 1, an oriented film is formed on the active matrix substrate of FIG. 6 and subjected to rubbing treatment. In this embodiment, before the oriented film is formed, an organic resin film such as an acrylic resin film is patterned to form columnar spacers in desired positions in order to keep the substrates apart. The columnar spacers may be replaced by spherical spacers sprayed onto the entire surface of the substrate.

An opposite substrate is prepared next. The opposite substrate has a color filter in which colored layers and light-shielding layers are arranged with respect to the pixels. A light-shielding layer is also placed in the driving circuit portion. A planarization film is formed to cover the color filter and the light-shielding layer. On the planarization film, an opposite electrode is formed from a transparent conductive film in the pixel portion. An oriented film is formed over the entire surface of the opposite substrate and is subjected to rubbing treatment.

Then the opposite substrate is bonded to the active matrix substrate on which the pixel portion and the driving circuits are formed, using a sealing member. The sealing member has filler mixed therein and the filler, together with the columnar spacers, keeps the distance between the two substrates while they are bonded. Thereafter a liquid crystal material is injected between the substrates and an encapsulant (not shown) is used to completely seal the substrates. A known liquid crystal material can be used. The active matrix liquid crystal display device is thus completed. If necessary, the active matrix substrate or the opposite substrate is cut into pieces of desired shapes. Further, the display device may be appropriately provided with an optical film such as a polarizing plate and a phase difference plate using a known technique. Then FPCs are attached to the substrate using a known technique.

Figure 7:
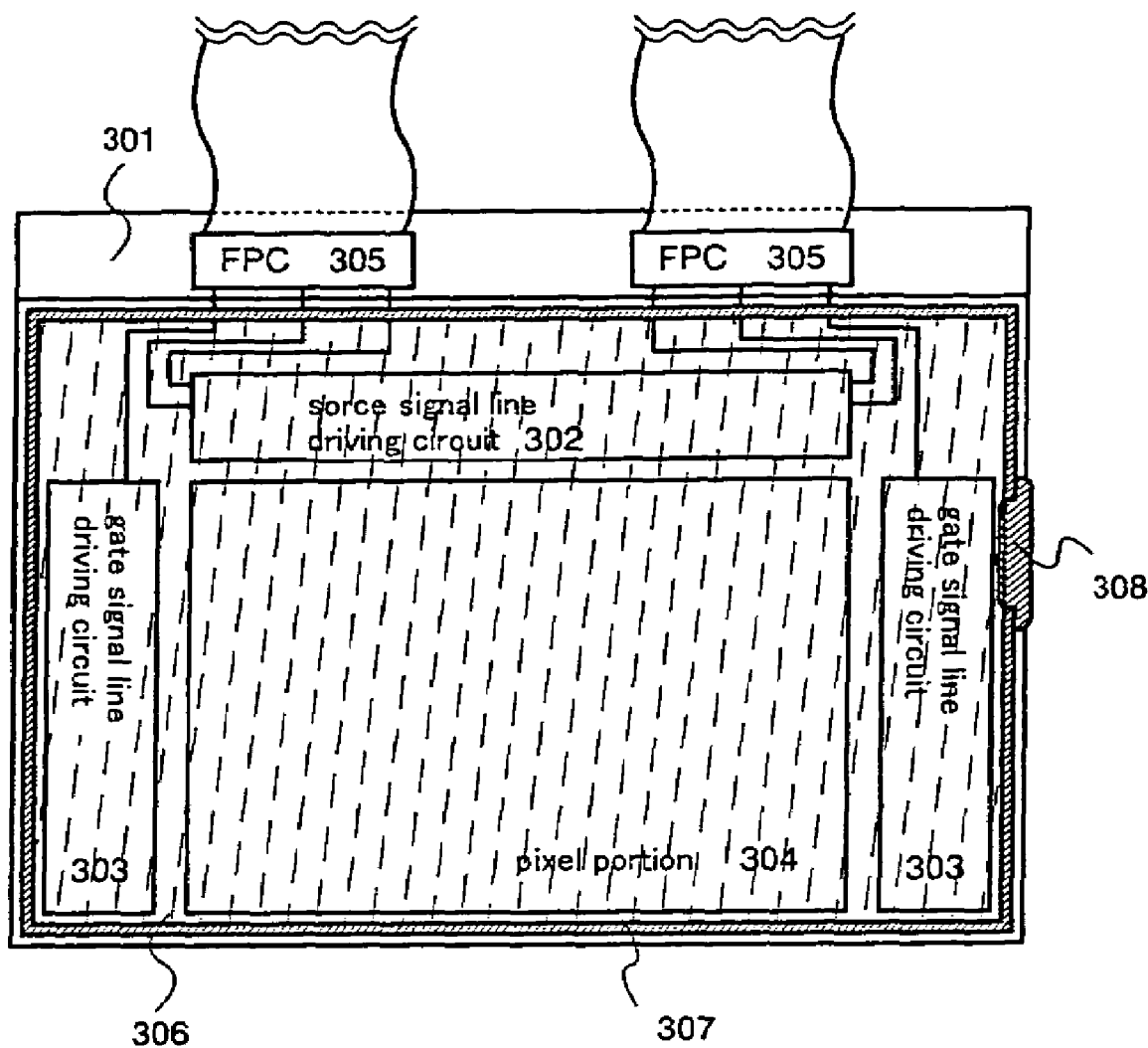
FIG. 7 is a diagram showing the exterior of an AM-LCD.

The structure of the thus obtained liquid crystal module is described with reference to the top view in FIG. 7.

A pixel portion 304 is placed in the center of an active matrix substrate 301. A source signal line driving circuit 302 for driving source signal lines is positioned above the pixel portion 304. Gate signal line driving circuits 303 for driving gate signal lines are placed to the left and right of the pixel portion 304. Although the gate signal line driving circuits 303 are arranged symmetrically with respect to the pixel portion in this embodiment, the liquid crystal module may have only one gate signal line driving circuit on one side of the pixel portion. Of the above two options, a designer can choose the arrangement that suits better considering the substrate size or the like of the liquid crystal module. However, the symmetrical arrangement of the gate signal line driving circuits shown in FIG. 7 is preferred in terms of circuit operation reliability, driving efficiency, and the like.

Signals are inputted to the respective driving circuits from flexible printed circuits (FPC) 305. The FPCs 305 are press-fit through an anisotropic conductive film or the like after opening contact holes in the interlayer insulating film and resin film and forming a connection electrode so as to reach the wiring lines arranged in given places of the substrate 301. The connection electrode is formed from ITO in this embodiment.

A sealing agent 307 is applied to the substrate along its perimeter surrounding the driving circuits and the pixel portion. An opposite substrate 306 is bonded to the substrate 301 by the sealing agent 307 while a spacer formed in advance on the active matrix substrate keeps the distance between the two substrates constant (the distance between the substrate 301 and the opposed substrate 306). A liquid crystal element is injected through an area of the substrate that is not coated with the sealing agent 307. The substrates are then sealed by an encapsulant 308. The liquid crystal module is completed through the above steps.

Although all of the driving circuits are formed on the substrate in the example shown here, several ICs may be used for some of the driving circuits.

Further, this embodiment can be freely combined with any structures in Embodiment 1.

Embodiment 3

Embodiment 1 shows an example of reflective display device in which a pixel electrode is formed from a reflective metal material. Shown in this embodiment is an example of transmissive display device in which a pixel electrode is formed from a light-transmitting conductive film.

The manufacture process up through the step of forming an interlayer insulating film is identical with the process of Embodiment 1, and the description thereof is omitted here. After the interlayer insulating film is formed in accordance with Embodiment 1, a pixel electrode 601 is formed from a light-transmitting conductive film. Examples of the light-transmitting conductive film include an ITO (indium tin oxide alloy) film, an indium oxide-zinc oxide alloy ($In_2O_3$—ZnO) film, a zinc oxide (ZnO) film, and the like.

Thereafter, contact holes are formed in an interlayer insulating film 600. A connection electrode 602 overlapping the pixel electrode is formed next. The connection electrode 602 is connected to a drain region through the contact hole. At the same time the connection electrode is formed, source electrodes or drain electrodes of other TFTs are formed.

Although all of the driving circuits are formed on the substrate in the example shown here, several ICs may be used for some of the driving circuits.

Figure 8:
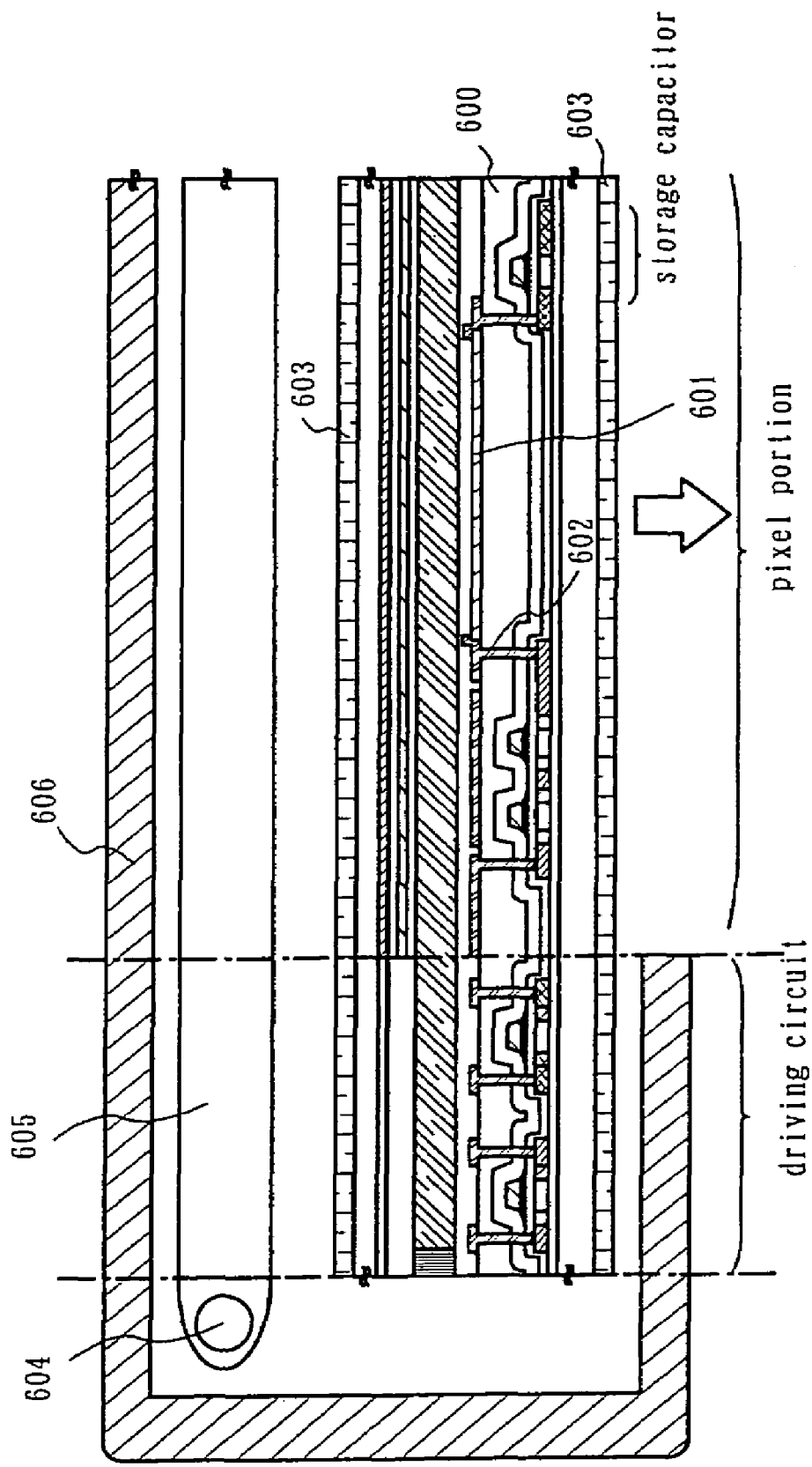
FIG. 8 is a diagram showing a transmissive liquid crystal display device.

An active matrix substrate is completed as above. A liquid crystal module is manufactured from this active matrix substrate in accordance with Embodiment 2. The liquid crystal module is provided with a backlight 604 and a light guiding plate 605, and is covered with a cover 606 to complete the active matrix type liquid crystal display device of which a partial sectional view is shown in FIG. 8. The cover is bonded to the liquid crystal module using an adhesive or an organic resin. When bonding the substrate to the opposite substrate, the substrates may be framed so that the space between the frame and the substrates is filled with an organic resin for bonding. Since the display device is of transmissive type, the active matrix substrate and the opposite substrate each needs a polarizing plate 603 to be bonded.

This embodiment can be freely combined with any structures in Embodiment 1 or 2.

Embodiment 4

In this embodiment, an example of manufacturing a light emitting device including an organic light emitting device (OLED) is shown in FIG. 9.

The OLED has a layer containing an organic compound (organic light emitting material) to cause electroluminescence under the application of an electric field (hereinafter, referred to as an organic light emitting layer), an anode and a cathode. The electroluminescence on an organic compound includes the emission of light of upon returning from a singlet excitation state into the ground state (fluorescence) and the emission of light of upon returning from a triplet excitation state into the ground state (phosphorescence). The light emitting device of the present invention may use either one or both of such emission of light.

In the specification, every layer provided between a cathode and an anode of the OLED is defined as an organic light emitting layer. The organic light emitting layer, concretely, includes a light emitting layer, a hole injection layer, an electron injection layer, a hole transport layer, an electron transport layer, etc. Basically, the OLED has a structure layered with an anode, a light emitting layer and a cathode in the order. In addition to this structure, some structures possess an anode, a hole injection layer, a light emitting layer and a cathode or an anode, a hole injection layer, a light emitting layer, an electron transport layer and a cathode in the order.

Figure 9A:
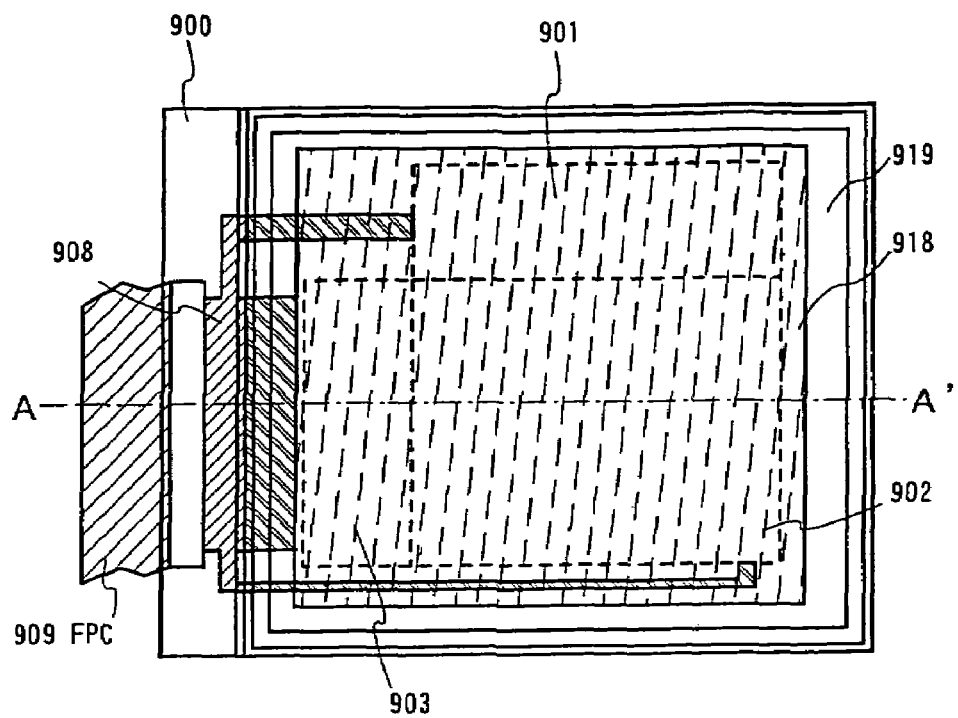
FIGS. 9A and 9B are diagrams showing a display device having an OLED.
Figure 9B:
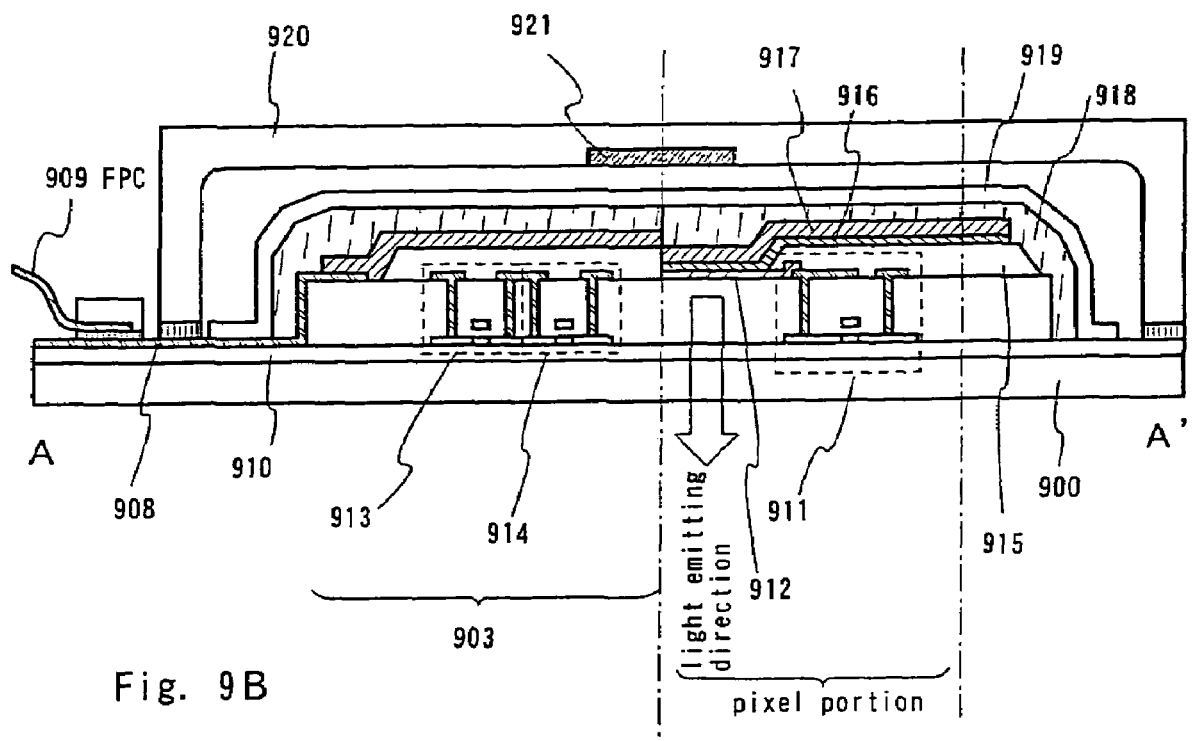

FIG. 9A is a top view of a module having the OLED, namely a top view of an EL module, and FIG. 9B is a sectional view taken along a line A-A' of FIG. 9A. A pixel portion 902, a source side driver circuit 901, and a gate side driver circuit 903 are formed on a substrate 900 having an insulating surface (such as a glass substrate, a crystallized glass substrate, and a plastic substrate, for instance). These pixel portion and the driver circuit can be obtained in accordance with the afore-mentioned embodiments.

Further, reference numeral 918 denotes a sealing member, and reference. numeral 919 is a DLC film. The pixel portion and the driver circuit portion are covered with the sealing member 918, and the sealing member is covered with a protective film 919. Further, the protective film 919 is sealed by a covering member 920 using an adhesive member. The covering member 920 may be a base member of any component such as plastic, glass, metal, ceramics or the like. Moreover, a shape of the covering member 920 and a supporting body are not particularly limited, and may be one having a plane, one having a curved surface, one having a surface capable of being curved, or one in a film shape. It is desirable that the covering member 920 for enduring the distortion due to the heat and external force is the same material with the substrate 900, and for example, a glass substrate is preferable to be used. In this embodiment, a substrate processed in a concave portion shape (depth, 3-10 μm) by sandblast as shown in FIG. 9 is used. It is desirable that it is further processed, and a concave portion (depth, 50-200 μm) on which desiccant 921 can be set is formed. Moreover, in the case where an EL module is fabricated in multiple pattern, after the substrate and the covering member were pasted together, it may be cut so that the end faces are matched with each other using $CO_2$ laser or the like.

Moreover, here not shown in figures, in order to prevent the background from being reflected due to the reflection of the applied metal layer (here, cathode or the like), a circular polarizing means referred to as a circular polarizing plate consisted of a phase difference plate (λ/4 plate) and polarizing plate may be provided on the substrate 900.

It should be noted that the reference numeral 908 denotes a wiring for transmitting signals inputted into the source side driver circuit 901 and the gate side driver circuit 903, it receives a video signal and a clock signal from a FPC (Flexible Print Circuit) which is an external input terminal. Moreover, a light emitting device of the present embodiment may be of a digital drive, or an analog drive, and a video signal may be a digital signal, or an analog signal. It should be noted that here, only FPC is shown in figure, but a print wiring base (PWB) may be mounted on this FPC. It is defined that a light emitting device in the present specification includes not only the main body of the light emitting device but also the state where the FPC or the PWB is mounted on the main body. Moreover, although a complex integrated circuit (memory, CPU, controller, D/A converter or the like) are capable of being formed on the same substrate with these pixel portion and drive portion, the fabrication with a small number of masks is difficult. Therefore, it is preferred that an IC chip equipped with a memory, a CPU, a controller, a D/A converter or the like is mounted by a COG (Chip On Glass) method, or a TAB (rape Automated Bonding) method or a wire bonding method.

Next, the sectional structure will be described below with reference to FIG. 9B. An insulating film 910 is provided on the film substrate 900, the pixel portion 902 and the gate side driver circuit 903 have been formed above the insulating film 910, and the pixel portion 902 is formed by a plurality of pixels containing the pixel electrode 912 electrically connected to the TFT 911 for controlling the current and its drain. In particular, although a plurality of TFTs is provided in one pixel, only the TFT 911 for controlling the current is shown here for the sake of a simplification. Moreover, the gate side driver circuit 903 is formed using a CMOS circuit that an n-channel type TFT 913 and a p-channel type TFT 914 are combined.

These TFTs (including 911, 913 and 914) may be fabricated in accordance with the n-channel type TFT 201 and the p-channel type TFT 202 described in Embodiment 1. It should be note that although only an example of using a top gate TFT is shown here, it is not limited to this configuration of TFTs and a bottom gate TFT, for example, can be used.

Figure 10:
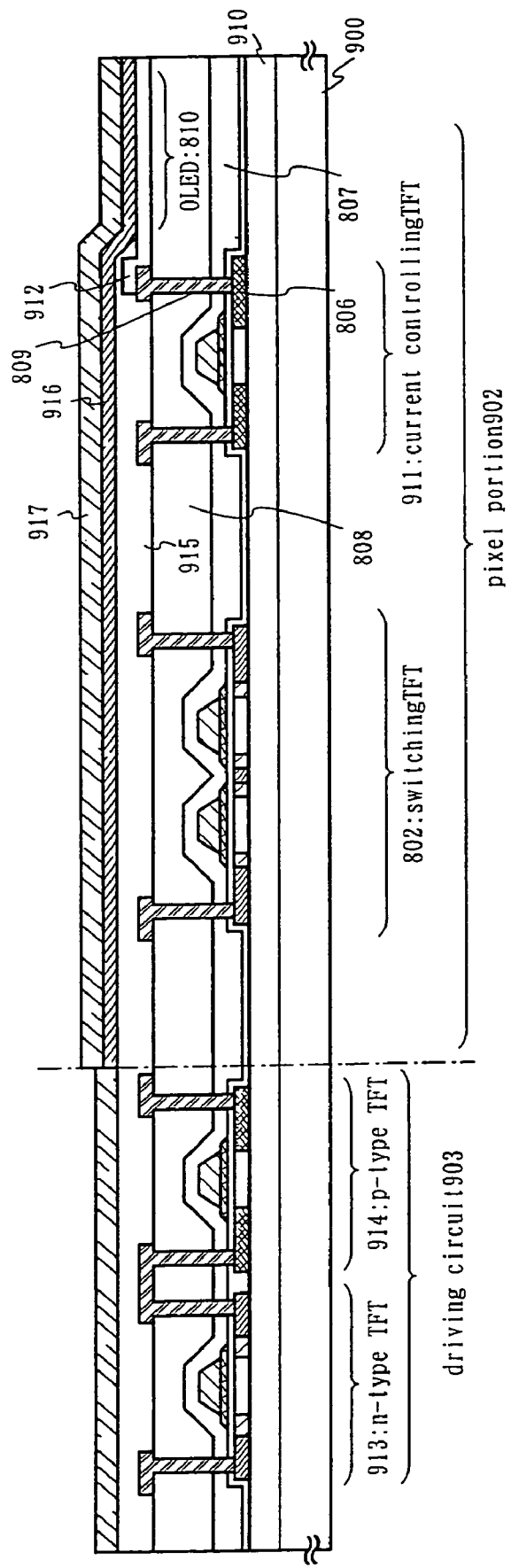
FIG. 10 is a sectional structural diagram of an active matrix substrate having an OLED.

Further, an example of a sectional view of an active matrix substrate at the step wherein an OLED 810 is formed thereon is shown in FIG. 10. In FIG. 10, same reference symbols are used in the same places as FIG. 9.

Further, a display device having the OLED includes driving methods such as a driving method which is designed so as to apply a constant voltage and supply the electric current into the OLED, a driving method which is designed so as to control the voltage applied to the OLED in order to provide constant electric current in the OLED, and a driving method which is designed so as to provide constant electric current in the OLED. However, the luminance of a pixel is determined by a ON current ($I_{on}$) of a TFT which are electrically connected to the OLED and provide electric current to the OLED (the TFT is referred to as a TFT for controlling the current in this specification, and the TFT is corresponds to the TFT 911 for Controlling the current in FIG. 10) in stead of the driving method. Therefore, there is a problem of causing unevenness in luminance if ON currents in the respective TFTs are not constant. This problem can be solved by the present invention.

Incidentally, although a n-channel TFT is used in the switching TFT 802 and a p-channel TFT is used in the TFT 911 for controlling the current in this embodiment, present invention is not limited to this configuration. Both the p-channel TFT and the n-channel TFT can be used as the switching TFT and the TFT for controlling the current. It should be note that when an anode of the OLED is used as a pixel electrode, it is desirable that the driving TFT is a p-channel TFT. And when an anode of the OLED is used as a pixel electrode, it is desirable that the driving TFT is an n-channel TFT.

Further, the second doping process is performed by using the mask 137 shown in FIG. 5A in order to reduce the OFF current value of the pixel portion in Embodiment 1. However, the second doping process is performed without forming masks in order to reduce the number of masks.

Further, it is not limited to the configuration of the TFTs of the p-channel TFT shown in FIG. 10. And if it is required to reduce the OFF current value, a mask shown in FIG. 5A and a lightly doped drain (LDD) structure including a LDD region between a channel forming region and a drain region (or source region) may be provided. Further, a gate-drain overlapped LDD (GOLD) structure in which a LDD region is arranged so as to overlap with the gate electrode via the gate insulating film may be provided.

Further, the switching TFT 802 may be formed as same as the n-channel TFT 201 in Embodiment 1. It should be note that the switching TFT 802 is a n-channel TFT having a structure including a two channel forming regions are provided between the source region and the drain region (double gate structure). It should be note that the present embodiment is not limited to the double gate structure, but a single gate structure forming one channel forming region or a triple gate structure forming a three channel forming regions may be employed.

It is preferable that an insulating film having an excellent flatness and high light transmittance is used as the insulating film 808 provided between an active layer of FIT and the OLED. Or, it is preferable that a planarization process is conducted after the formation of the insulating film. As the planarization process, a known technique improving flatness, for example, a polishing process, which is called a chemical-mechanical polishing (hereinafter referred to as CMP), is preferably used. When the CMP is used in the planarization process, a slurry wherein fumed silica particles obtained by decomposing silicon chloride gas thermally are dispersed in a KOH-added aqueous solution, for example, is used as a polishing material (slurry) of the CMP with respect to the insulating film. By the CMP, the insulating film is removed by about 0.1 to 0.5 μm, so as to make the surface flat. Moreover, as for the OLED, if the thickness of the film of the organic compound layer is not uniform, since the variation is generated in its luminescence, it is preferable that the film thickness of the organic compound layer having a film thickness becomes as uniform as possible.

It should be noted that as insulating films 807 and 808 provided between the active layer of the TFT and the OLED, it is preferable that a material for not only blocking the diffusion of the impurity ion such as alkali metal ion, alkaline earth metal ion or the like, but also aggressively absorbing the impurity ion such as alkali metal ion, alkaline earth metal ion or the like, and further, a material endurable for the temperature of later processes is suitable. As a material suitable for these conditions, as one example, a silicon nitride film is listed. The fluorine density containing in the film of the silicon nitride film is $1 \times 10^{19}$ / $cm^3$ or more, preferably, the composition ratio of fluorine is made in the range from 1 to 5%. The fluorine in the silicon nitride film is bonded to alkali metal ion, alkaline earth ion or the like, and absorbed in the film. Moreover, as the other example, an organic resin film, which absorbs alkali metal ion, alkali earth metal ion or the like, containing a fine particle consisted of antimony (Sb) compound, tin (Sn) compound or indium (In) compound, for instance, an organic resin film containing antimony pentaoxide fine particle ($Sb_2O_5.nH_2O$) is also listed. It should be noted that this organic resin film contains a fine particle having 10 to 20 nm in average particle diameter, and light transmittance is also very high. An antimony compound represented by this antimony pentaoxide fine particle easily absorbs impurity ion such as alkali metal ion or alkaline earth metal ion.

Moreover, as the other material of the insulating films 807 and 808 provided between the active layer of the TFT and the OLED, a layer indicated by $AlN_xO_y$ may be used. An oxynitride layer containing aluminum (layer indicated by $AlN_xO_y$) obtained by performing the film formation under the atmosphere that argon gas, nitrogen gas and oxygen gas are mixed using aluminum nitride (AlN) target by a sputtering method is a film containing nitrogen in the range from 2.5 atm % to 47.5 atm %, characterized by the fact that it has an effect capable of blocking water content and oxygen, in addition to this, has a high thermal conductivity and an effect of heat release, and further, has a very high light transmittance. In addition, it can prevent impurities such as alkali metal, alkaline earth metal or the like from penetrating into the active layer of TFT.

The pixel electrode 912, which is electrically connected to the electrode 809 electrically connected to the one of the impurity region 806 of the TFT 911 for controlling the current, functions as an anode of the OLED. A conductive film having a large work function, typically, an conductive oxide film is used as the anode. As the conductive oxide film can be formed from indium oxide, tin oxide, zinc oxide, or compound of these materials. Further, a bank 915 is formed on both ends of the pixel electrode 912, and an EL layer and a cathode 917 of the OLED are formed on the pixel electrode 912.

As the EL layer 916, an EL layer (layer for light emitting and making carrier perform the migrate for it) may be formed by freely combining the light emitting layer, a charge transportation layer or a charge injection layer. For example, low molecular system organic EL material and high molecular system organic EL material may be employed. Moreover, as an EL layer, a thin film consisted of a light emitting material (singlet compound) which light-emits (fluorescence) due to singlet excitation, or a thin film consisted of a light emitting material (triplet compound) which emits (phosphorescence) due to triplet excitation can be used. Moreover, an inorganic material such as silicon carbide or the like is capable of being used as a charge transport layer and a charge injection layer. For these organic EL material and inorganic material, the known materials can be used.

The cathode 917 also functions the wiring common to the all of the pixels, and electrically connected to the FPC 909 via the connecting wiring 908. As a material used for the cathode 917, it is said that it is preferable to use a metal having a small work function (representatively, metal elements belonging to I group or II group of the periodic table) or an alloy containing these. Since the smaller the work function is, the more the luminous efficiency is enhanced, it is preferable that among these, as a material used for a cathode, an alloy containing Li (lithium), which is one of alkaline metals, is used. Moreover, elements contained in the pixel portion 902 and on the gate side driver circuit 903 are all covered by the cathode 917, the sealing member 918, and the protective film 919.

It should be noted that as the sealing member 918, it is preferable that a material being transparent to the visible light or semitransparent is used if it is possible. Moreover, it is desirable that the sealing member 918 is a material for transmitting water content and oxygen as little as possible.

Moreover, after the OLED was completely covered by utilizing the sealing member 918, it is preferred that the protective film 919 consisted of a single layer or lamination layer which is selected from AION film, AIN film, $Al_2O_3$ film, or DLC film is provided on the surface (exposed surface) of the sealing member 918 as shown in FIG. 9. Moreover, the protective film may be provided on the entire surface including the back side of the substrate. Here, it is necessary to note so that the protective film is not formed on the portion on which the external input terminal (FPC) is provided. It may be made so that the protective film is not formed by utilizing a mask, or it may be made so that the protective film is not formed by covering the exterior input terminal portion with a tape such as a masking tape used in a CVD device.

The light emitting element can be completely interrupted from the external by sealing the OLED with the sealing member 918 and the protective film in the above-described structure, and it can prevent the substances promoting the deterioration due to the oxidation of EL layer occurred by water content, oxygen or the like from the external from penetrating. In addition to this, if a film having a thermal conductivity (AlON film, AlN film or the like) is used as a protective film, the heat generated when it is driven can be released. Therefore, a light emitting device with high reliability can be obtained.

Further, a fluctuation in electric characteristic and a fluctuation in luminance of the TFT arranged so as to flow the constant electric current in the pixel electrode (TFT for providing the electric current to the OLED arranged in the driver circuit or the pixel) can be reduced.

Figure 11:
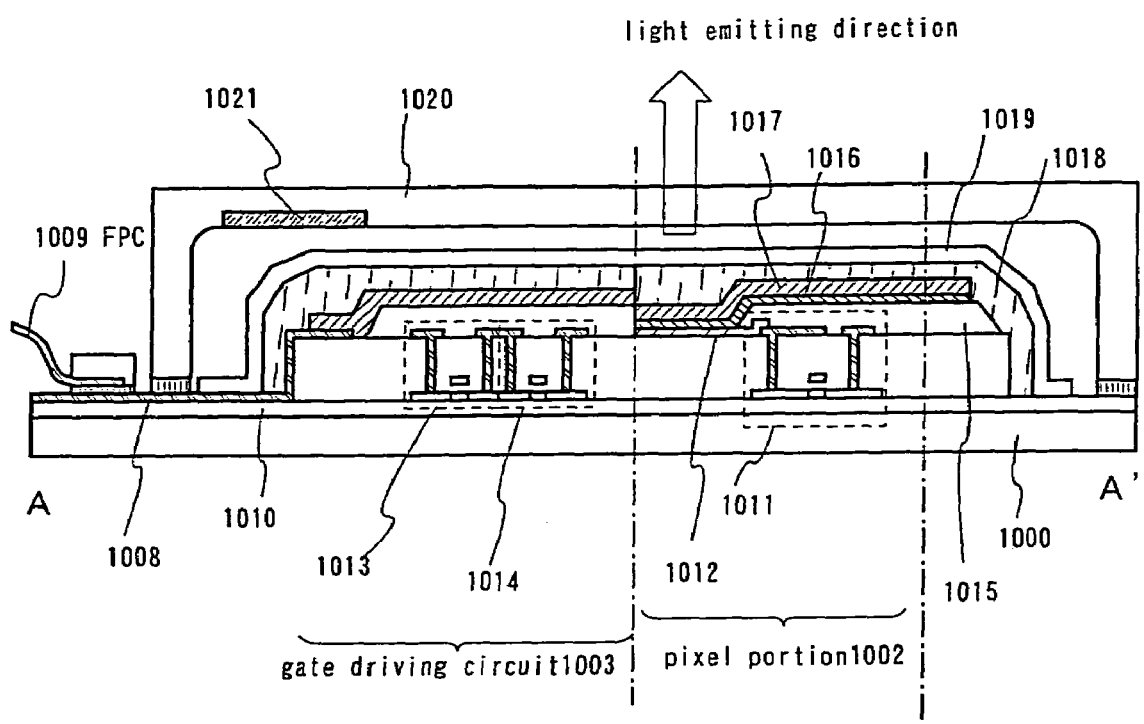
FIG. 11 is a diagram showing a display device having an OLED.

Moreover, the pixel electrode is made a cathode, the EL layer and the anode are laminated and it may be configured so that the light is emitted in the reverse direction. Its one example is shown in FIG. 11. It should be noted that since a top view is the same, the diagram and description are omitted.

The sectional structure shown in FIG. 11 will be described below. As a film substrate 1000, a semiconductor substrate or a metal substrate can be employed in addition to a glass substrate and a quartz substrate. An insulating film 1010 is provided on the film substrate 1000, above the insulating film 1010, the pixel portion 1002 and the gate side driver circuit 1003 are formed and the pixel portion 1002 is formed by a plurality of pixels containing a pixel electrode 1012 electrically connected to a TFT 1011 for controlling the current and its drain. Moreover, the gate side driver circuit 1003 is formed using a CMOS circuit that an n-channel type TFT 1013 and a p-channel type TFT 1014 are combined.

The pixel electrode 1012 functions as a cathode of the OLED. Moreover, a bank 1015 is formed on both ends of the pixel electrode 1012, an EL layer 1016 and an anode 1017 of the OLED are formed on the pixel electrode 1012.

The anode 1017 also functions as the common wiring to all of the pixels, and electrically connected to the FPC 1009 via a connecting wiring 1008. Furthermore, the element contained in the pixel portion 1002 and the gate side driver circuit 1003 are all covered by the anode 1017, the sealing member 1018 and the protective film 1019. Moreover, the covering member 1020 and the substrate 1000 were pasted using the adhesive. Moreover, the concave portion is provided on the covering member, and the desiccant 1021 is set on the covering member.

It should be noted that as the sealing member 1018, it is preferable that a material being transparent to the visible light or semitransparent is used if it is possible. Moreover, it is desirable that the sealing member 1018 is a material for transmitting water content and oxygen as little as possible.

Moreover, in FIG. 11, since the pixel electrode was made cathode, and the EL layer and the anode were laminated, the direction of the light emission is a direction of the arrow indicted in FIG. 11.

Moreover, here not shown in figures, in order to prevent the background from being reflected due to the reflection of the applied metal layer (here, pixel electrode which becomes to a cathode or the like), a circular polarizing means referred to as a circular polarizing plate consisted of a phase difference plate ($\lambda/4$ plate) and polarizing plate may be provided on the covering member 1020.

In the present Embodiment 4, since a TFT having less fluctuation in electric characteristics and a high reliability obtained in Embodiment 1 is used, an OLED having less fluctuation in luminance comparing to those of the conventional elements can be formed. Moreover, an electric apparatus having a high performance can be obtained by utilizing a light emitting device having such OLEDs as a display portion.

It should be note that the present embodiment can be freely combined with Embodiment 1.

Embodiment 5

A driver circuit and pixel portion formed by the present invention can be used to various modules (such as an active matrix type liquid crystal display device, an active matrix type EL module, and active matrix type EC module). Accordingly, all electronic apparatuses incorporated these modules can be completed by implementing the present invention.

Such electronic apparatuses include a video camera, a digital camera, a head mount display (goggles-type display), a car navigation system, projectors, a car stereo, a personal computer, a portable information terminal (such as a mobile computer, a mobile telephone, and an electronic book), or the like. FIGS. 25A to 25F, FIGS. 26A to 26C, and FIGS. 27A to 27C respectively shows various specific examples of such electronic apparatuses.

Figure 25A:
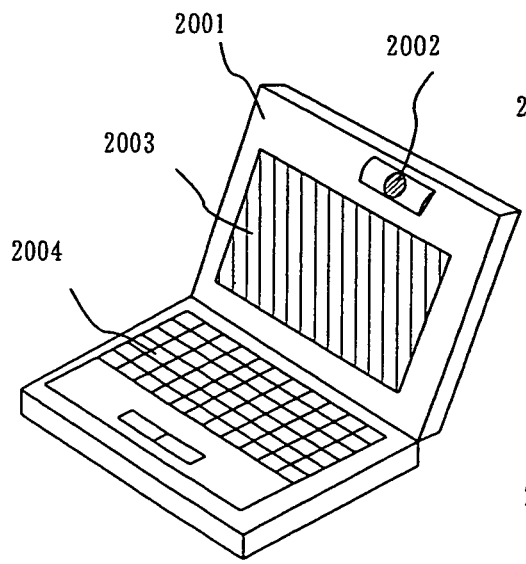
FIGS. 25A to 25F are diagrams showing examples of electronic equipment.

FIG. 25A is a personal computer which comprises: a main body 2001; an image input portion 2002; a display portion 2003; a keyboard 2004 and the like.

Figure 25B:
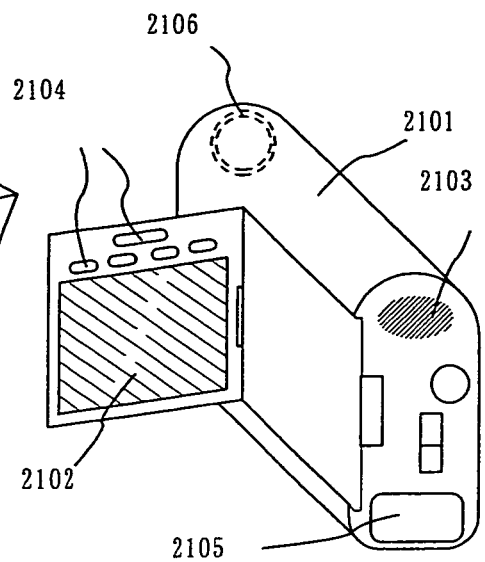

FIG. 25B is a video camera which comprises: a main body 2101; a display portion 2102; a voice input portion 2103; operation switches 2104; a battery 2105; an image receiving portion 2106 and the like.

Figure 25C:
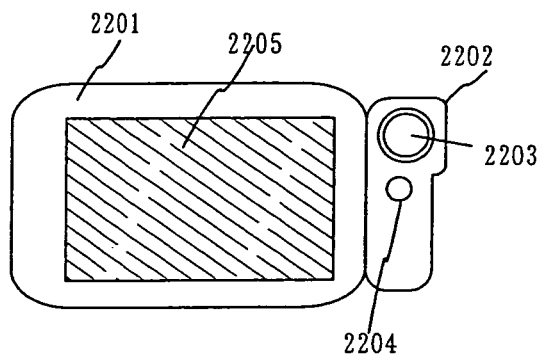

FIG. 25C is a mobile computer which comprises: a main body 2201; a camera portion 2202; an image receiving portion 2203; operation switches 2204; a display portion 2205 and the like.

Figure 25D:
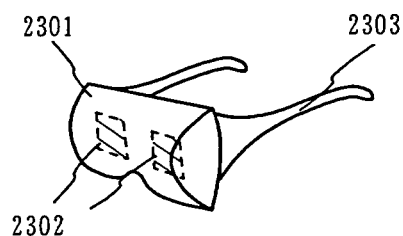

FIG. 25D is a goggle type display which comprises: a main body 2301; a display portion 2302; an arm portion 2303 and the like.

Figure 25E:
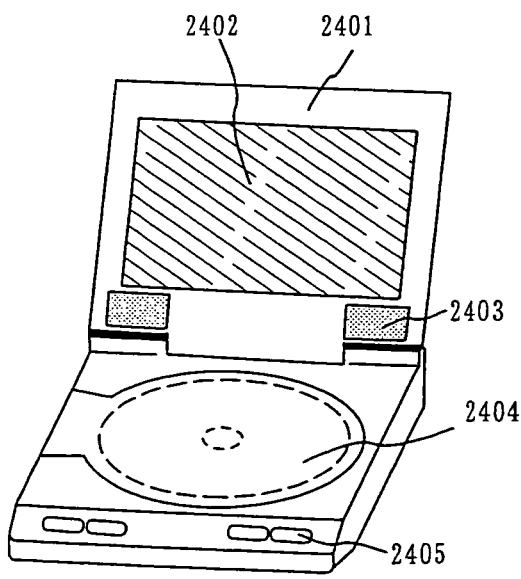

FIG. 25E is a player using a recording medium which records a program (hereinafter referred to as a recording medium) which comprises: a main body 2401; a display portion 2402; a speaker portion 2403; a recording medium 2404; operation switches 2405 and the like. This apparatus uses DVD (digital versatile disc), CD, etc. for the recording medium, and can perform music appreciation, film appreciation, games and use for Internet.

Figure 25F:
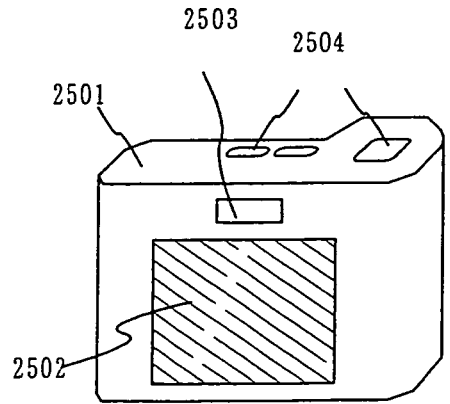

FIG. 25F is a digital camera which comprises: a main body 2501; a display portion 2502; a view finder 2503; operation switches 2504; and an image receiving portion (not shown in the figure).

Figure 26A:
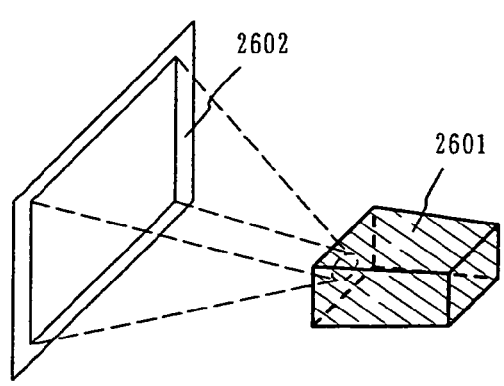
FIGS. 26A to 26D are diagrams showing examples of electronic equipment.

FIG. 26A is a front type projector which comprises: a projection system 2601; a screen 2602 and the like. Embodiment 3 can be applied to the liquid crystal module 2808 which forms a part of the projection system 2601 to complete the whole system.

Figure 26B:
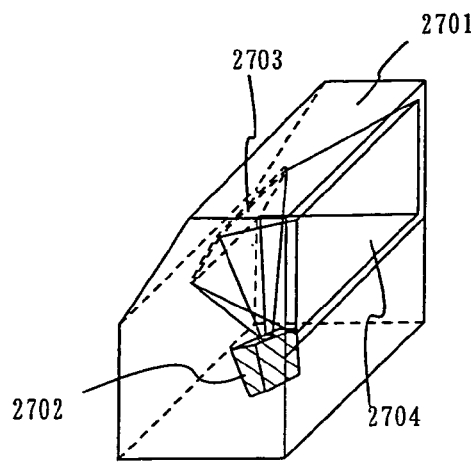

FIG. 26B is a rear type projector which comprises: a main body 2701; a projection system 2702; a mirror 2703; a screen 2704 and the like. Embodiment 3 can be applied to the liquid crystal module 2808 which forms a part of the projection system 2702 to complete the whole system.

Figure 26C:
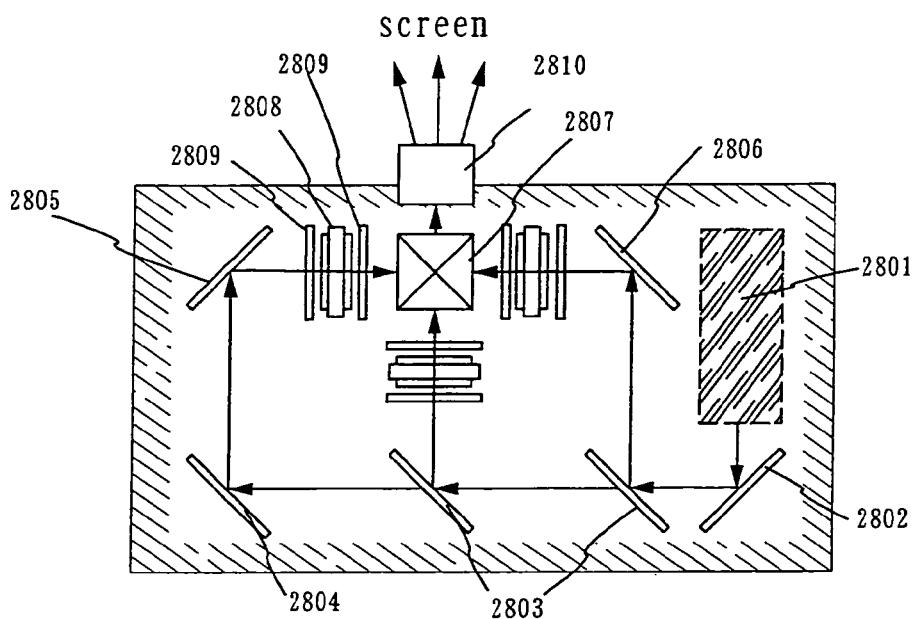

FIG. 26C is a diagram which shows an example of the structure of a projection system 2601 and 2702 in FIGS. 26A and 26B, respectively. Each of projection systems 2601 and 2702 comprises: an optical light source system 2801; mirrors 2802 and 2804 to 2806; a dichroic mirror 2803; a prism 2807; a liquid crystal module 2808; a phase differentiating plate 2809; and a projection optical system 2810. The projection optical system 2810 comprises an optical system having a projection lens. Though this embodiment shows an example of 3-plate type, this is not to limit to this embodiment and a single plate type may be used for instance. Further, an operator may appropriately dispose an optical system such as an optical lens, a film which has a function to polarize light, a film which adjusts a phase difference or an IR film, etc. in the optical path shown by an arrow in FIG. 26C.

Figure 26D:
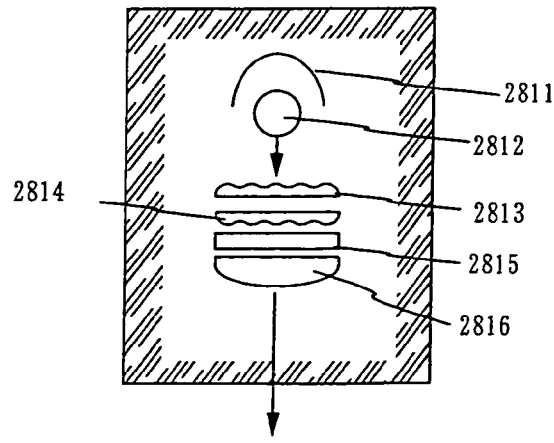

FIG. 26D is a diagram showing an example of a structure of an optical light source system 2801 in FIG. 26C. In this embodiment, the optical light source system 2801 comprises: a reflector 2811; a light source 2812; lens arrays 2813 and 2814; a polarizer conversion element 2815; and a collimator lens 2816. Note that the optical light source system shown in FIG. 26D is merely an example and the structure is not limited to this example. For instance, an operator may appropriately dispose an optical system such as an optical lens, a film which has a function to polarize light, a film which adjusts a phase difference or an IR film, etc.

Note that the projectors shown FIGS. 26A to 26D are the cases of using a transmission type electro-optical device, and applicable examples of a reflection type electro-optical device and an EL module are not shown.

Figure 27A:
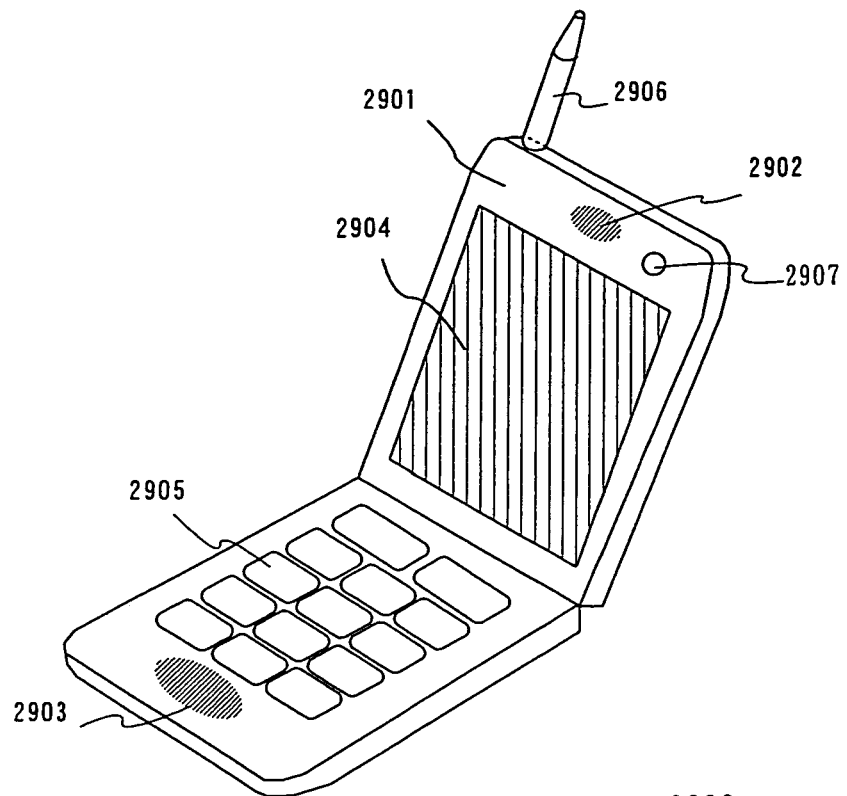
FIGS. 27A to 27C are diagrams showing examples of electronic equipment.

FIG. 27A is a mobile phone which comprises: a main body 2901; a voice output portion 2902; a voice input portion 2903; a display portion 2904; operation switches 2905; an antenna 2906; and an image input portion (CCD, image sensor, etc.) 2907 etc.

Figure 27B:
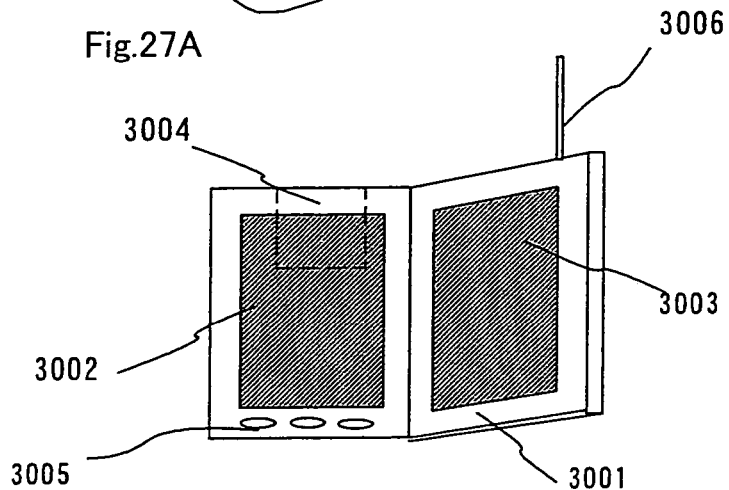

FIG. 27B is a portable book (electronic book) which comprises: a main body 3001; display portions 3002 and 3003; a recording medium 3004; operation switches 3005 and an antenna 3006 etc.

Figure 27C:
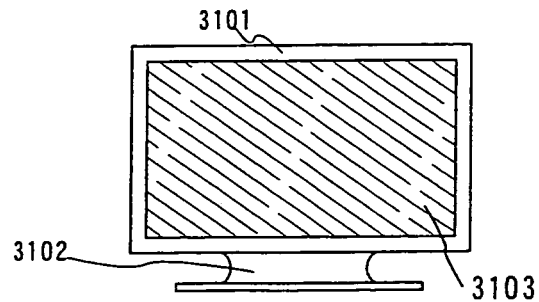

FIG. 27C is a display which comprises: a main body 3101; a supporting base 3102; and a display portion 3103 etc.

In addition, the display shown in FIG. 27C is small and medium type of large type, for example, screen of the display sized 5 to 20 inches. Moreover, it is preferable to mass-produce by executing a multiple pattern using a substrate sized 1 m×1 m to form such sized display portion.

As described above, the applicable range of the present invention is very large, and the invention can be applied to electronic apparatuses of various fields. Note that the electronic devices of this embodiment can be achieved by utilizing any combination of constitutions in Embodiments 1 to 4.

According to the present invention, a semiconductor film having a crystal structure in which a metal element for accelerating crystallization is sufficiently reduced or removed can be obtained to improve electric characteristics of TFTs that use the obtained semiconductor film as their active layers and to reduce fluctuation between individual elements. If the TFTs are employed in a liquid crystal display device, in particular, irregular display due to fluctuation in TFT characteristic can be reduced.

Also, if the present invention is applied to a semiconductor device having an OLED, fluctuation in ON current ($I_{on}$) of a TFT arranged to cause a constant current flow to a pixel electrode (a TFT arranged in a driving circuit or a pixel in order to supply a current to an OLED) can be reduced and therefore fluctuation in luminance can be reduced.

The present invention can remove or reduce other metal elements (Fe, Cu, and the like) that act as impurities in addition to a metal element that accelerates crystallization.

What is claimed is:

1. A method of manufacturing a semiconductor device, comprising:
forming on an insulating surface a first semiconductor film having an amorphous structure;
providing the first semiconductor film with a material comprising a metal element;
heating the first semiconductor film to crystallize the first semiconductor film after providing said material;
irradiating the crystallized first semiconductor film with laser in an oxidizing atmosphere;
removing an oxide from the crystallized first semiconductor film after the irradiation of the laser;
forming a barrier layer on the crystallized first semiconductor film;
forming a second semiconductor film on the barrier layer;
removing at least a portion of the metal element from the crystallized first semiconductor film by gettering the metal element into the second semiconductor film;
removing the second semiconductor film; and
removing the barrier layer.

2. A method of manufacturing a semiconductor device according to claim 1, wherein the barrier layer is a silicon oxynitride film with a thickness of 1 to 10 nm.

3. A method of manufacturing a semiconductor device according to claim 1, wherein the metal element is one or more kinds of elements selected from the group consisting of Fe, Ni, Co, Ru, Rh, Pd, Os, Ir, Pt, Cu, and Au.

4. A method of manufacturing a semiconductor device according to claim 1, wherein the barrier layer is formed by plasma CVD.

5. A method of manufacturing a semiconductor device, comprising:
forming on an insulating surface a first semiconductor film having an amorphous structure;
providing the first semiconductor film with a material comprising a metal element;
heating the first semiconductor film to crystallize the first semiconductor film after providing said material;
irradiating the crystallized first semiconductor film with laser in an oxidizing atmosphere;
forming a barrier layer on the crystallized first semiconductor film;
forming a second semiconductor film containing a noble gas element on the barrier layer;
removing at least a portion of the metal element from the crystallized first semiconductor film by gettering the metal element into the second semiconductor film;
removing the second semiconductor film; and
removing the barrier layer.

6. A method of manufacturing a semiconductor device according to claim 5, wherein the barrier layer is a silicon oxynitride film with a thickness of 1 to 10 nm.

7. A method of manufacturing a semiconductor device according to claim 5, wherein the metal element is one or more kinds of elements selected from the group consisting of Fe, Ni, Co, Ru, Rh, Pd, Os, Ir, Pt, Cu, and Au.

8. A method of manufacturing a semiconductor device according to claim 5, wherein the noble gas element is one or more kinds of elements selected from the group consisting of He, Ne, Ar, Kr, and Xe.

9. A method of manufacturing a semiconductor device according to claim 5, wherein the barrier layer is formed by plasma CVD.

10. A method of manufacturing a semiconductor device, comprising:
   forming on an insulating surface a first semiconductor film having an amorphous structure;
   providing the first semiconductor film with a material comprising a metal element;
   heating the first semiconductor film to crystallize the first semiconductor film after providing said material;
   irradiating the crystallized first semiconductor film with laser in an oxidizing atmosphere;
   forming a barrier layer on the crystallized first semiconductor film;
   forming a second semiconductor film containing argon at a concentration of $1\times10^{18}/cm^3$ to $1\times10^{22}/cm^3$ on the barrier layer;
   removing at least a portion of the metal element from the crystallized first semiconductor film by gettering the metal element into the second semiconductor film;
   removing the second semiconductor film; and
   removing the barrier layer.

11. A method of manufacturing a semiconductor device according to claim 10, wherein the barrier layer is a silicon oxynitride film with a thickness of 1 to 10 nm.

12. A method of manufacturing a semiconductor device according to claim 10, wherein the metal element is one or more kinds of elements selected from the group consisting of Fe, Ni, Co, Ru, Rh, Pd, Os, Ir, Pt, Cu, and Au.

13. A method of manufacturing a semiconductor device according to claim 10, wherein the barrier layer is formed by plasma CVD.

14. A method of manufacturing a semiconductor device, comprising:
   forming on an insulating surface a first semiconductor film having an amorphous structure;
   providing the first semiconductor film with a material comprising a metal element;
   heating the first semiconductor film to crystallize the first semiconductor film after providing said material;
   irradiating the crystallized first semiconductor film with laser in an oxidizing atmosphere;
   removing an oxide from the crystallized first semiconductor film after the irradiation of the laser;
   forming a barrier layer on the crystallized first semiconductor film;
   forming a second semiconductor film on the barrier layer without exposing the barrier layer to the air;
   removing at least a portion of the metal element from the crystallized first semiconductor film by gettering the metal element into the second semiconductor film;
   removing the second semiconductor film; and
   removing the barrier layer.

15. A method of manufacturing a semiconductor device according to claim 14, wherein the barrier layer is a silicon oxynitride film with a thickness of 1 to 10 nm.

16. A method of manufacturing a semiconductor device according to claim 14, wherein the metal element is one or more kinds of elements selected from the group consisting of Fe, Ni, Co, Ru, Rh, Pd, Os, Ir, Pt, Cu, and Au.

17. A method of manufacturing a semiconductor device according to claim 14, wherein the barrier layer is formed by plasma CVD.

18. A method of manufacturing a semiconductor device, comprising:
   forming on an insulating surface a first semiconductor film having an amorphous structure;
   providing the first semiconductor film with a material comprising a metal element;
   heating the first semiconductor film to crystallize the first semiconductor film after providing said material;
   irradiating the crystallized first semiconductor film with laser in an oxidizing atmosphere;
   forming a barrier layer on the crystallized first semiconductor film;
   forming a second semiconductor film containing a noble gas element on the barrier layer without exposing the barrier layer to the air;
   removing at least a portion of the metal element from the crystallized first semiconductor film by gettering the metal element into the second semiconductor film;
   removing the second semiconductor film; and
   removing the barrier layer.

19. A method of manufacturing a semiconductor device according to claim 18, wherein the barrier layer is a silicon oxynitride film with a thickness of 1 to 10 nm.

20. A method of manufacturing a semiconductor device according to claim 18, wherein the metal element is one or more kinds of elements selected from the group consisting of Fe, Ni, Co, Ru, Rh, Pd, Os, Ir, Pt, Cu, and Au.

21. A method of manufacturing a semiconductor device according to claim 18, wherein the noble gas element is one or more kinds of elements selected from the group consisting of He, Ne, Ar, Kr, and Xe.

22. A method of manufacturing a semiconductor device according to claim 18, wherein the barrier layer is formed by plasma CVD.

23. A method of manufacturing a semiconductor device, comprising:
   forming on an insulating surface a first semiconductor film having an amorphous structure;
   providing the first semiconductor film with a material comprising a metal element;
   heating the first semiconductor film to crystallize the first semiconductor film after providing said material;
   irradiating the crystallized first semiconductor film with laser in an oxidizing atmosphere;
   forming a barrier layer on the crystallized first semiconductor film;
   forming a second semiconductor film containing argon at a concentration of $1\times10^{18}/cm^3$ to $1\times10^{22}/cm^3$ on the barrier layer without exposing the barrier layer to the air;
   removing at least a portion of the metal element from the crystallized first semiconductor film by gettering the metal element into the second semiconductor film;
   removing the second semiconductor film; and
   removing the barrier layer.

24. A method of manufacturing a semiconductor device according to claim 23, wherein the barrier layer is a silicon oxynitride film with a thickness of 1 to 10 nm.

25. A method of manufacturing a semiconductor device according to claim 23, wherein the metal element is one or more kinds of elements selected from the group consisting of Fe, Ni, Co, Ru, Rh, Pd, Os, Ir, Pt, Cu, and Au.

26. A method of manufacturing a semiconductor device according to claim 23, wherein the barrier layer is formed by plasma CVD.

* * * * *